(12) United States Patent
Hatakeyama et al.

(10) Patent No.: US 10,802,400 B2
(45) Date of Patent: Oct. 13, 2020

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 298 days.

(21) Appl. No.: 16/006,063

(22) Filed: Jun. 12, 2018

(65) Prior Publication Data

US 2018/0373150 A1    Dec. 27, 2018

(30) Foreign Application Priority Data

Jun. 21, 2017   (JP) .................. 2017-121568

(51) Int. Cl.

| | | |
|---|---|---|
| *G03F 7/039* | (2006.01) | |
| *G03F 7/038* | (2006.01) | |
| *G03F 7/16* | (2006.01) | |
| *G03F 7/38* | (2006.01) | |
| *G03F 7/20* | (2006.01) | |
| *C08F 220/16* | (2006.01) | |
| *C08F 212/14* | (2006.01) | |
| *G03F 7/32* | (2006.01) | |
| *G03F 7/004* | (2006.01) | |
| *C08F 12/24* | (2006.01) | |

(52) U.S. Cl.
CPC .......... *G03F 7/0382* (2013.01); *C08F 212/14* (2013.01); *C08F 220/16* (2013.01); *G03F 7/0045* (2013.01); *G03F 7/0392* (2013.01); *G03F 7/0397* (2013.01); *G03F 7/162* (2013.01); *G03F 7/168* (2013.01); *G03F 7/2004* (2013.01); *G03F 7/2006* (2013.01); *G03F 7/2037* (2013.01); *G03F 7/322* (2013.01); *G03F 7/38* (2013.01); *C08F 12/24* (2013.01); *C08F 2800/20* (2013.01)

(58) Field of Classification Search
CPC .... G03F 7/0392; G03F 7/0397; G03F 7/0382; G03F 7/2002; G03F 7/2004; G03F 7/2006; G03F 7/039; G03F 7/038; C08F 212/14; C08F 212/21
USPC ........................................ 430/270.1
See application file for complete search history.

(56) References Cited

U.S. PATENT DOCUMENTS

| | | | |
|---|---|---|---|
| 8,057,985 B2 | 11/2011 | Ohashi et al. | |
| 2008/0102407 A1* | 5/2008 | Ohsawa | G03F 7/0382 430/286.1 |
| 2010/0063232 A1* | 3/2010 | Nagai | G03F 7/0392 526/287 |
| 2011/0177453 A1* | 7/2011 | Masubuchi | G03F 7/0382 430/270.1 |

FOREIGN PATENT DOCUMENTS

| | | |
|---|---|---|
| JP | 4425776 B2 | 3/2010 |
| JP | 5201363 B2 | 6/2013 |

OTHER PUBLICATIONS

Yamamoto et al., "Polymer-Structure Dependence of Acid Generation in Chemically Amplified Extreme Ultraviolet Resists", Japanese Journal of Applied Physics, 2007, vol. 46, No. 7, pp. L142-L144 (3 pages).

\* cited by examiner

*Primary Examiner* — John A McPherson
(74) *Attorney, Agent, or Firm* — Westerman, Hattori, Daniels & Adrian, LLP

(57) ABSTRACT

A resist composition comprising a polymer-bound acid generator, i.e., a polymer comprising recurring units derived from a sulfonium or iodonium salt having a brominated linker between a polymerizable unsaturated bond and a fluorosulfonic acid offers a high sensitivity and reduced LWR or improved CDU independent of whether it is of positive or negative tone.

12 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2017-121568 filed in Japan on Jun. 21, 2017, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of wavelength 13.5 nm, and double patterning version of the ArF lithography, on which active research efforts have been made.

As the pattern feature size is reduced, approaching to the diffraction limit of light, light contrast lowers. In the case of positive resist film, a lowering of light contrast leads to reductions of resolution and focus margin of hole and trench patterns.

As the pattern feature size is reduced, the edge roughness (LWR) of line patterns and the critical dimension uniformity (CDU) of hole patterns are regarded significant. It is pointed out that these factors are affected by the segregation or agglomeration of a base polymer and acid generator and the diffusion of generated acid. There is a tendency that LWR becomes greater as the resist film becomes thinner. A film thickness reduction to comply with the progress of size reduction causes a degradation of LWR, which becomes a serious problem.

The EUV lithography resist must meet high sensitivity, high resolution and low LWR at the same time. As the acid diffusion distance is reduced, LWR is reduced, but sensitivity becomes lower. For example, as the PEB temperature is lowered, the outcome is a reduced LWR, but a lower sensitivity. As the amount of quencher added is increased, the outcome is a reduced LWR, but a lower sensitivity. It is necessary to overcome the tradeoff relation between sensitivity and LWR.

Aiming to suppress acid diffusion, Patent Document 1 proposes a resist compound comprising recurring units derived from an onium salt of a polymerizable unsaturated bond-containing sulfonic acid. The so-called polymer-bound acid generator is capable of generating a polymer type sulfonic acid upon exposure and characterized by a very short distance of acid diffusion. Sensitivity may be enhanced by increasing a proportion of the acid generator. In the case of addition type acid generators, as the amount of acid generator added is increased, a higher sensitivity is achievable at the expense of an increased acid diffusion distance. Since the acid diffusion is non-uniform, the increased acid diffusion leads to degraded LWR and CDU. The polymer-bound acid generator is regarded as having a high capability with respect to a balance of sensitivity, LWR and CDU.

For the lithography using high-energy radiation of very short wavelength such as EB or EUV, polyhydroxystyrene base resist materials are under consideration. Non-Patent Document 1 reports that an acid generator in polyhydroxystyrene exerts a high acid generation efficiency when processed by the EB or EUV lithography. The energy transfer model contemplated therein is that upon exposure, a phenol group generates a phenoxy radical, which is ionized to emit electrons, to which the acid generator is sensitive. It is a brominated styrene that has the next high acid generation efficiency in the report. The model advocated therein is that a bromine anion generated upon exposure forms a charge transfer complex with a radical cation of a polymer, after which an acid generates.

CITATION LIST

Patent Document 1: JP 4425776
Non-Patent Document 1: Jpn. J. Appl. Phys., Vol. 46, No. 7 (2007)

DISCLOSURE OF INVENTION

For the acid-catalyzed chemically amplified resist, it is desired to develop a resist material capable of providing a higher sensitivity and reducing LWR of line patterns or improving CDU of hole patterns.

An object of the invention is to provide a resist composition which exhibits a high sensitivity and a reduced LWR or improved CDU, independent of whether it is of positive tone or negative tone; and a pattern forming process using the same.

The inventors have found that using a polymer comprising recurring units derived from a sulfonium or iodonium salt having a polymerizable unsaturated bond as a polymer-bound acid generator, a fluorosulfonic acid, and a brominated linker therebetween, a resist material having a high sensitivity, reduced LWR, improved CDU, high contrast, improved resolution, and wide process margin is obtainable.

In one aspect, the invention provides a resist composition comprising a polymer comprising recurring units having the formula (a1) or (a2).

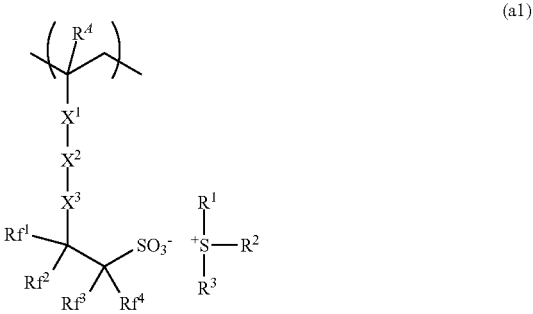

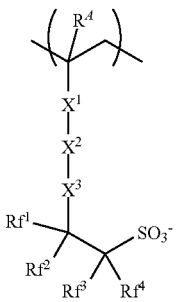
(a2)

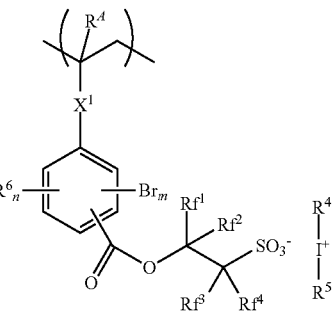
(a2-1)

Herein $R^A$ is hydrogen or methyl; $X^1$ is a single bond or ester group; $X^2$ is a $C_1$-$C_{12}$ straight, branched or cyclic alkylene group or $C_6$-$C_{10}$ arylene group, at least one methylene moiety in the alkylene group being optionally substituted by an ether moiety, ester moiety or lactone ring-containing moiety, at least one hydrogen atom in $X^2$ being substituted by bromine; $X^3$ is a single bond, ether group, ester group, or $C_1$-$C_{12}$ straight, branched or cyclic alkylene group, at least one methylene moiety in the alkylene group being optionally substituted by an ether or ester moiety; $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$, taken together, may form a carbonyl group; $R^1$ to $R^5$ are each independently a $C_1$-$C_{12}$ straight, branched or cyclic alkyl group, $C_2$-$C_{12}$ straight, branched or cyclic alkenyl group, $C_2$-$C_{12}$ alkynyl group, $C_6$-$C_{20}$ aryl group, $C_7$-$C_{12}$ aralkyl group, or $C_7$-$C_{12}$ aryloxyalkyl group, at least one hydrogen in the foregoing groups being optionally substituted by a hydroxy, carboxy, halogen, oxo, cyano, amide, nitro, sultone, sulfone, or sulfonium salt-containing moiety, at least one methylene moiety in the foregoing groups being optionally substituted by an ether, ester, carbonyl, carbonate or sulfonate moiety, $R^1$ and $R^2$ may bond together to form a ring with the sulfur atom to which they are attached.

Preferably, the recurring units having formula (a1) or (a2) have the formula (a1-1) or (a2-1).

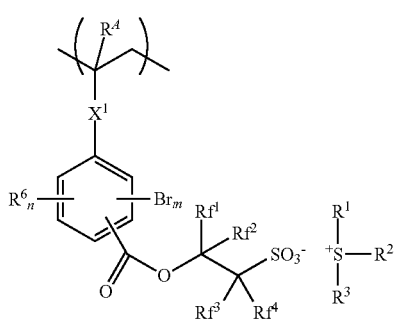
(a1-1)

Herein $R^A$, $R^1$ to $R^5$, $Rf^1$ to $Rf^4$, and $X^1$ are as defined above, $R^6$ is a $C_1$-$C_4$ straight, branched or cyclic alkyl group, halogen atom other than bromine, hydroxyl group, $C_1$-$C_4$ straight, branched or cyclic alkoxy group, or $C_2$-$C_5$ straight, branched or cyclic alkoxycarbonyl group, m is an integer of 1 to 4, and n is an integer of 0 to 3.

The resist composition may further comprise an organic solvent.

In a preferred embodiment, the polymer further comprises recurring units having the formula (b1) or (b2).

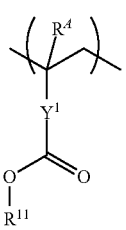
(b1)

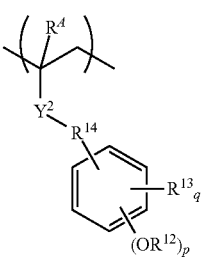
(b2)

Herein $R^A$ is each independently hydrogen or methyl, $Y^1$ is a single bond, phenylene group, naphthylene group, or a $C_1$-$C_{12}$ linking group which may contain an ester moiety and/or lactone ring, $Y^2$ is a single bond or ester group, $R^{11}$ and $R^{12}$ are each independently an acid labile group, $R^{13}$ is halogen, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, $R^{14}$ is a single bond or a $C_1$-$C_6$ straight or branched alkylene group in which at least one carbon atom may be substituted by an ether or ester moiety, p is 1 or 2, and q is an integer of 0 to 4.

Herein the resist composition is a chemically amplified positive resist composition.

In another embodiment, the polymer is free of an acid labile group. The resist composition may further comprise a crosslinker. The resist composition is a chemically amplified negative resist composition.

The resist composition may further comprise a surfactant.

In another aspect, the invention provides a process for forming a pattern comprising the steps of applying the resist composition defined above onto a substrate, baking to form a resist film, exposing the resist film to high-energy radiation, and developing the exposed film in a developer.

Typically, the high-energy radiation is ArF excimer laser radiation of wavelength 193 nm, KrF excimer laser radiation of wavelength 248 nm, EB or EUV of wavelength 3 to 15 nm.

Advantageous Effects of Invention

A resist film comprising a polymer comprising recurring units derived from a sulfonium or iodonium salt having a brominated linker between a polymerizable unsaturated bond and a fluorosulfonic acid is characterized by reduced acid diffusion because of the large atomic weight of bromine. This prevents a reduction of resolution due to blur by acid diffusion and leads to reduced LWR or improved CDU. The resist composition is of self-sensitization type in that bromine is ionized to emit secondary electrons during EUV exposure, and the energy of secondary electrons is transferred to the acid generator, achieving a higher sensitivity. Since bromine is in close proximity to the acid generator within a common recurring unit, there occurs no image blur by diffusion of secondary electrons. Thus a resist material having a high sensitivity, reduced LWR, and improved CDU is obtainable.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "brominated" compound means a bromine-containing compound. In chemical formulae, Me stands for methyl, and Ac for acetyl.

The abbreviations and acronyms have the following meaning.
EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition The resist composition of the invention is defined as comprising a polymer-bound acid generator, specifically a polymer comprising recurring units derived from a sulfonium or iodonium salt having a polymerizable unsaturated bond, a fluorosulfonic acid, and a brominated linker therebetween. To the resist composition, another acid generator capable of generating a sulfonic acid different from the fluorosulfonic acid, imide acid or methide acid may be added.

When a resist composition containing the polymer-bound acid generator in admixture with a sulfonium salt capable of generating a weaker acid such as sulfonic or carboxylic acid is exposed to radiation, a polymeric fluorosulfonic acid containing a brominated linker and a weaker acid such as sulfonic or carboxylic acid generate. Since the acid generator is not entirely decomposed, the undecomposed sulfonium salt is present nearby. When the polymeric fluorosulfonic acid containing a brominated linker co-exists with the sulfonium salt of weak acid such as sulfonic or carboxylic acid, ion exchange takes place between the polymeric fluorosulfonic acid containing a brominated linker and the sulfonium salt of weak acid such as sulfonic or carboxylic acid, whereby a sulfonium or iodonium salt of polymeric fluorosulfonic acid containing a brominated linker is created and a weak acid such as sulfonic or carboxylic acid is released. This is because the salt of polymeric fluorosulfonic acid containing a brominated linker having a higher acid strength is more stable. In contrast, when a sulfonium salt of polymeric fluorosulfonic acid containing a brominated linker co-exists with a weak acid such as sulfonic or carboxylic acid, no ion exchange takes place. The ion exchange reaction according to the acid strength series occurs not only with sulfonium salts, but also similarly with iodonium salts. When combined with an acid generator for fluorosulfonic acid, a sulfonium or iodonium salt of weak acid functions as a quencher. Also, during exposure, bromine is ionized to emit secondary electrons, the energy of which is transferred to the acid generator to promote its decomposition, contributing to a higher sensitivity. The polymer-bound acid generator is successful in achieving low acid diffusion and a high sensitivity.

For the LWR improving purpose, it is effective to prevent a polymer and/or acid generator from agglomeration. Effective means for preventing agglomeration of a polymer is by reducing the difference between hydrophobic and hydrophilic properties or by lowering the glass transition temperature (Tg) or molecular weight of the polymer. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR by introducing an alkyl group into a sulfonium salt capable of generating an α-fluorinated sulfone imide acid.

The polymer-bound acid generator used herein is less diffusive because of the anion moiety bound to the polymer backbone and the large atomic weight of bromine introduced therein, and has a high acid generation efficiency due to the high ionization efficiency of bromine atom. Since the acid generator is mixed at the monomer stage prior to polymerization, the acid generator is uniformly distributed in the polymer. These lead to improvements in LWR and CDU.

The polymer-bound acid generator exerts a LWR or CDU improving effect, which may stand good either in positive and negative tone pattern formation by aqueous alkaline development or in negative tone pattern formation by organic solvent development.

Polymer-Bound Acid Generator

The polymer-bound acid generator used herein, specifically the polymer comprising recurring units derived from a sulfonium or iodonium salt having a polymerizable unsaturated bond, a fluorosulfonic acid, and a brominated linker therebetween is defined as comprising recurring units having the formula (a1) or recurring units having the formula (a2). These units are simply referred to as recurring units (a1) and (a2).

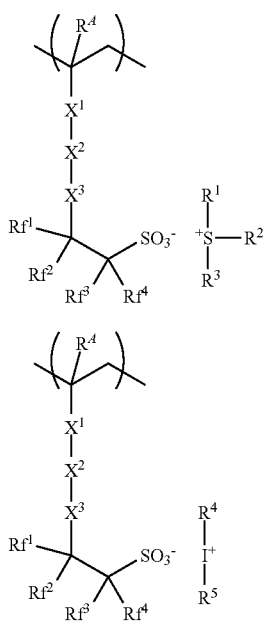

Herein $R^A$ is hydrogen or methyl. $X^1$ is a single bond or ester group. $X^2$ is a $C_1$-$C_{12}$ straight, branched or cyclic alkylene group or $C_6$-$C_{10}$ arylene group, at least one methylene moiety in the alkylene group may be substituted by an ether moiety, ester moiety or lactone ring-containing moiety, and at least one hydrogen atom in $X^2$ is substituted by bromine. $X^3$ is a single bond, ether group, ester group, or $C_1$-$C_{12}$ straight, branched or cyclic alkylene group, and at least one methylene moiety in the alkylene group may be substituted by an ether or ester moiety. $Rf^1$ to $Rf^4$ are each independently hydrogen, fluorine or trifluoromethyl, at least one of $Rf^1$ to $Rf^4$ is fluorine or trifluoromethyl, and $Rf^1$ and $Rf^2$, taken together, may form a carbonyl group. $R^1$ to $R^5$ are each independently a $C_1$-$C_{12}$ straight, branched or cyclic alkyl group, $C_2$-$C_{12}$ straight, branched or cyclic alkenyl group, $C_2$-$C_{12}$ alkynyl group, $C_6$-$C_{20}$ aryl group, $C_7$-$C_{12}$ aralkyl group, or $C_7$-$C_{12}$ aryloxyalkyl group, at least one hydrogen (one or more or even all hydrogen atoms) in the foregoing groups may be substituted by a hydroxy, carboxy, halogen, oxo, cyano, amide, nitro, sultone, sulfone, or sulfonium salt-containing moiety, at least one methylene moiety in the foregoing groups may be substituted by an ether, ester, carbonyl, carbonate or sulfonate moiety, and $R^1$ and $R^2$ may bond together to form a ring with the sulfur atom to which they are attached.

The preferred recurring units (a1) and (a2) are units having the formulae (a1-1) and (a2-1), respectively.

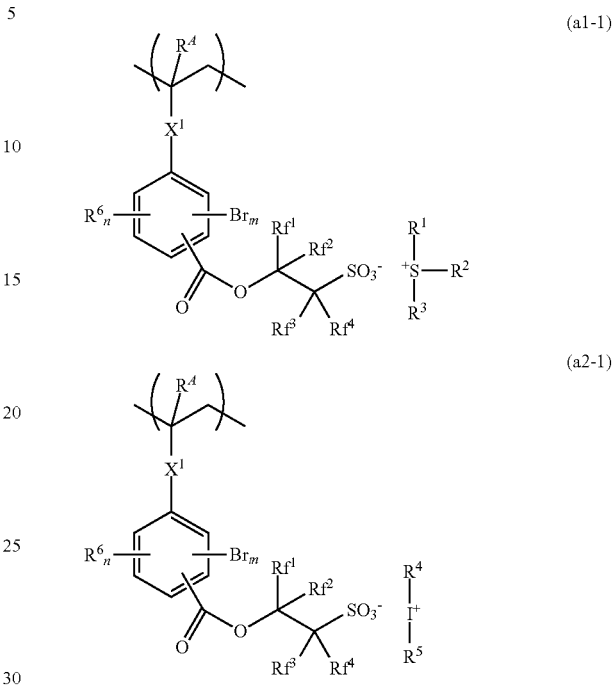

Herein $R^A$, $R^1$ to $R^5$, $Rf^1$ to $Rf^4$, and $X^1$ are as defined above. $R^6$ is a $C_1$-$C_4$ straight, branched or cyclic alkyl group, halogen atom other than bromine, hydroxyl group, $C_1$-$C_4$ straight, branched or cyclic alkoxy group, or $C_2$-$C_5$ straight, branched or cyclic alkoxycarbonyl group, m is an integer of 1 to 4, and n is an integer of 0 to 3.

Examples of the anion moiety in the monomer from which recurring units (a1) or (a2) are derived are given below, but not limited thereto. Herein, $R^A$ is as defined above.

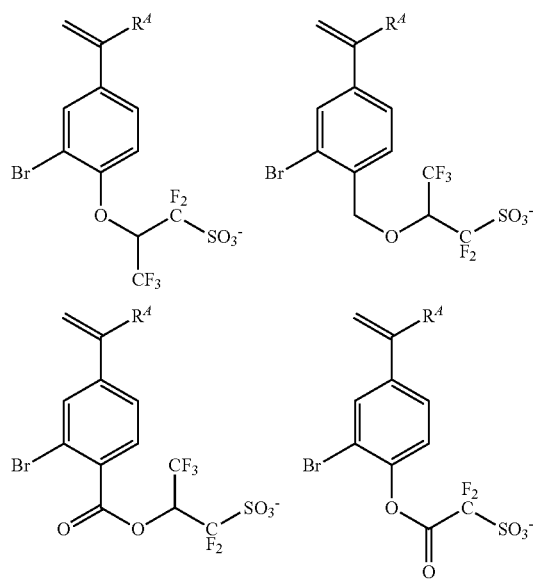

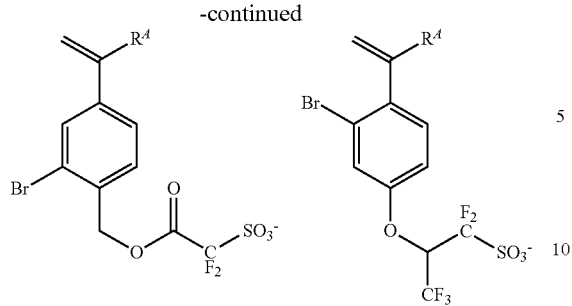
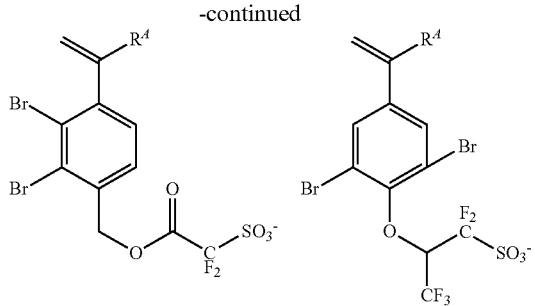
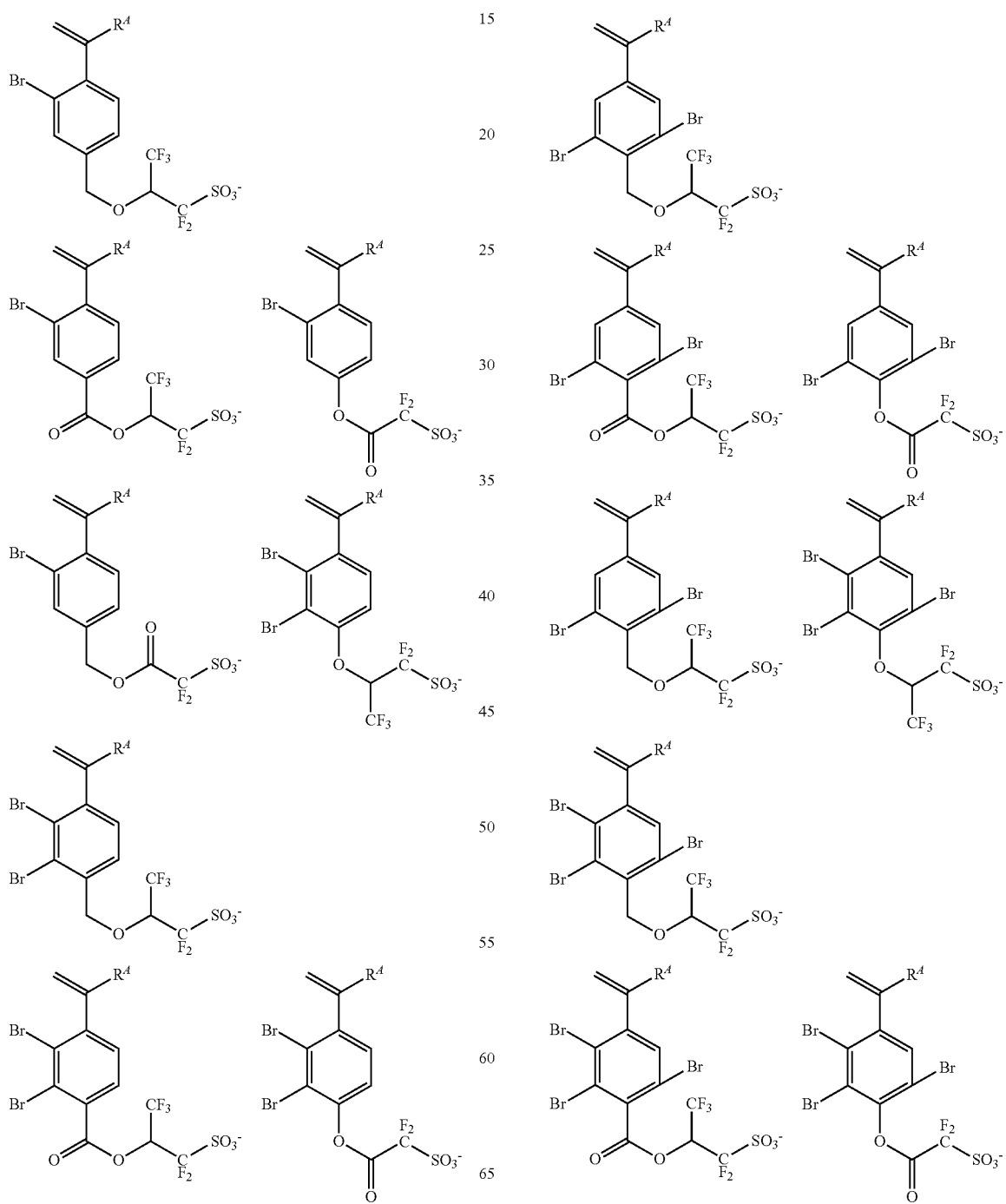

-continued
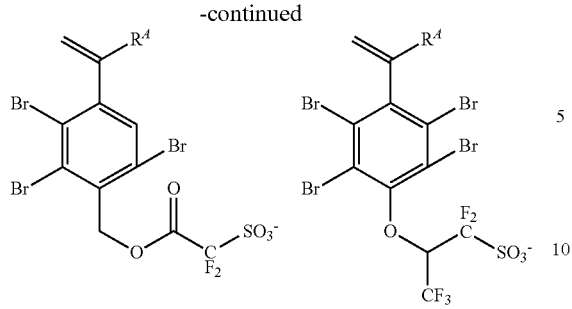
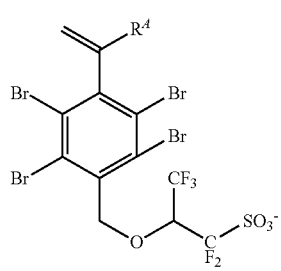
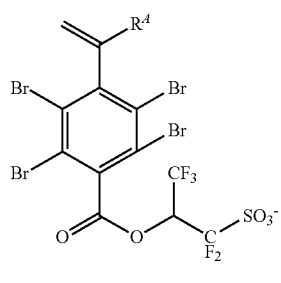
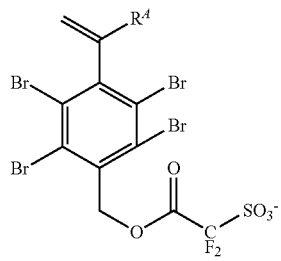
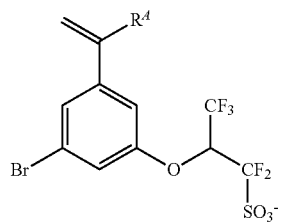
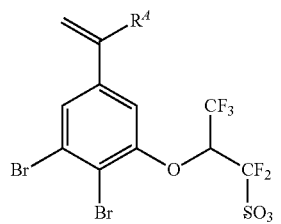
-continued
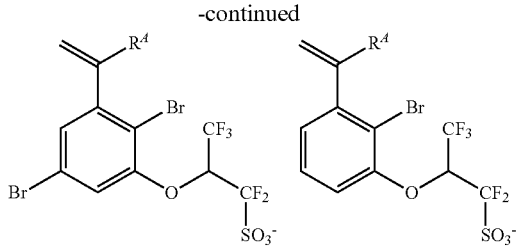
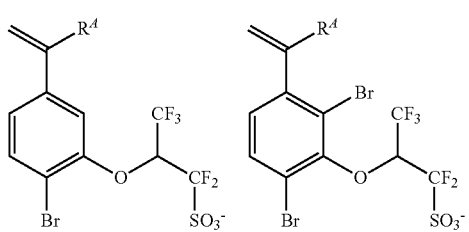
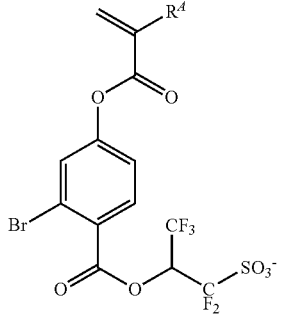
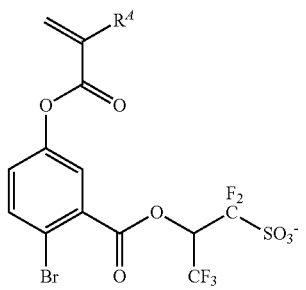
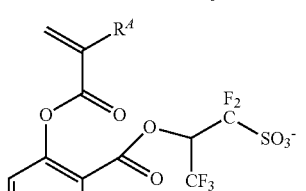
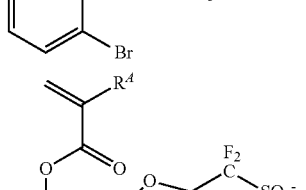
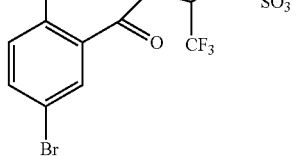

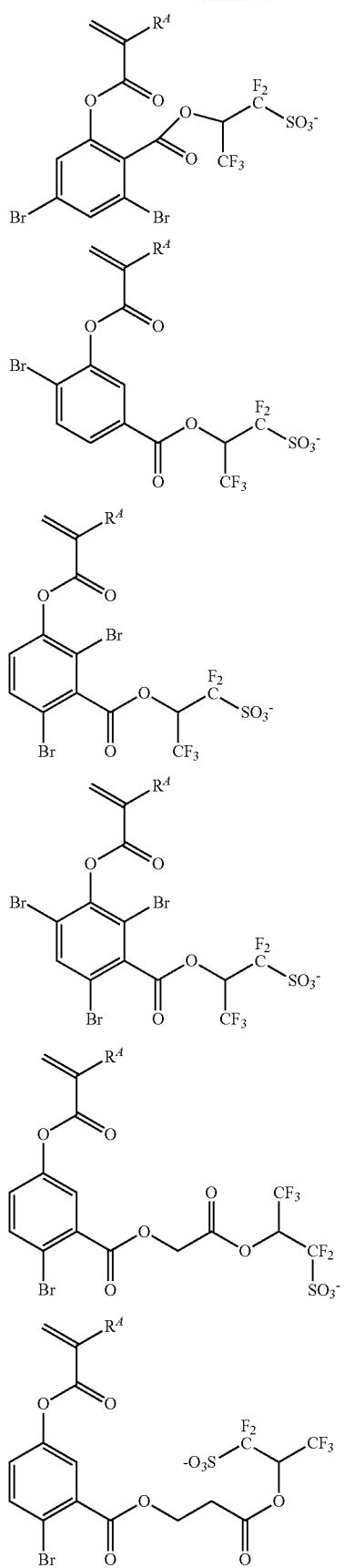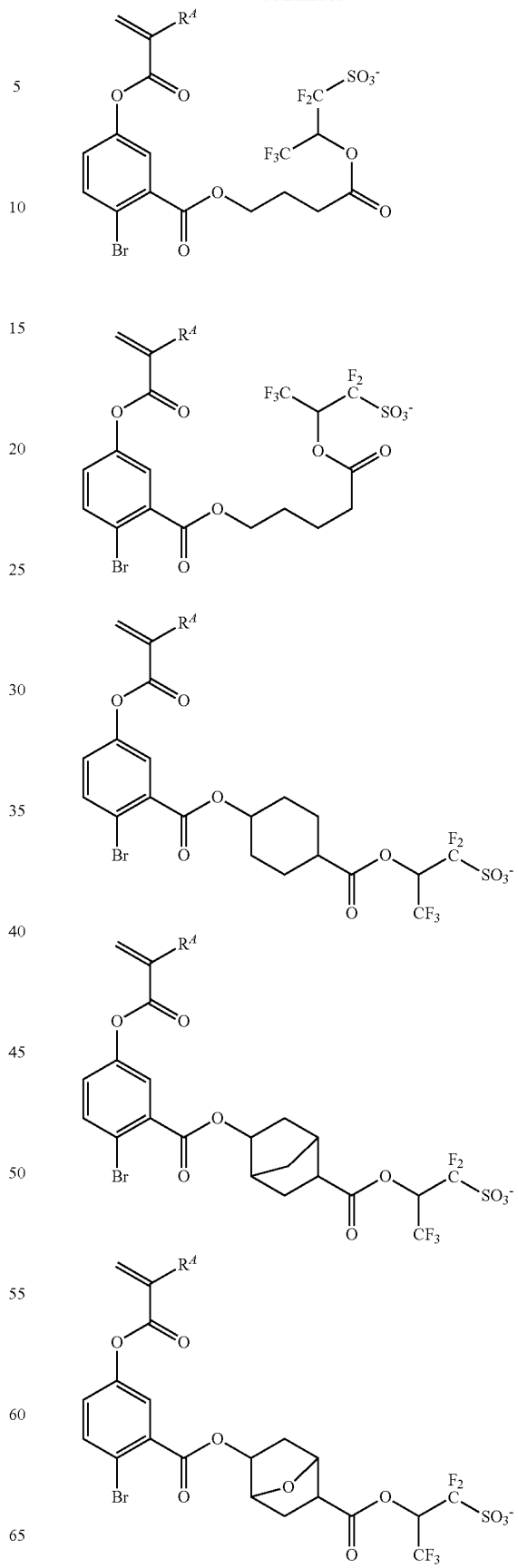

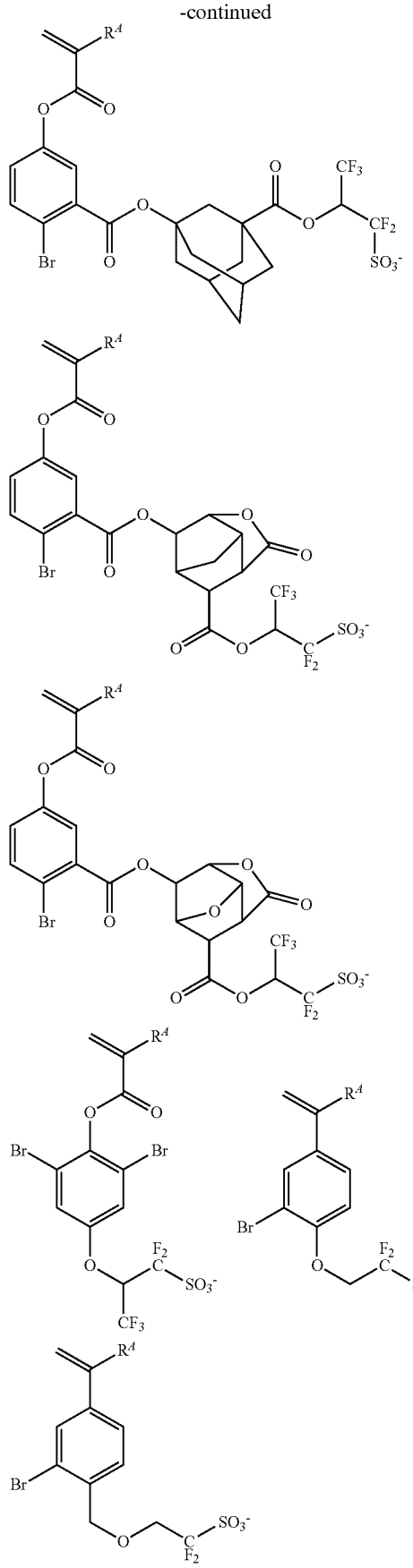

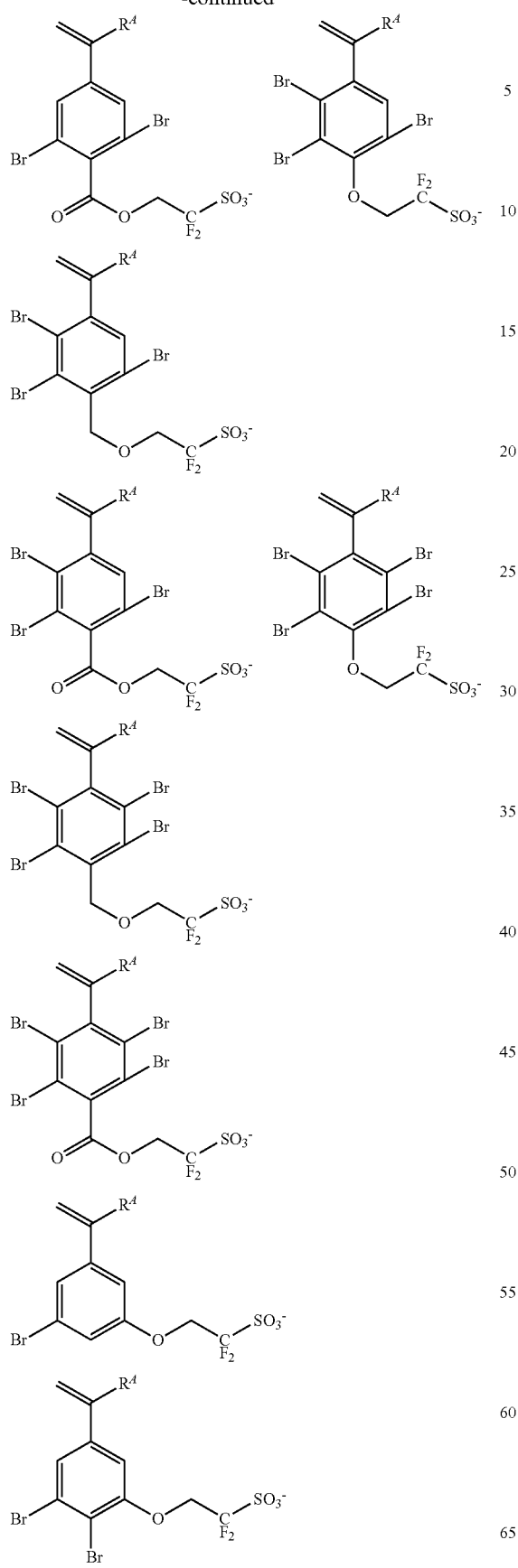

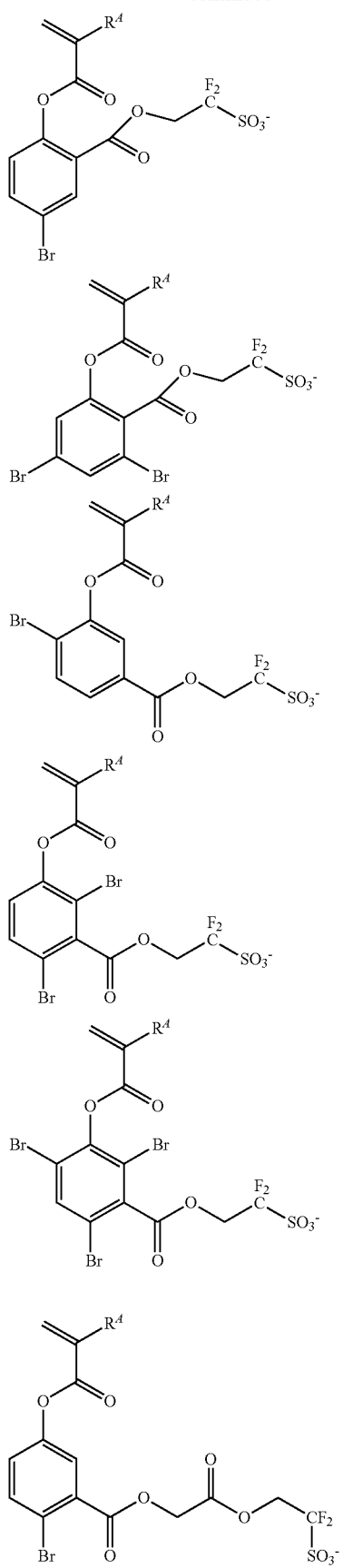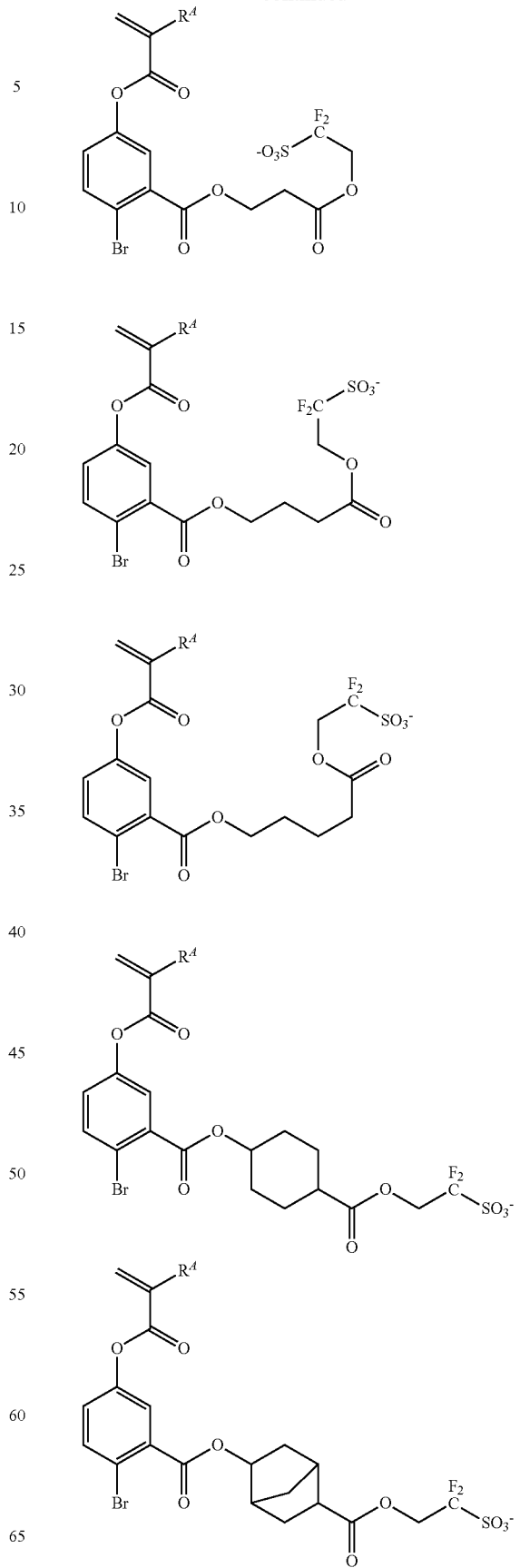

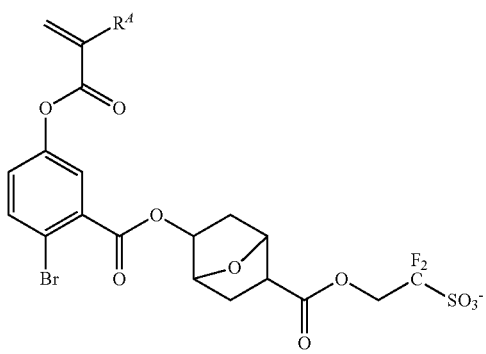
Examples of the cation moiety in recurring unit (a1) are given below, but not limited thereto.

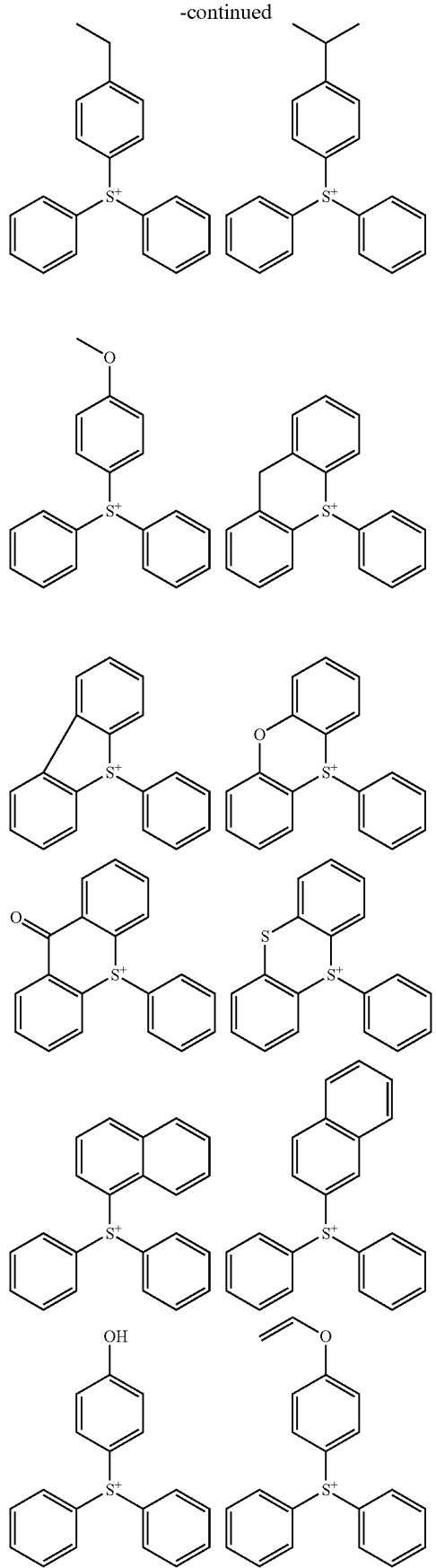
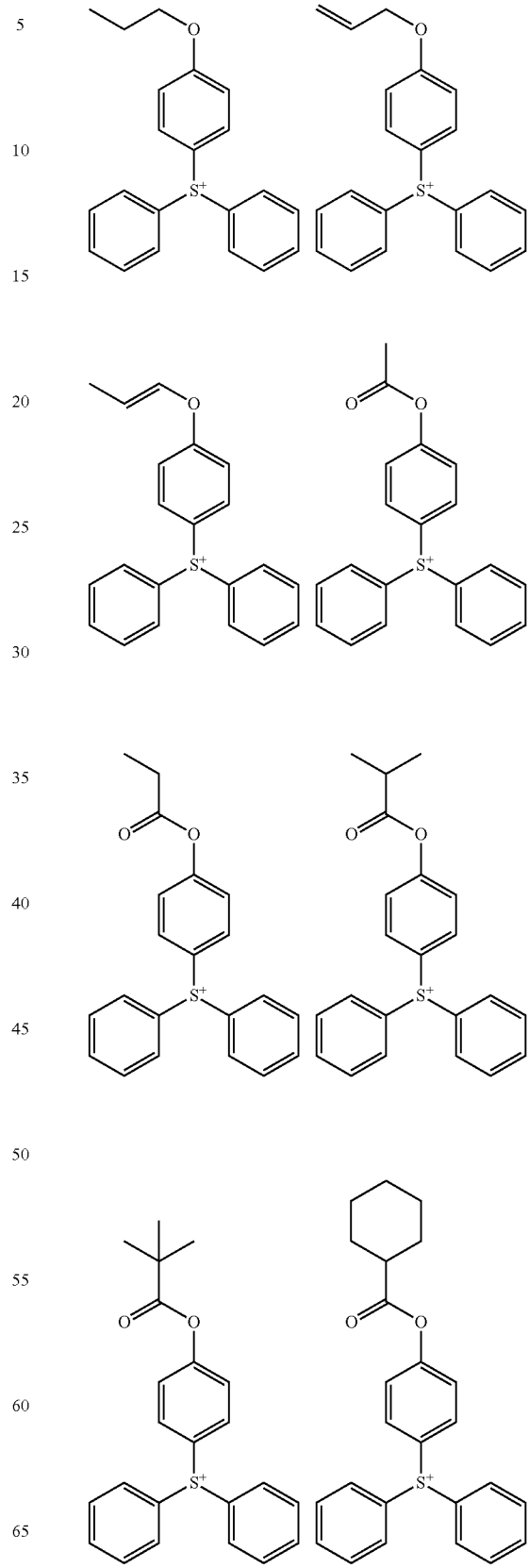

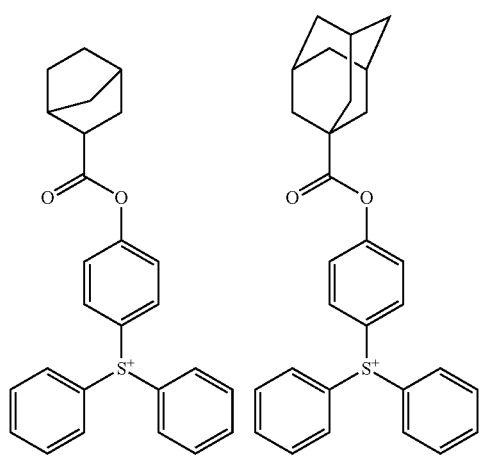
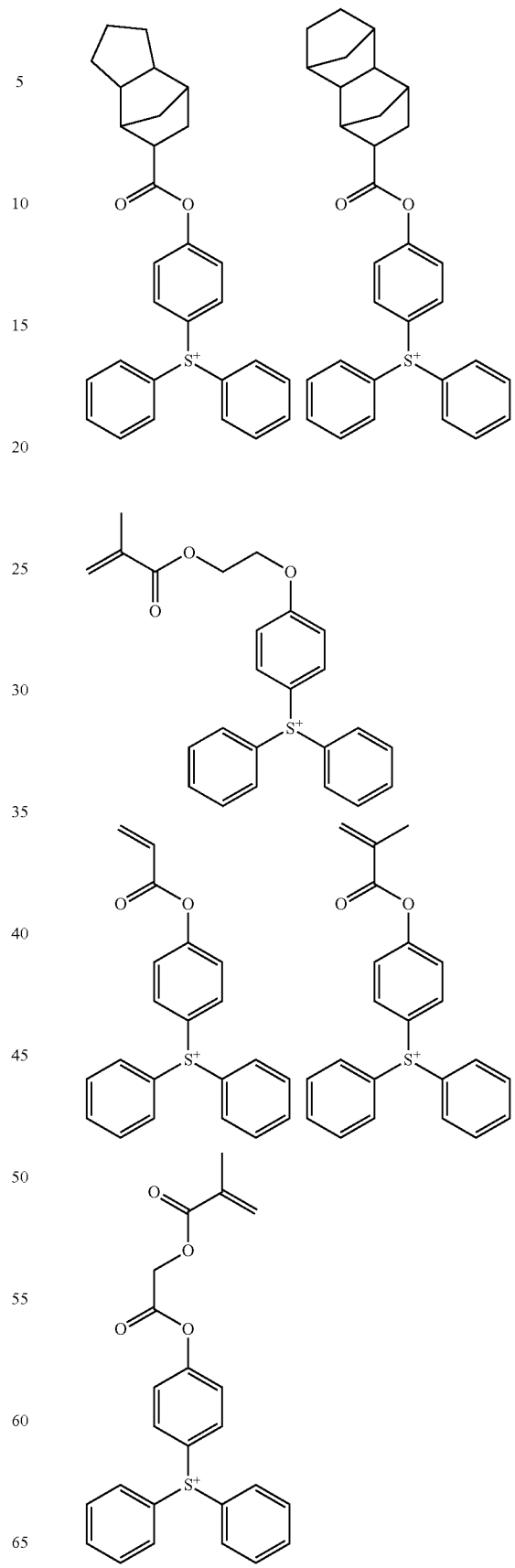

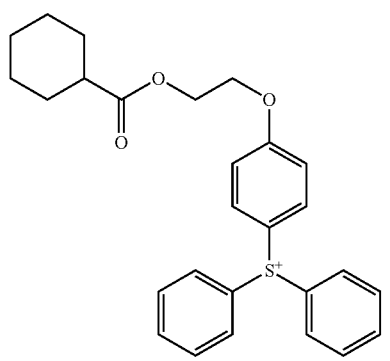
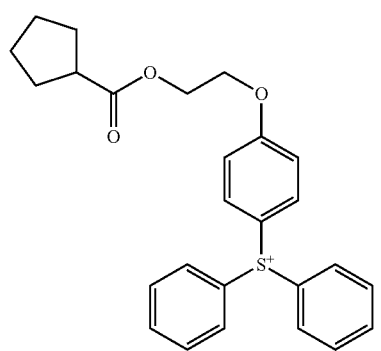
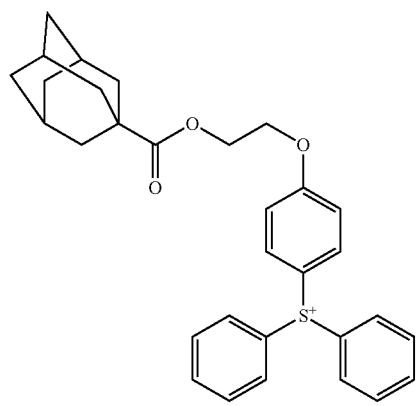
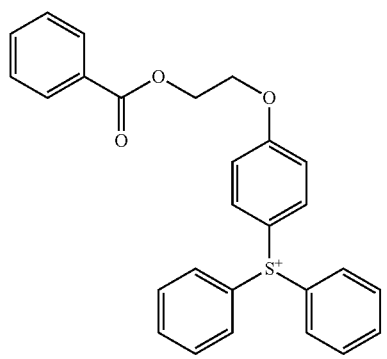
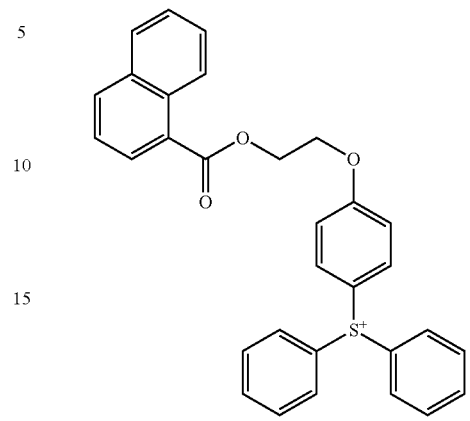
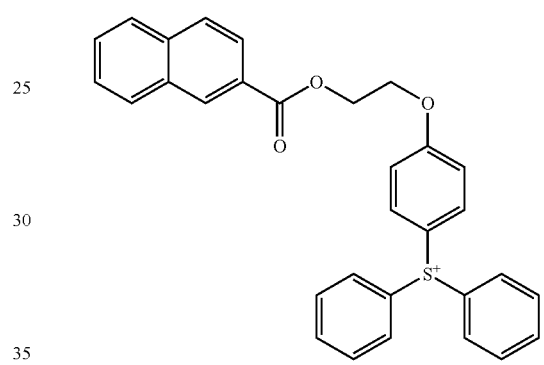
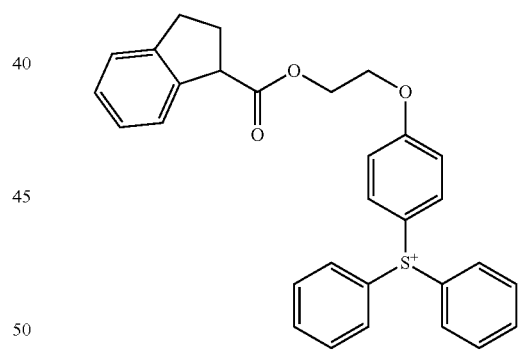
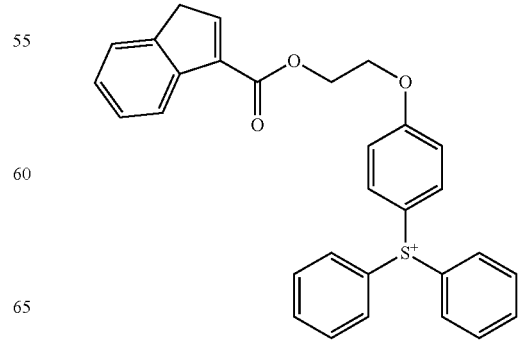

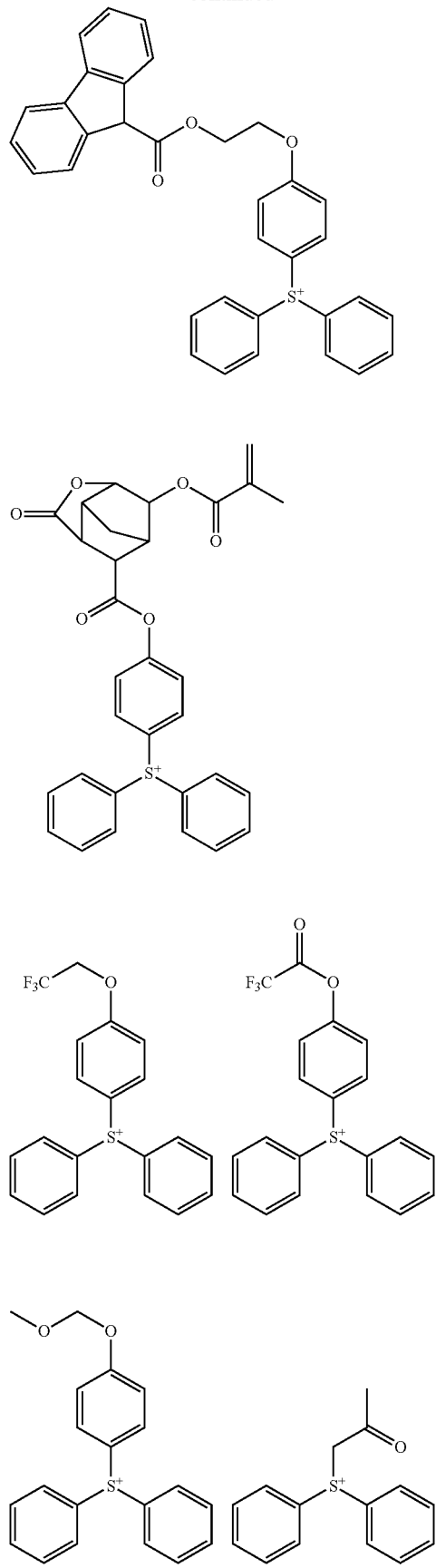
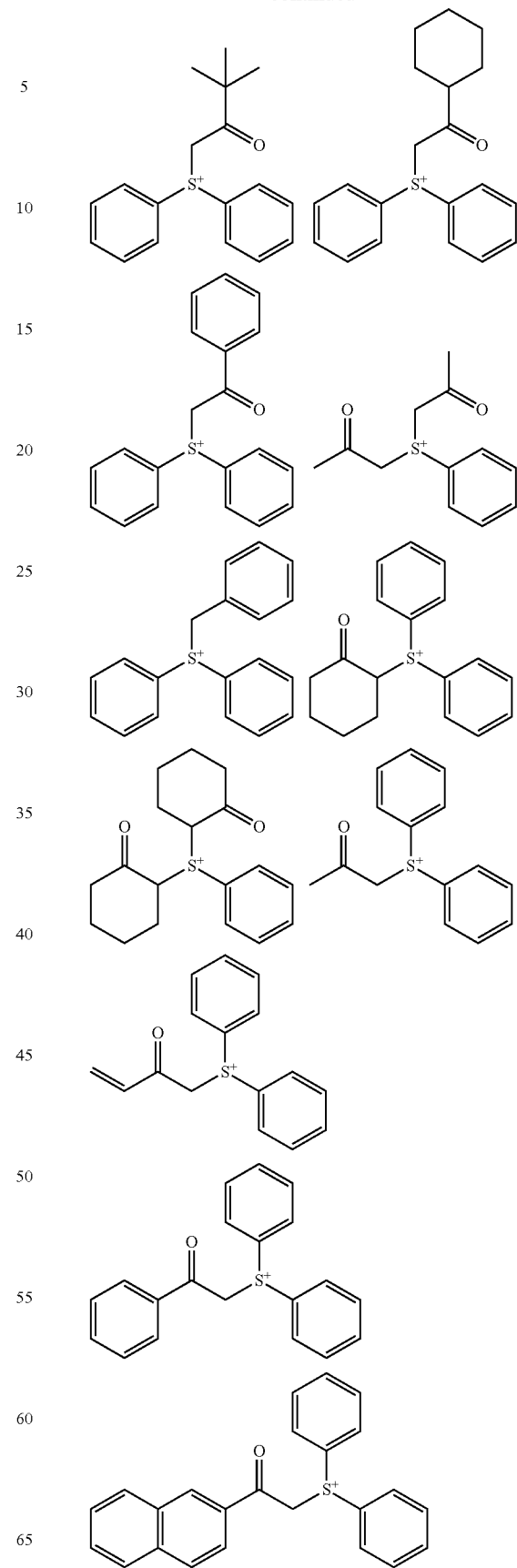

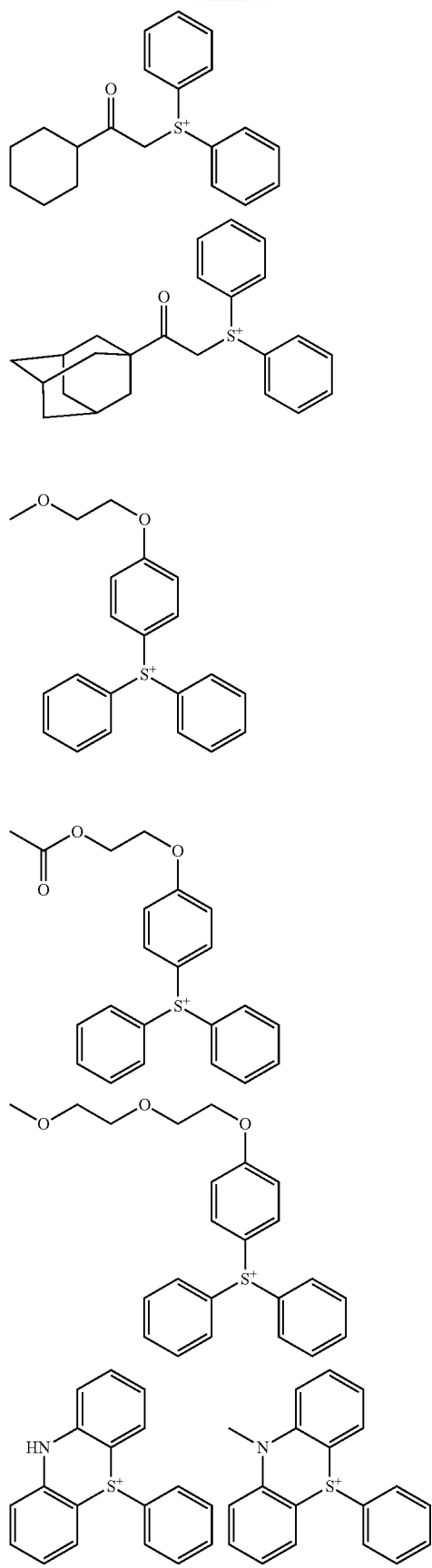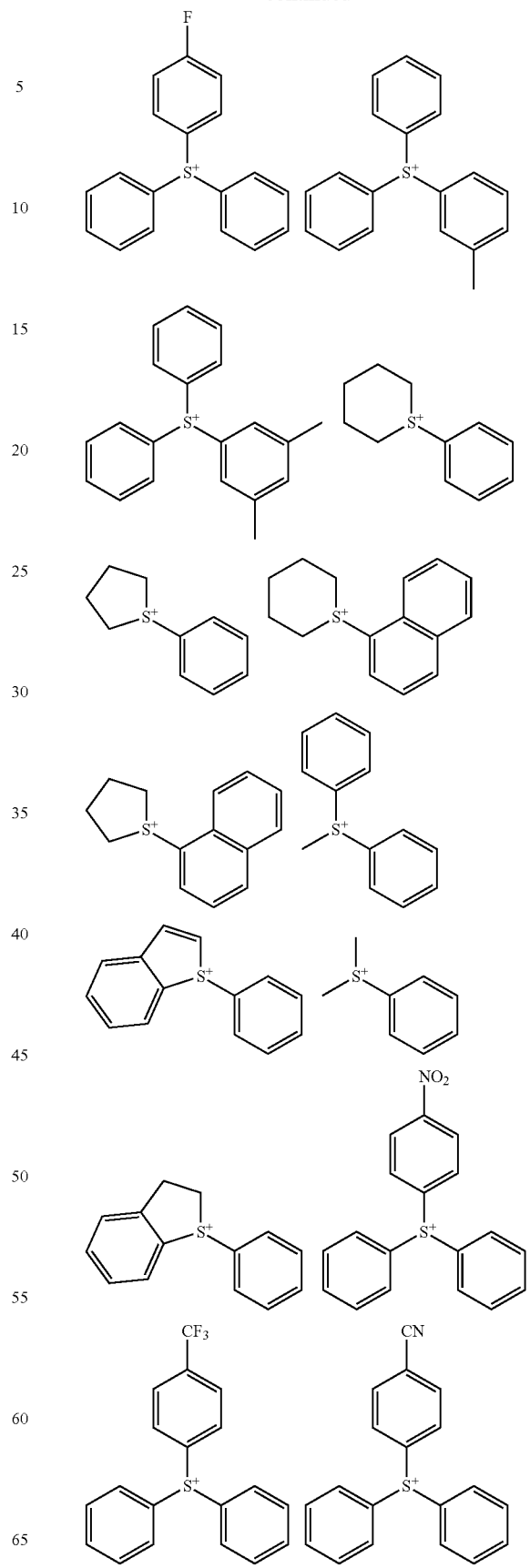

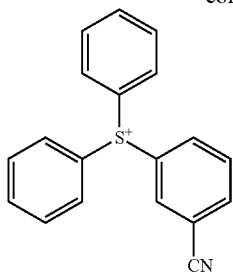
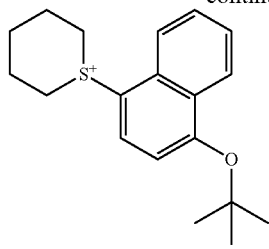
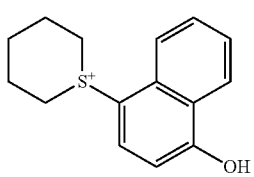
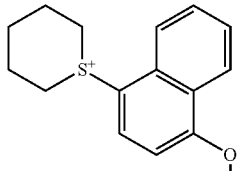
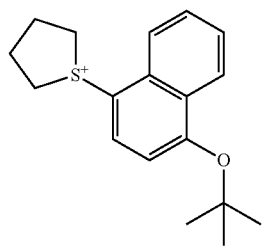
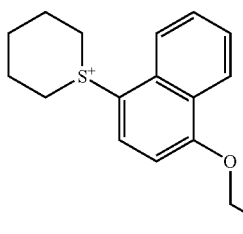
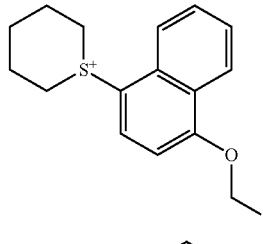
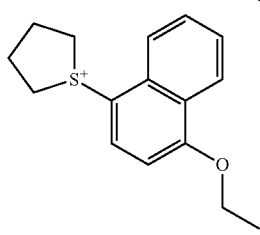
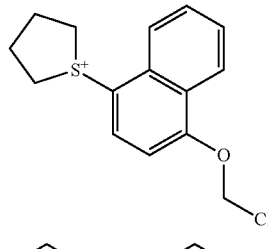
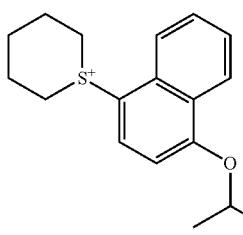
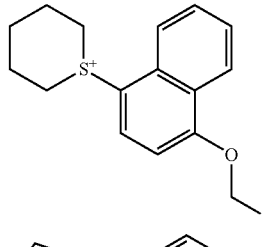
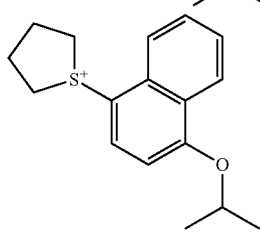
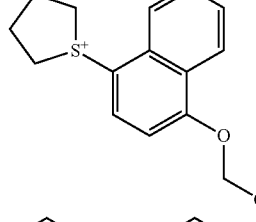
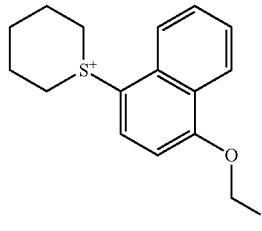

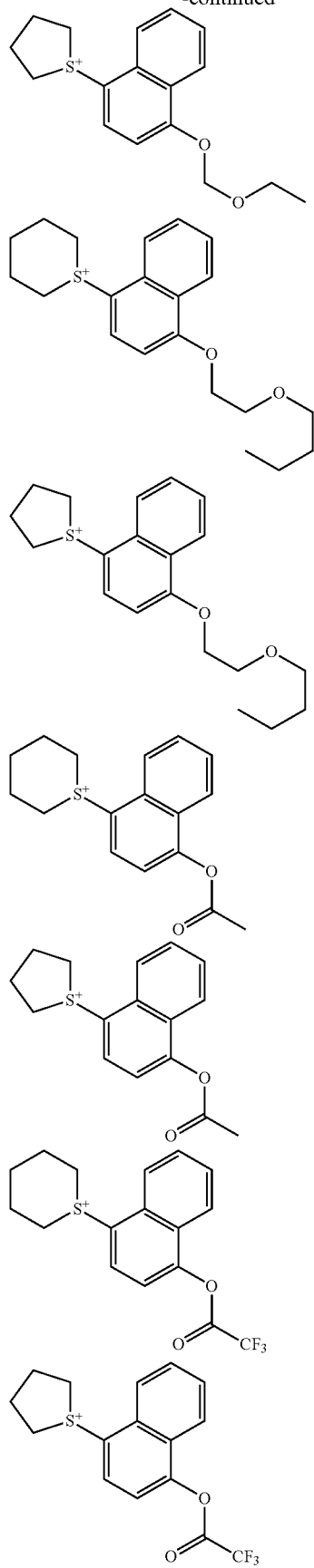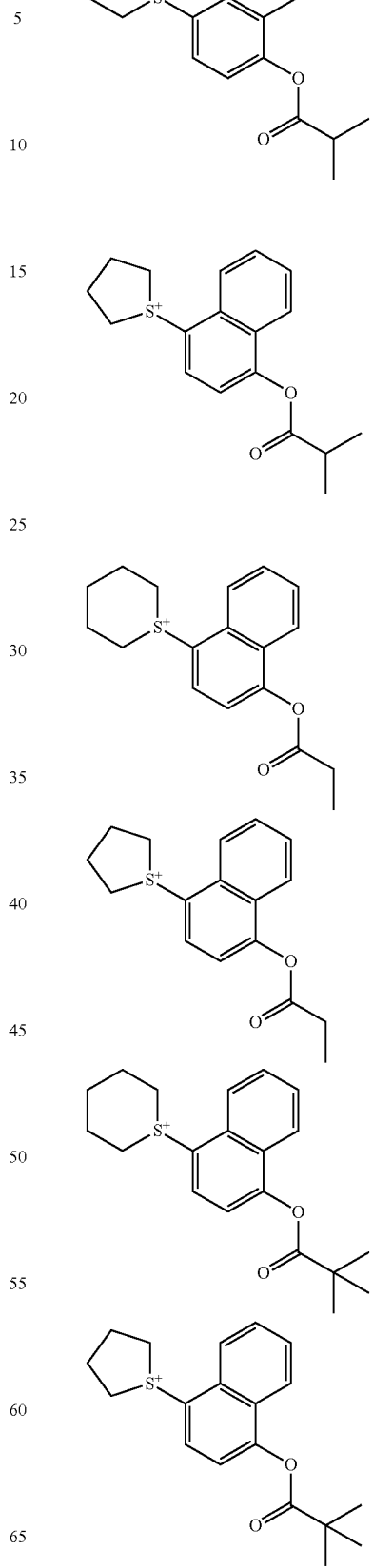

37
-continued
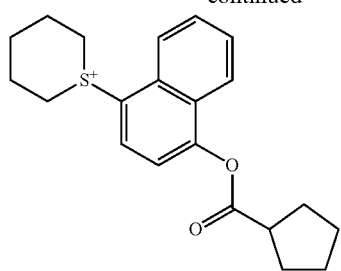
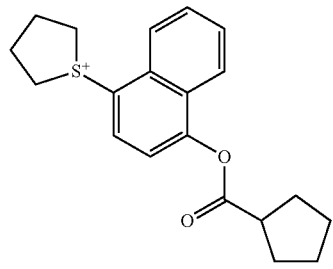
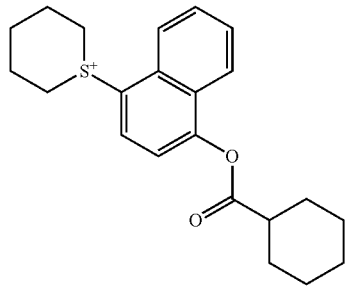
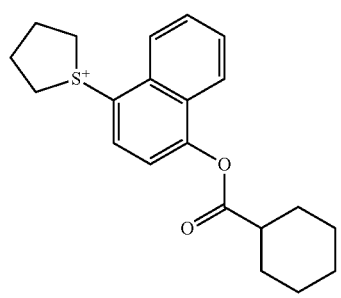
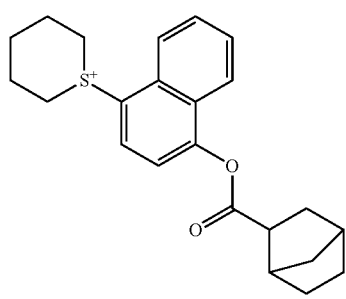
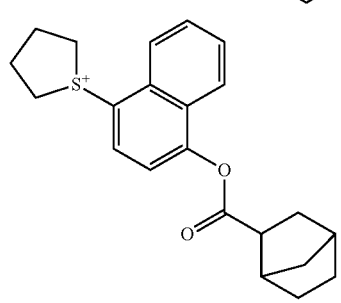
38
-continued
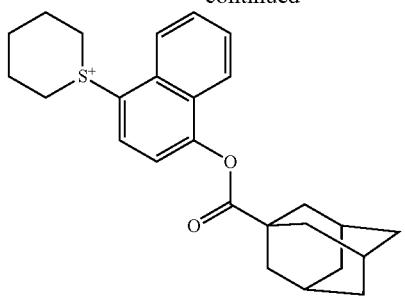
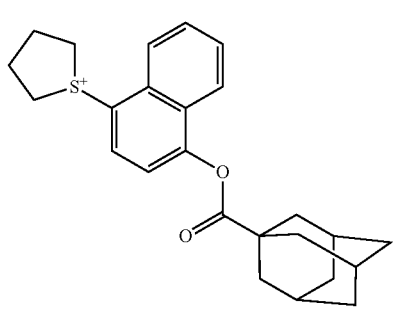
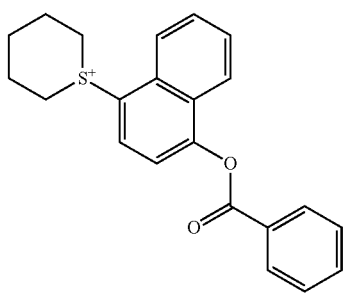
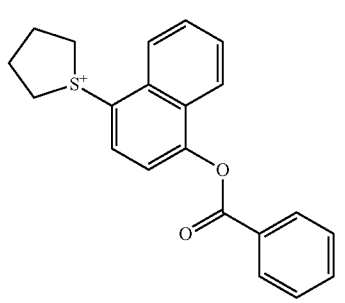
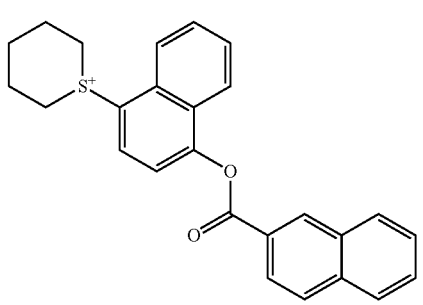

-continued
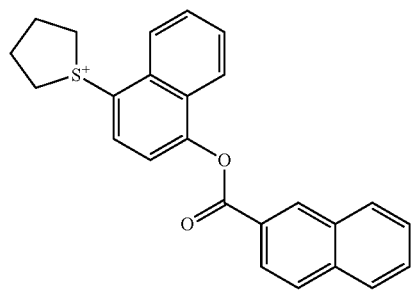
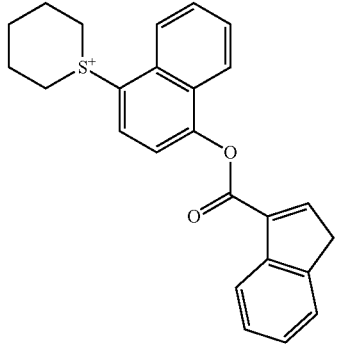
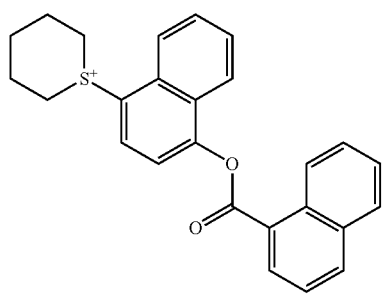
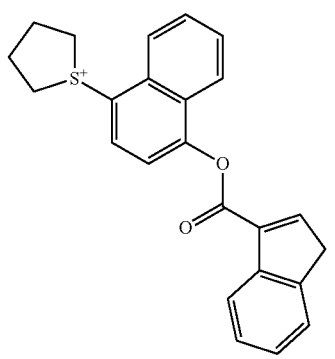
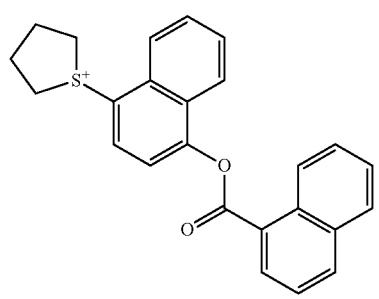
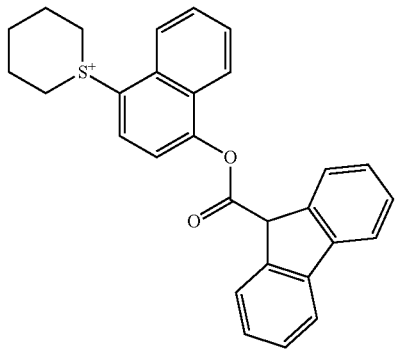
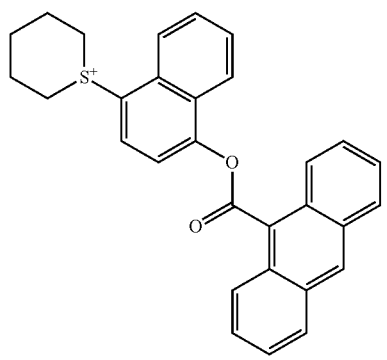
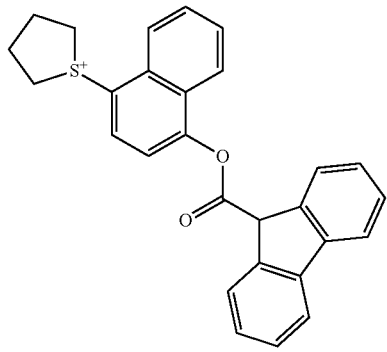
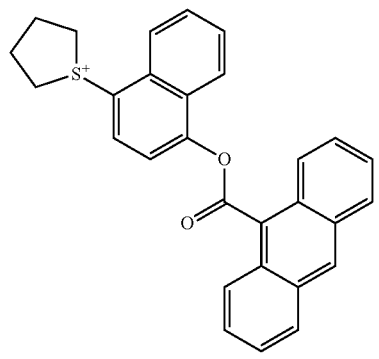
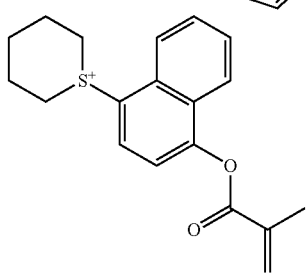

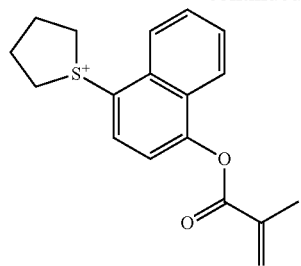
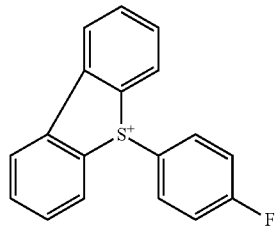
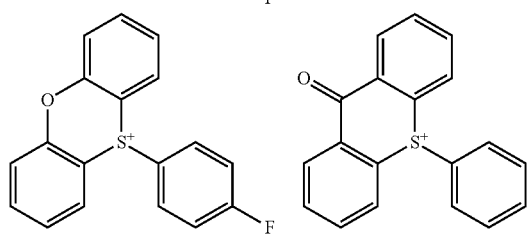
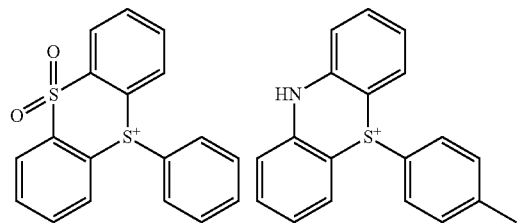
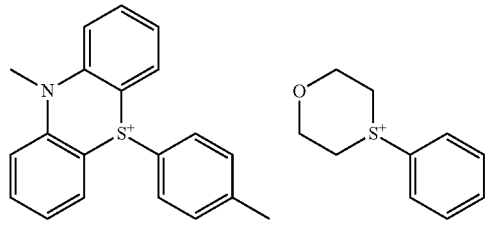
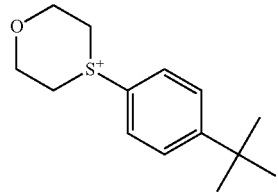
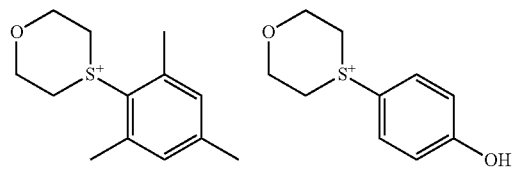
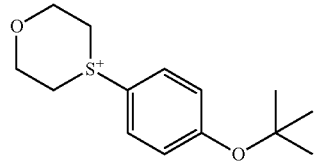
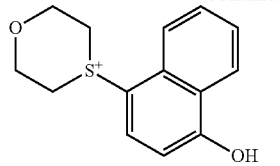
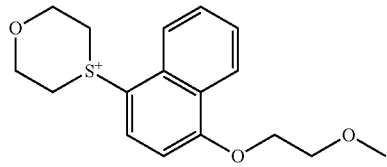
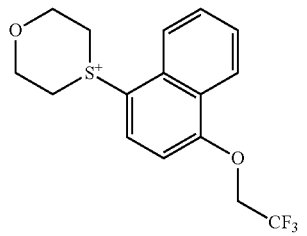
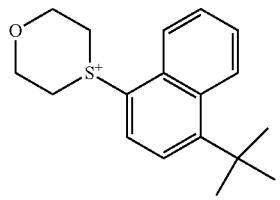
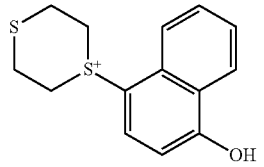
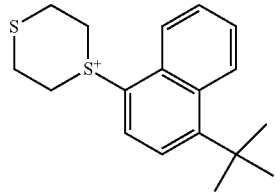
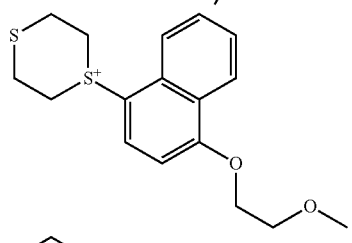
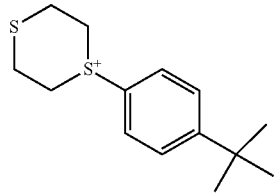

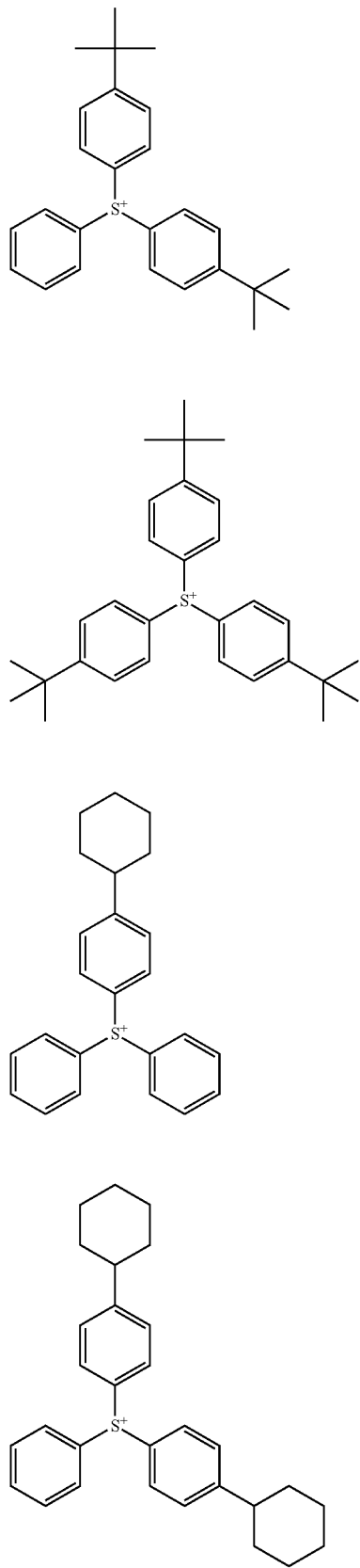
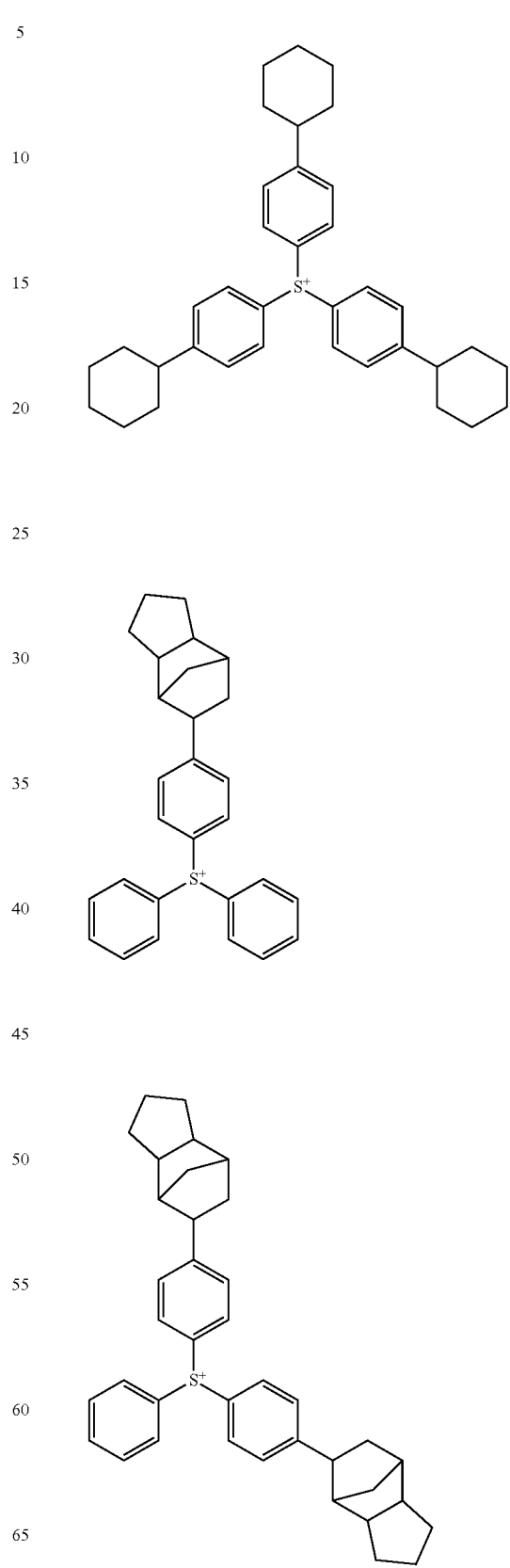

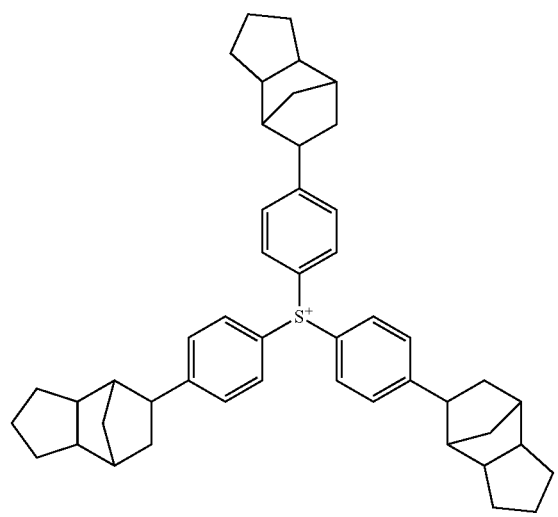
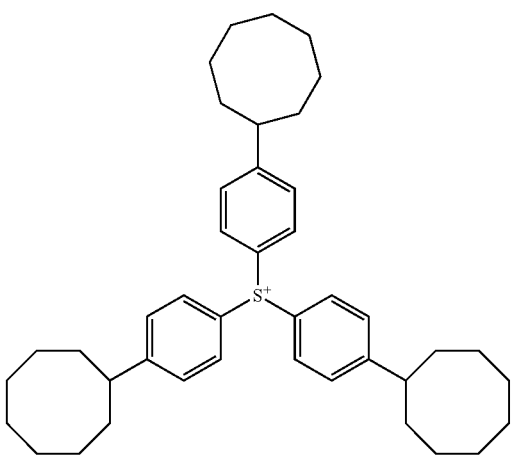
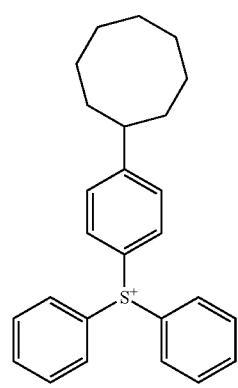
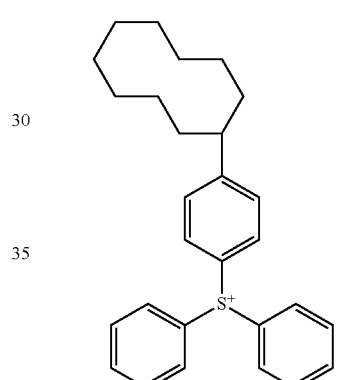
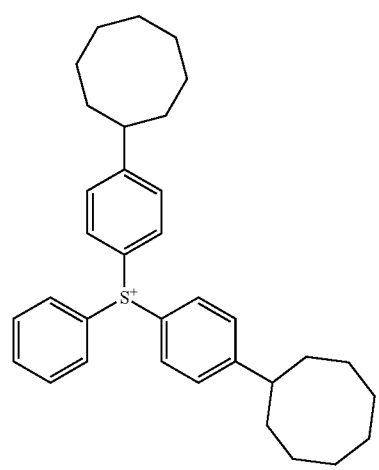
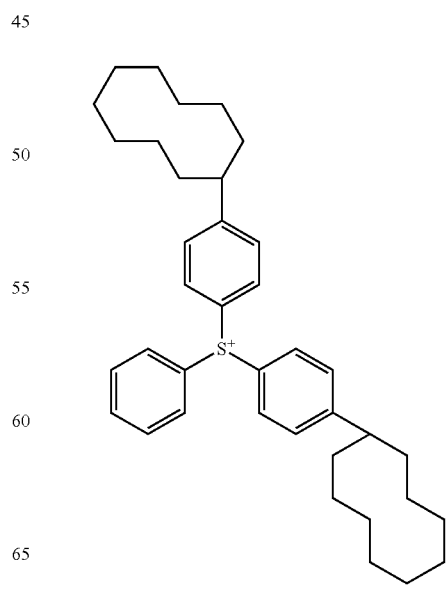

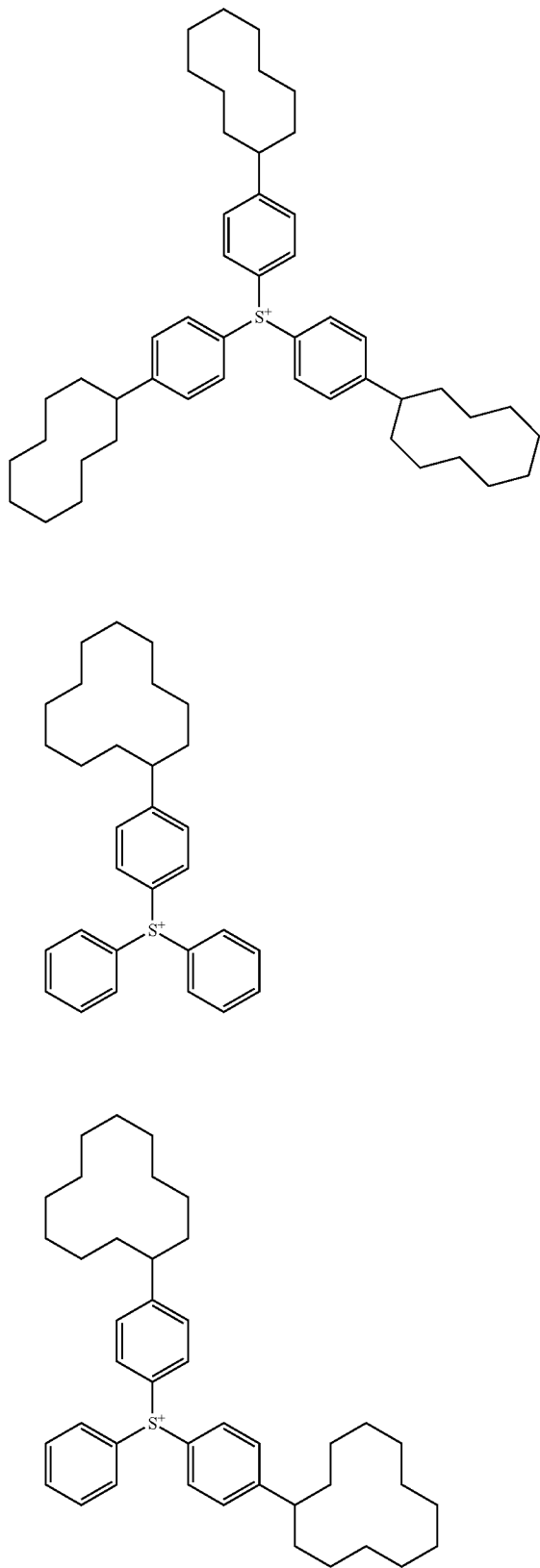
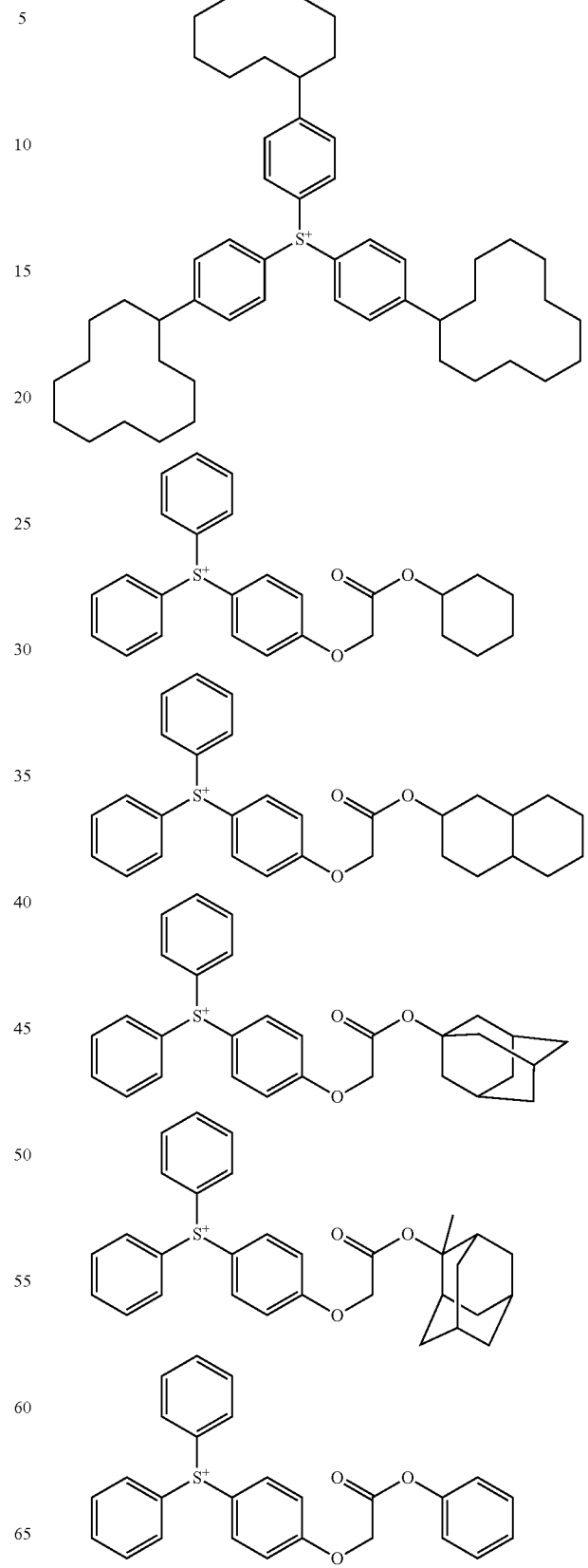

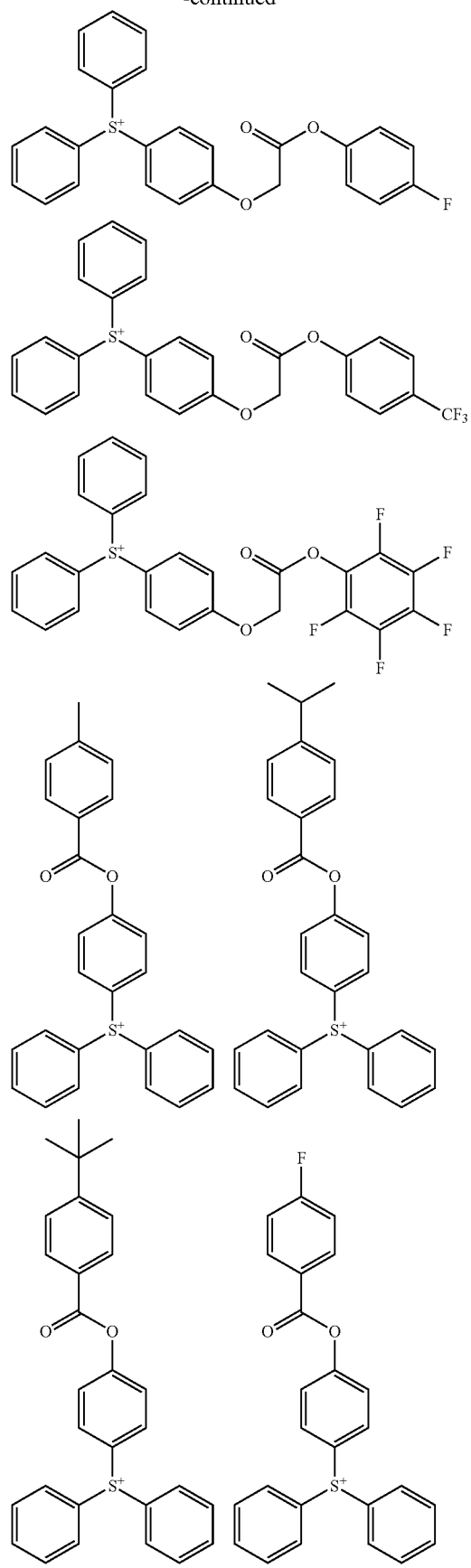
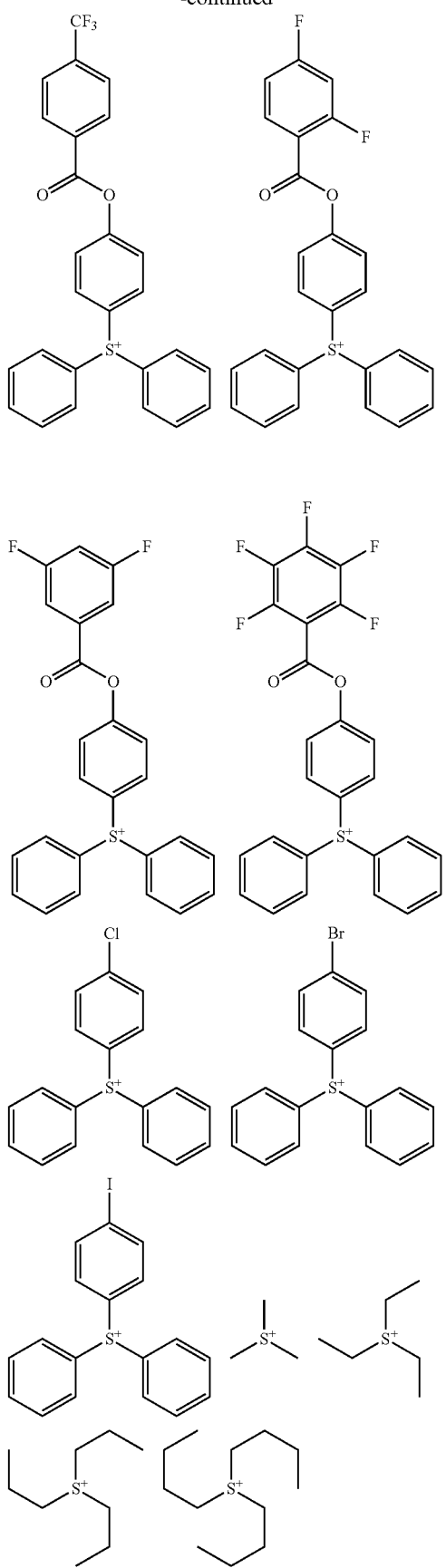

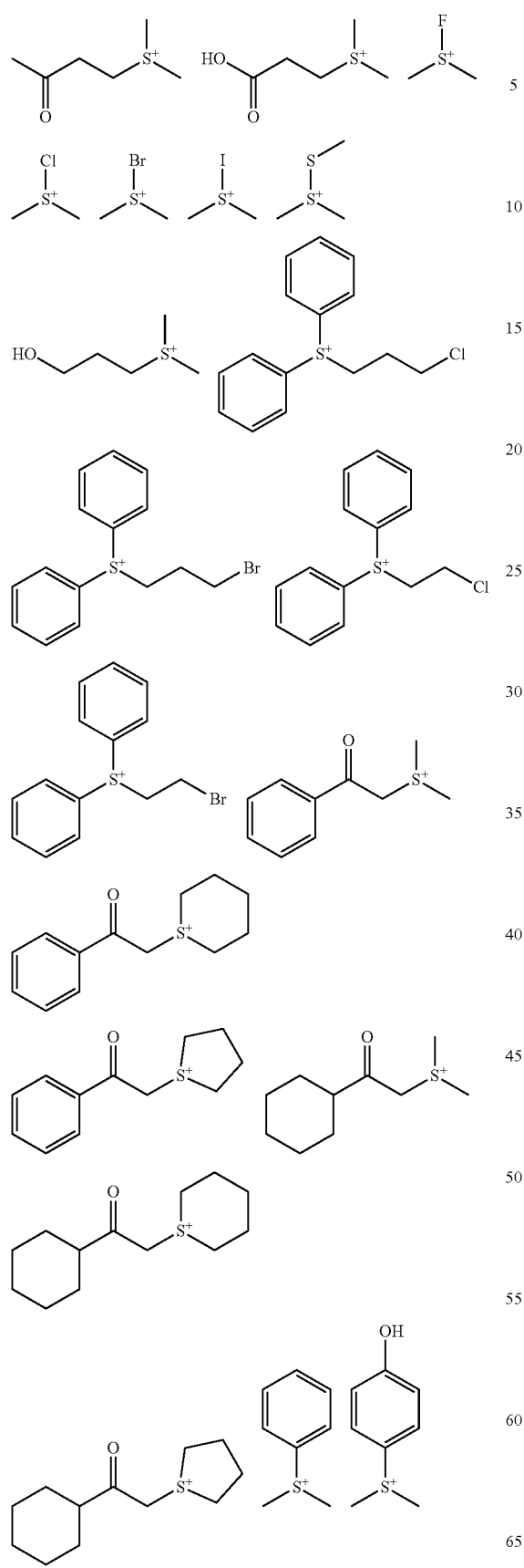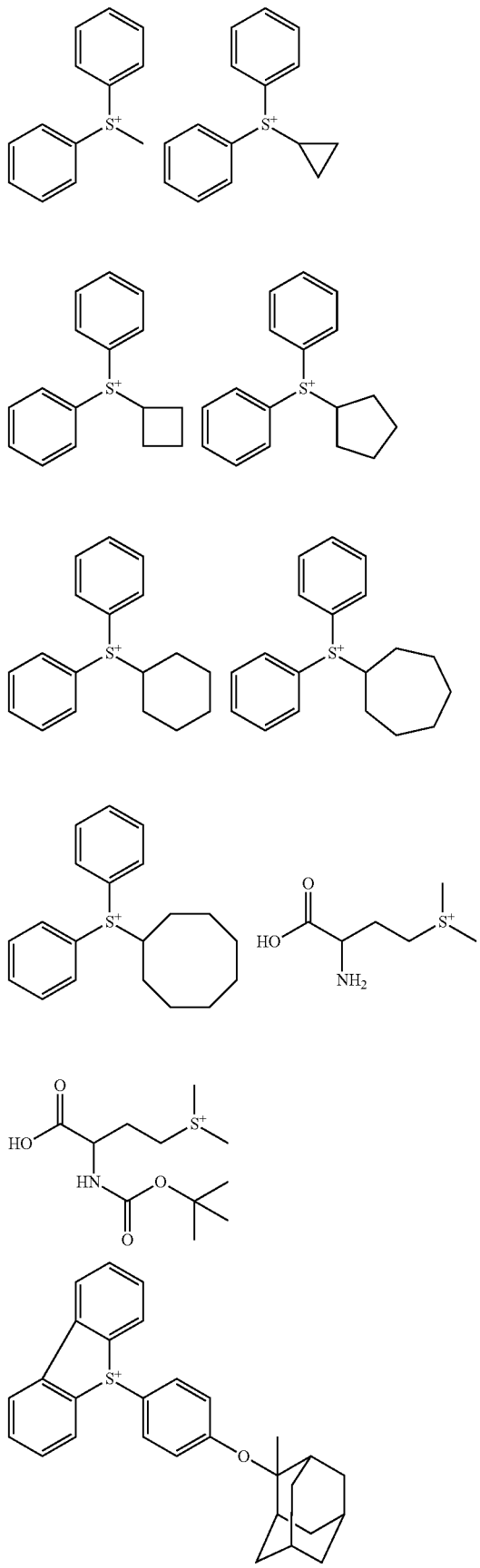

53
-continued
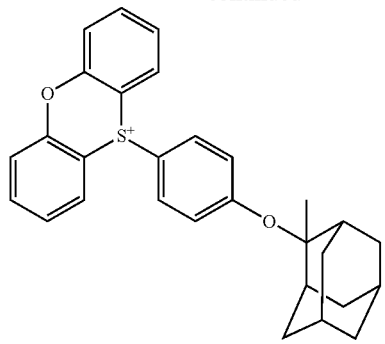
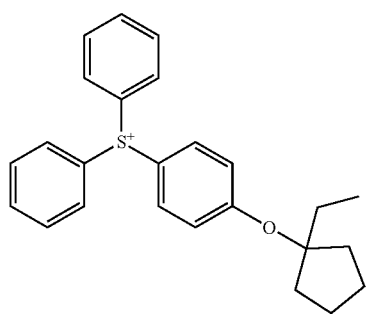
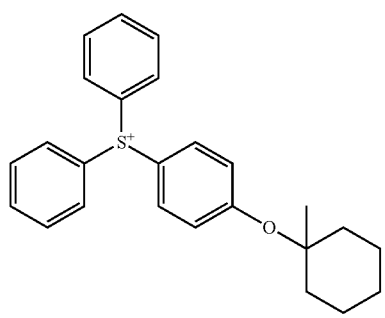
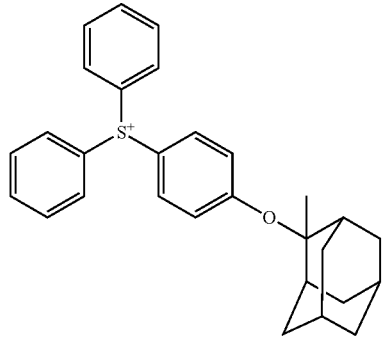
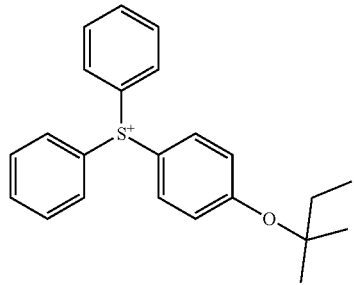
54
-continued
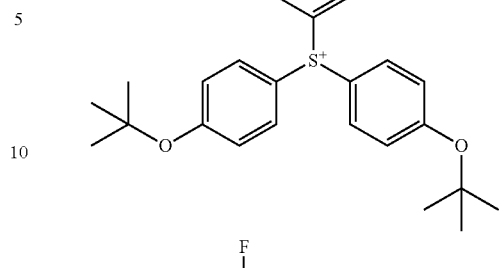
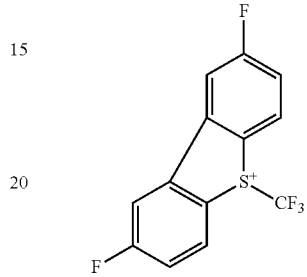
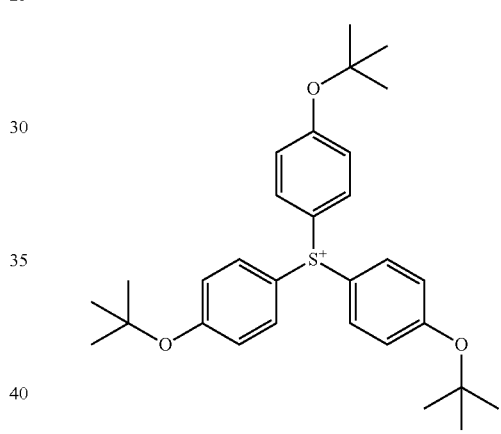
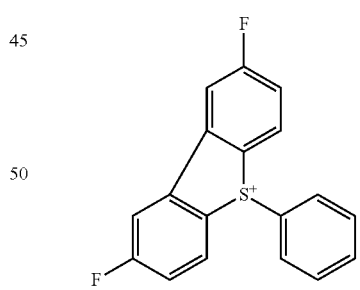
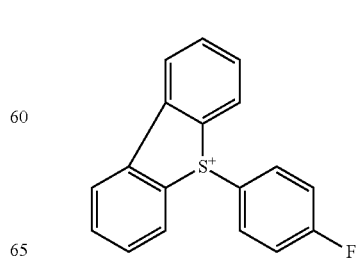

Examples of the cation moiety in recurring unit (a2) are given below, but not limited thereto.
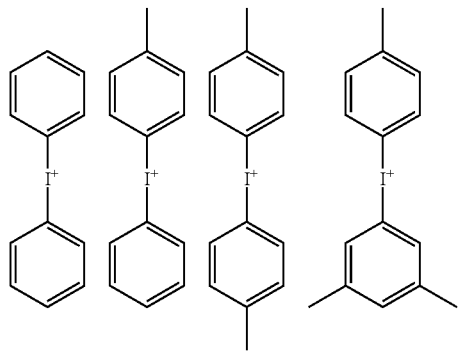
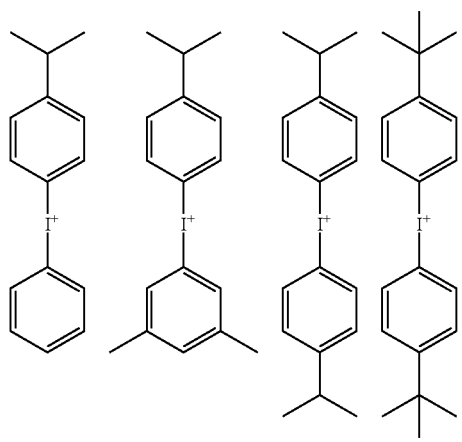
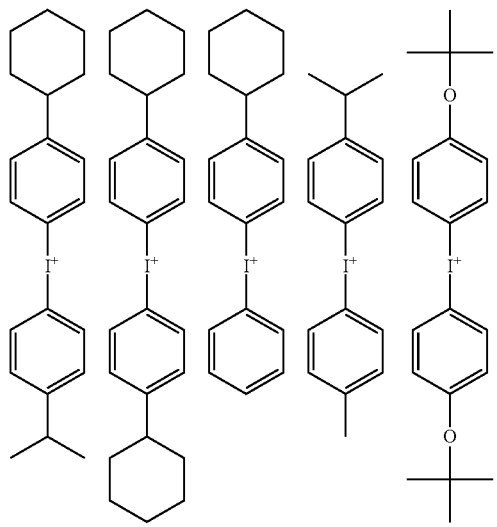
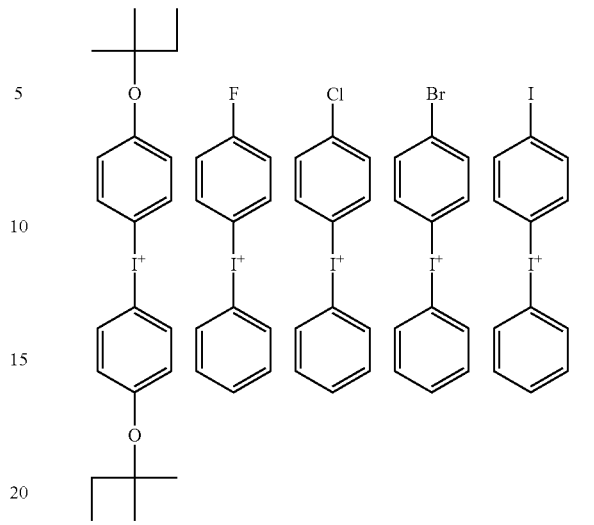
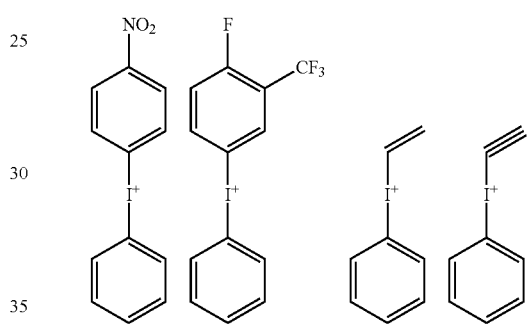
-continued
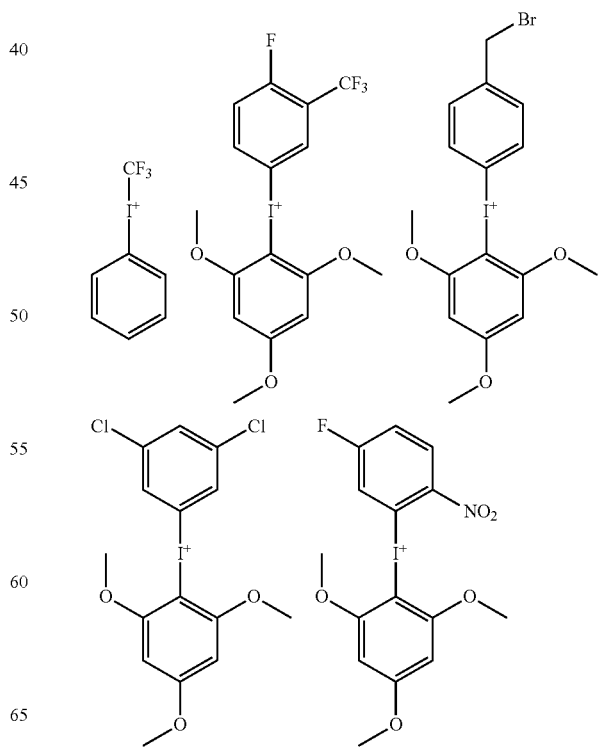

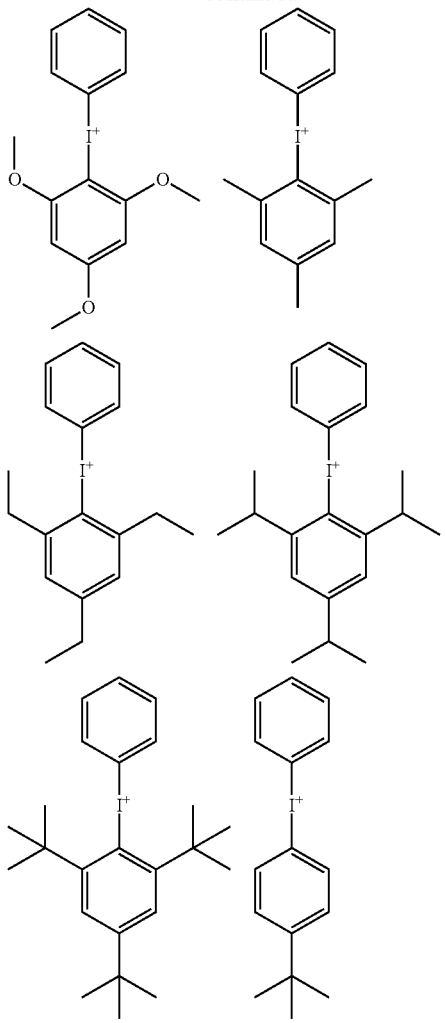

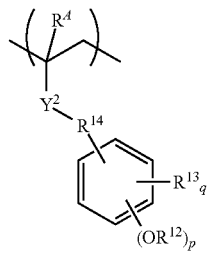
(b2)

Herein $R^A$ is each independently hydrogen or methyl. $Y^1$ is a single bond, phenylene group, naphthylene group, or a $C_1$-$C_{12}$ linker which may contain an ester moiety and/or lactone ring. $Y^2$ is a single bond or ester group, $R^{11}$ and $R^{12}$ are each independently an acid labile group. $R^{13}$ is halogen, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group. $R^{14}$ is a single bond or a $C_1$-$C_6$ straight or branched alkylene group in which at least one carbon atom may be substituted by an ether or ester moiety, p is 1 or 2, and q is an integer of 0 to 4.

Examples of the recurring units (b1) are shown below, but not limited thereto. $R^A$ and $R^{11}$ are as defined above.

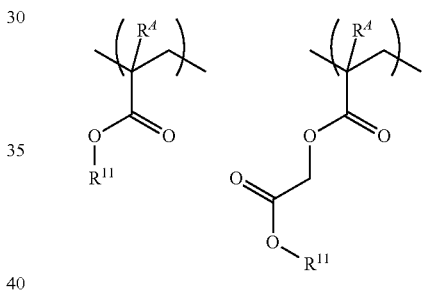

The monomers from which recurring units (a1) or (a2) are derived may be synthesized, for example, by the same method as described in U.S. Pat. No. 8,057,985 (JP 5201363) for the synthesis of a sulfonium salt having a polymerizable anion.

The polymer-bound acid generator may also function as a base polymer. To this end, the polymer-bound acid generator contains recurring units having an acid labile group when the resist composition is a chemically amplified positive resist composition. The preferred recurring units having an acid labile group are recurring units having the formula (b1) or recurring units having the formula (b2). These units are simply referred to as recurring units (b1) and (b2).

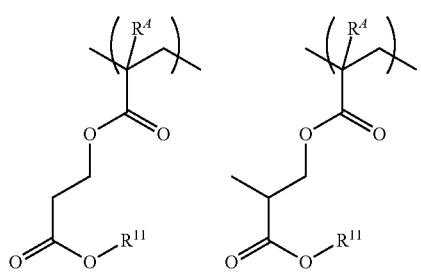

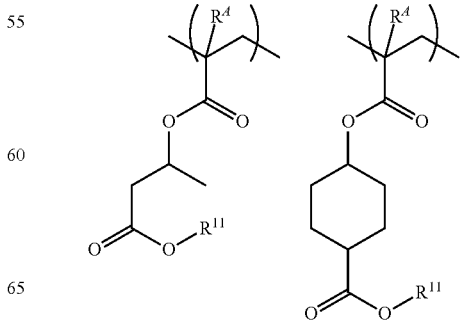

(b1)

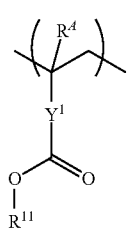

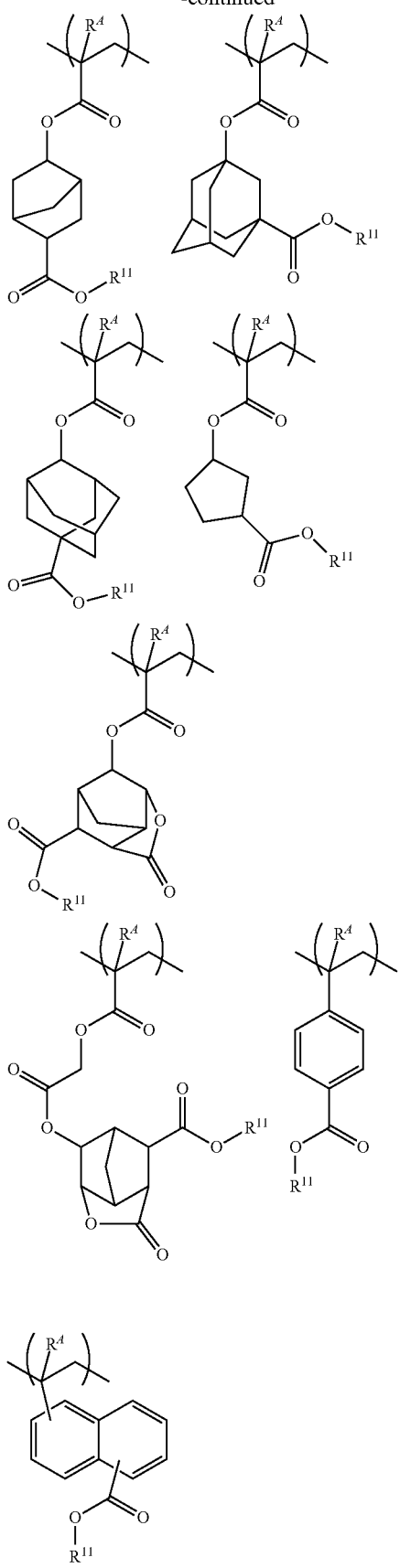
Examples of the recurring units (b2) are shown below, but not limited thereto. $R^A$ and $R^{12}$ are as defined above.
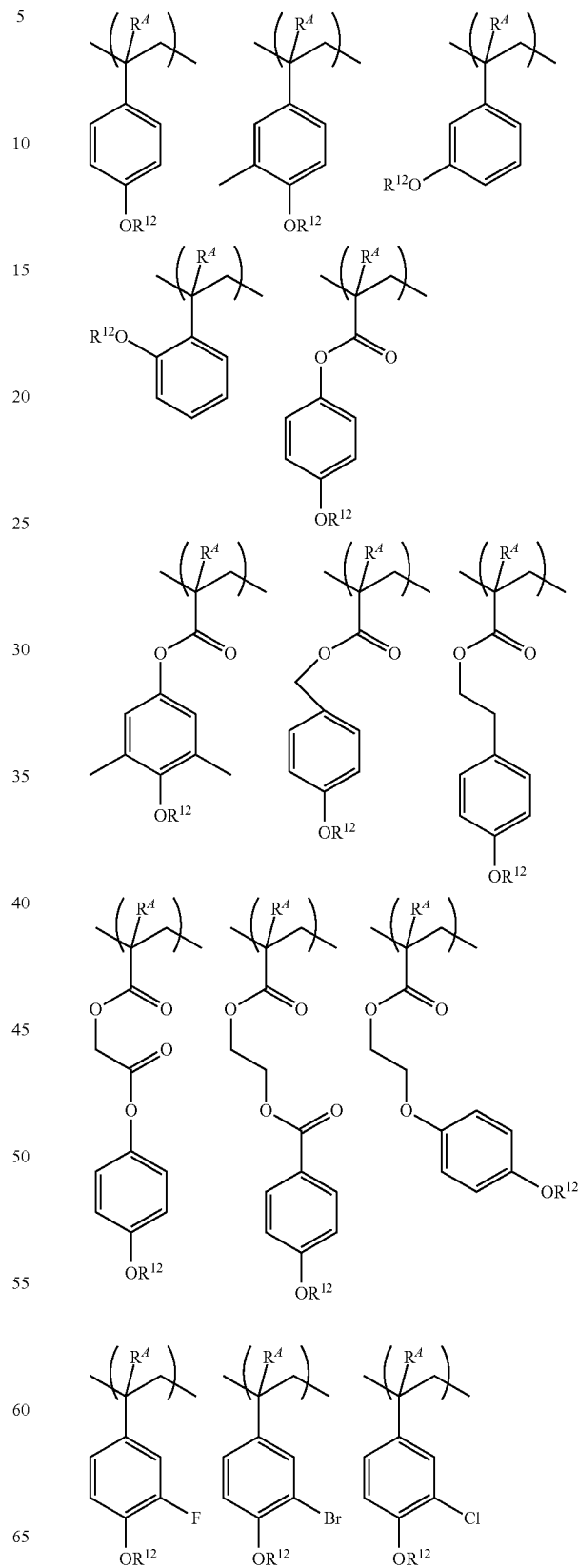

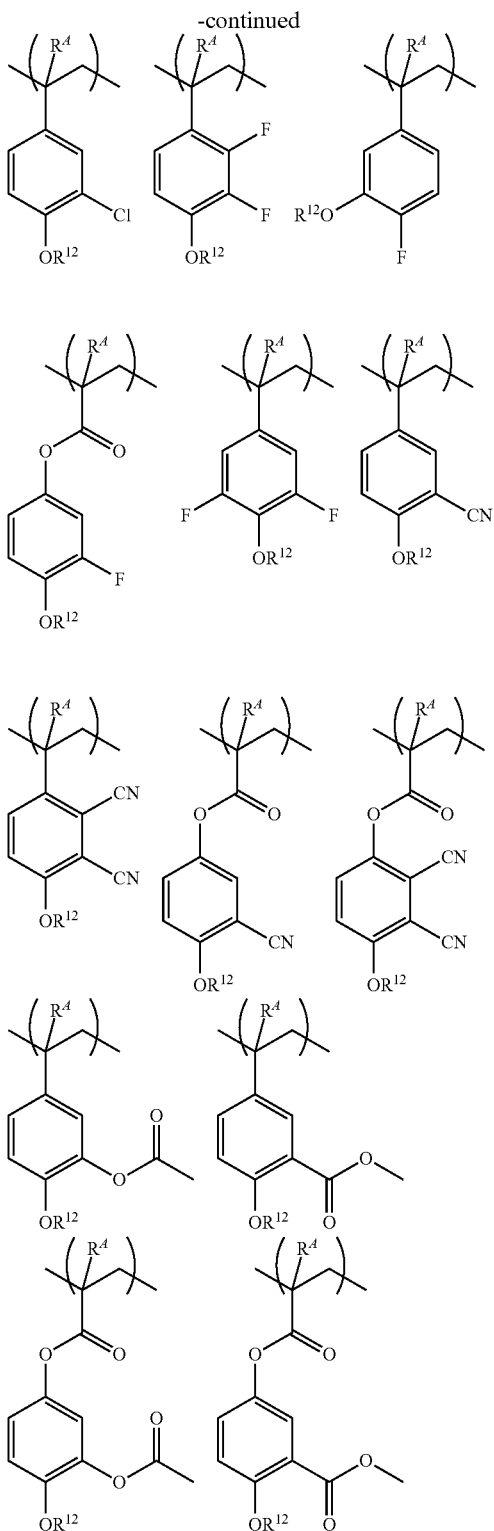

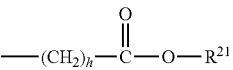

(AL-1)

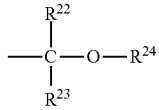

(AL-2)

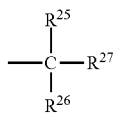

(AL-3)

In formulae (AL-1) and (AL-2), $R^{21}$ and $R^{24}$ are each independently a monovalent hydrocarbon group of 1 to 40 carbon atoms, preferably 1 to 20 carbon atoms, typically straight, branched or cyclic alkyl, which may contain a heteroatom such as oxygen, sulfur, nitrogen or fluorine. $R^{22}$ and $R^{23}$ are each independently hydrogen or a monovalent hydrocarbon group of 1 to 20 carbon atoms, typically straight, branched or cyclic alkyl, which may contain a heteroatom such as oxygen, sulfur, nitrogen or fluorine. Any two of $R^{22}$, $R^{23}$ and $R^{24}$ may bond together to form a ring, typically alicyclic, with the carbon atom or carbon and oxygen atoms to which they are attached, the ring containing 3 to 20 carbon atoms, preferably 4 to 16 carbon atoms. The subscript h is an integer of 0 to 10, especially 1 to 5.

In formula (AL-3), $R^{25}$, $R^{26}$ and $R^{27}$ are each independently a monovalent hydrocarbon group of 1 to 20 carbon atoms, typically straight, branched or cyclic alkyl, which may contain a heteroatom such as oxygen, sulfur, nitrogen or fluorine. Any two of $R^{25}$, $R^{26}$ and $R^{27}$ may bond together to form a ring, typically alicyclic, with the carbon atom to which they are attached, the ring containing 3 to 20 carbon atoms, preferably 4 to 16 carbon atoms.

In the embodiment wherein the polymer-bound acid generator also functions as a base polymer, it may further comprise recurring units (c) having a phenolic hydroxyl group as an adhesive group. Examples of suitable monomers from which recurring units (c) are derived are given below, but not limited thereto. Herein $R^A$ is as defined above.

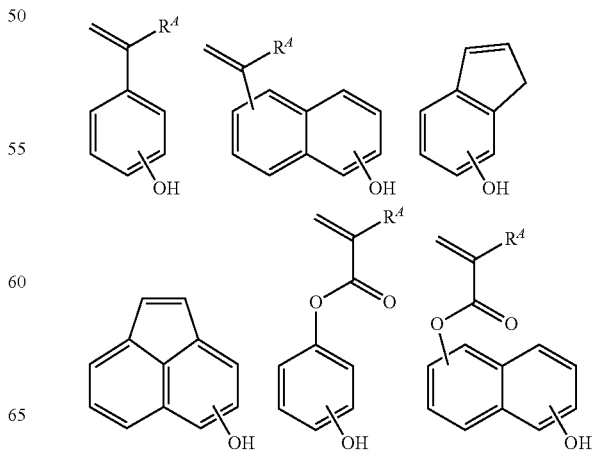

The acid labile groups represented by $R^{11}$ and $R^{12}$ in formulae (b1) and (b2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

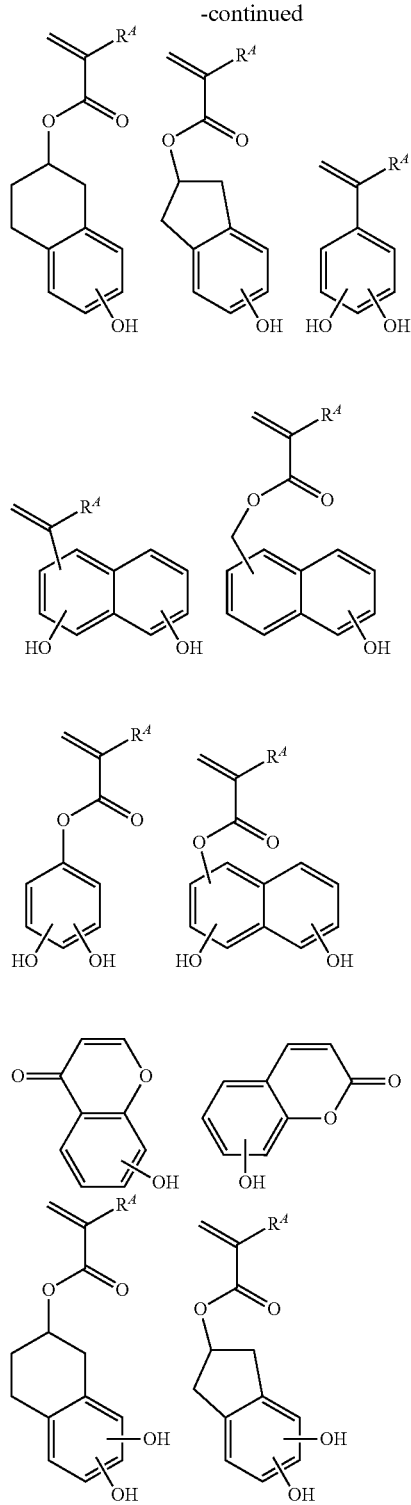

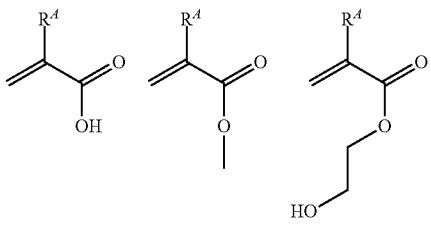
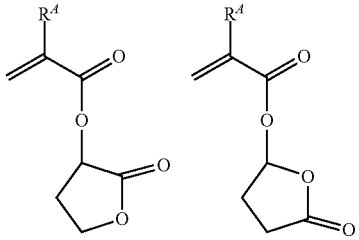
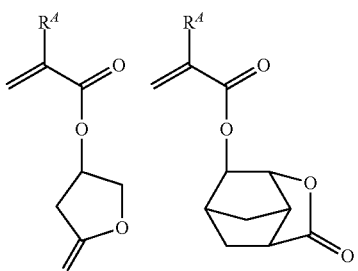
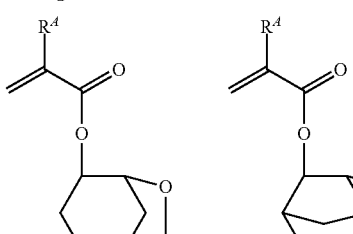
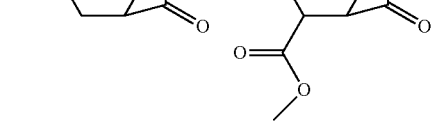
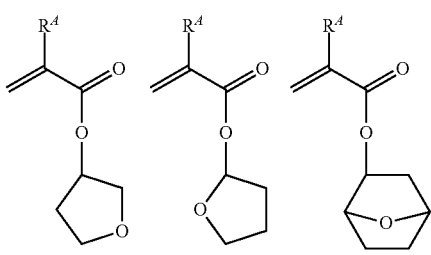
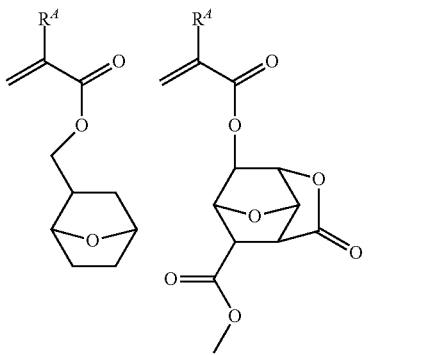

In the embodiment wherein the polymer-bound acid generator also functions as a base polymer, it may further comprise recurring units (d) having another adhesive group selected from hydroxyl (other than the phenolic hydroxyl), carboxyl, lactone ring, ether, ester, carbonyl and cyano groups. Examples of suitable monomers from which recurring units (d) are derived are given below, but not limited thereto. Herein $R^4$ is as defined above.

-continued
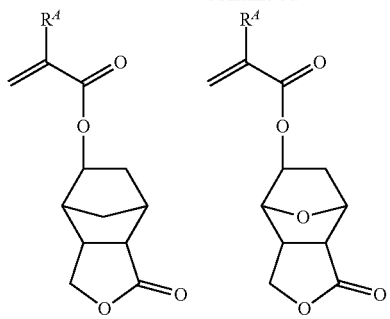
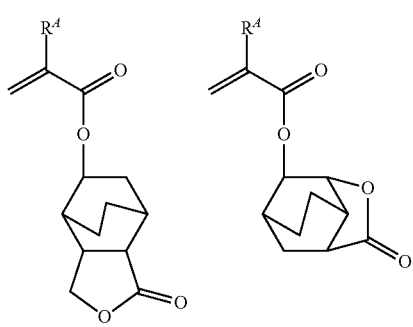
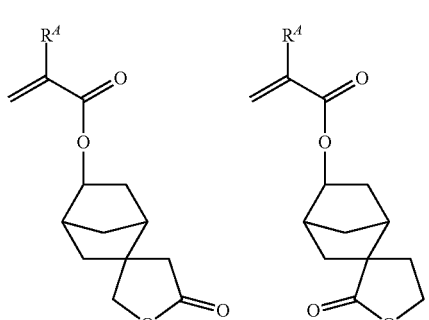
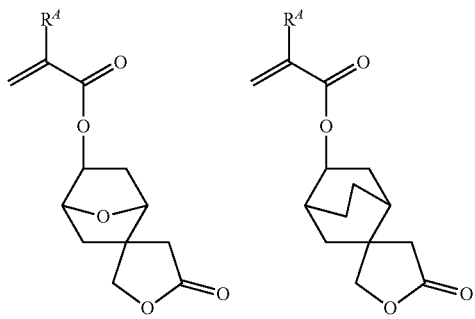
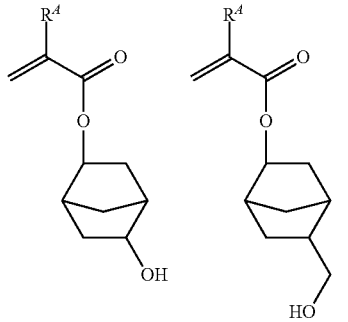
-continued
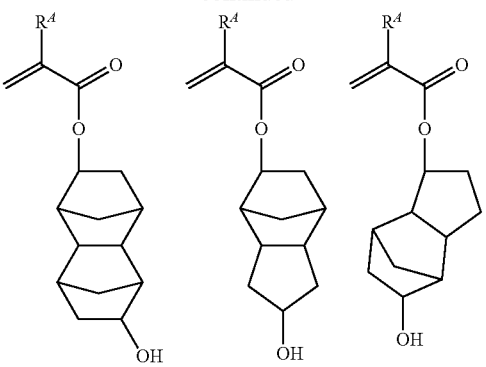
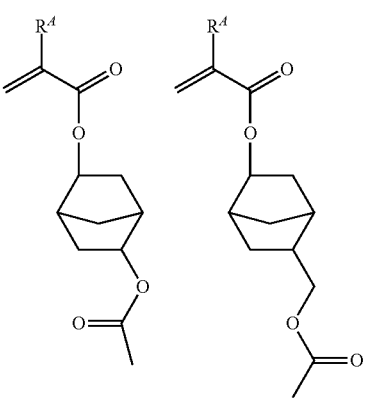
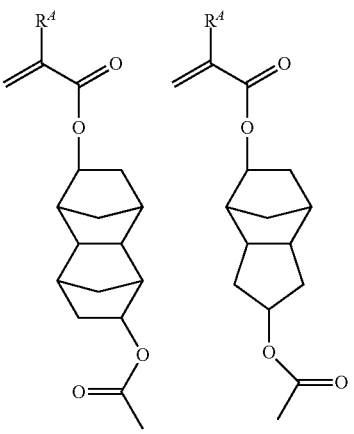
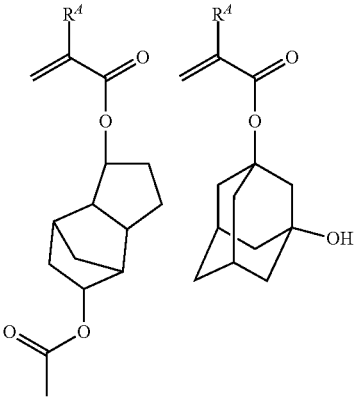

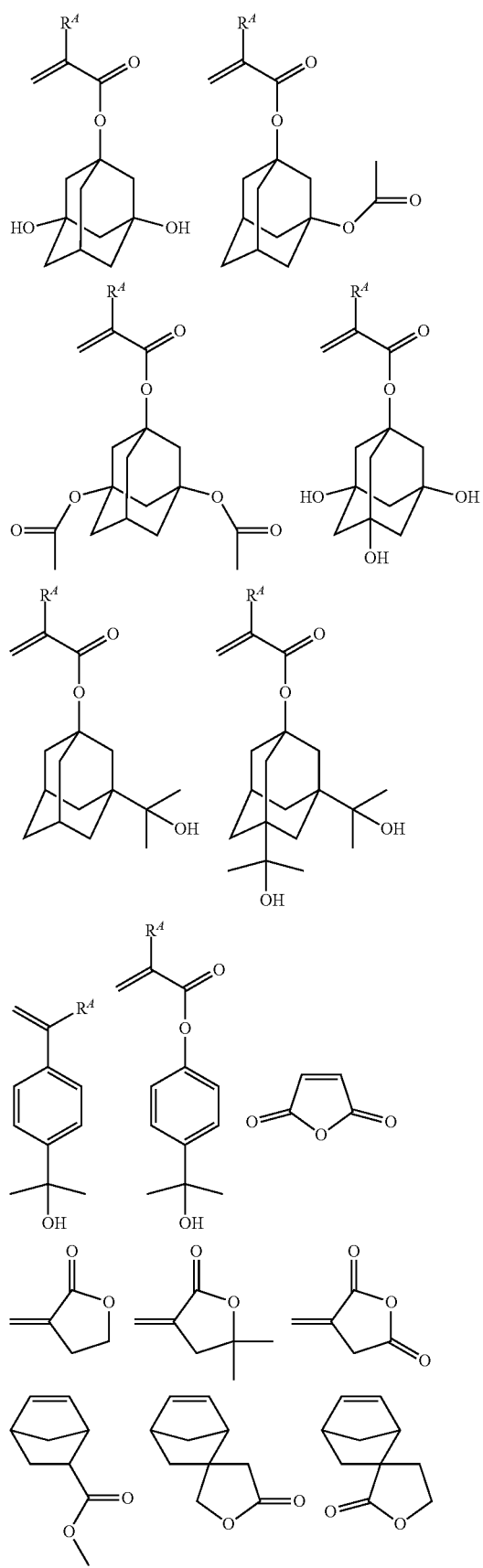
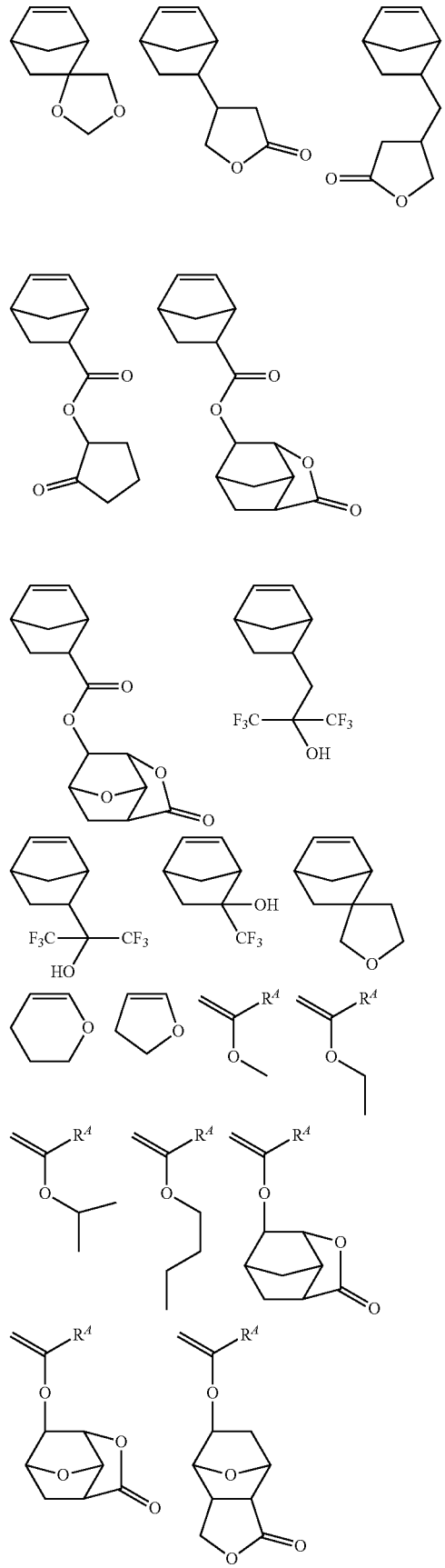

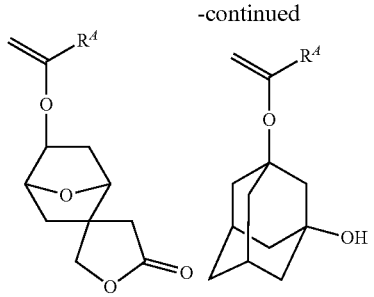
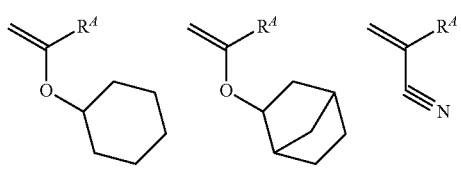
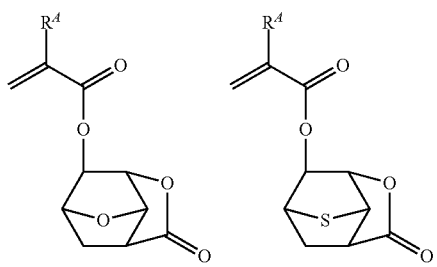
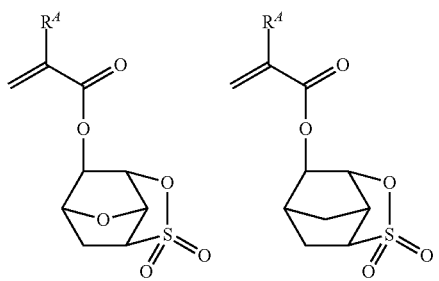
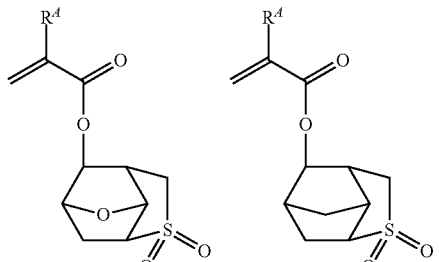
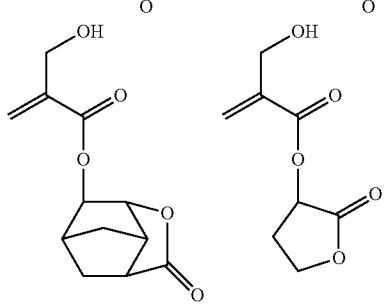
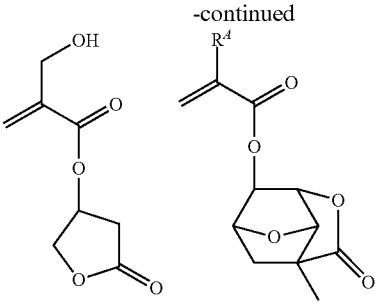
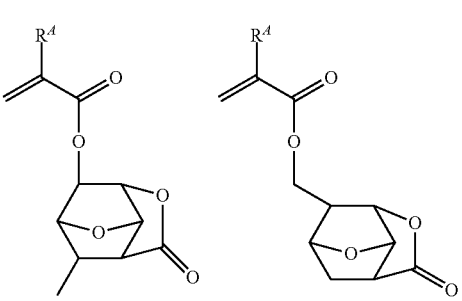
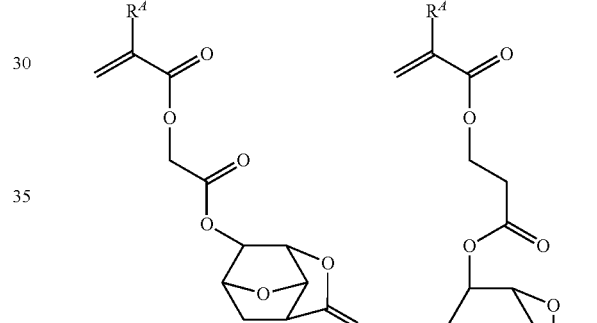
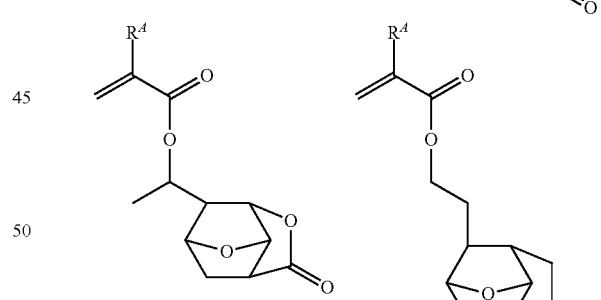
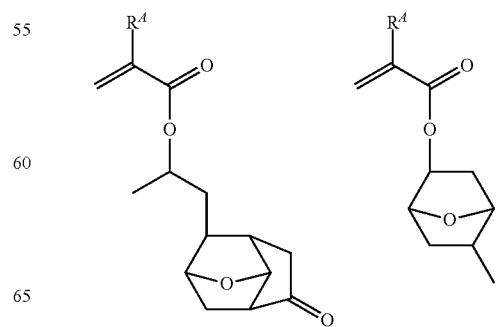

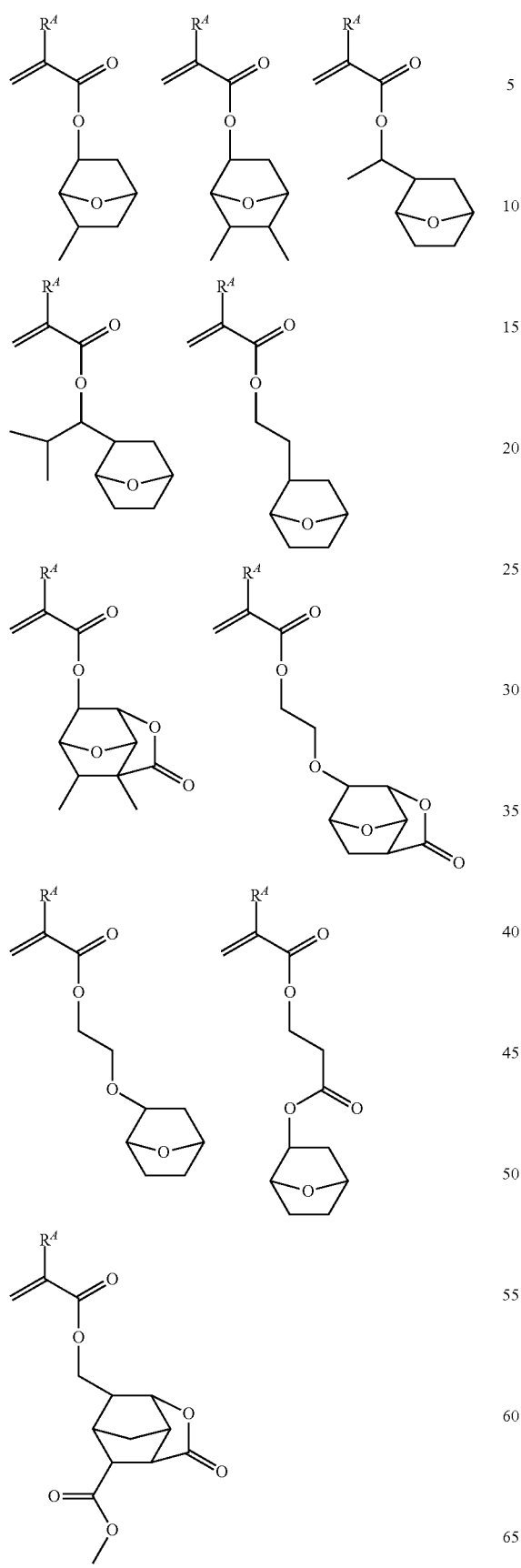
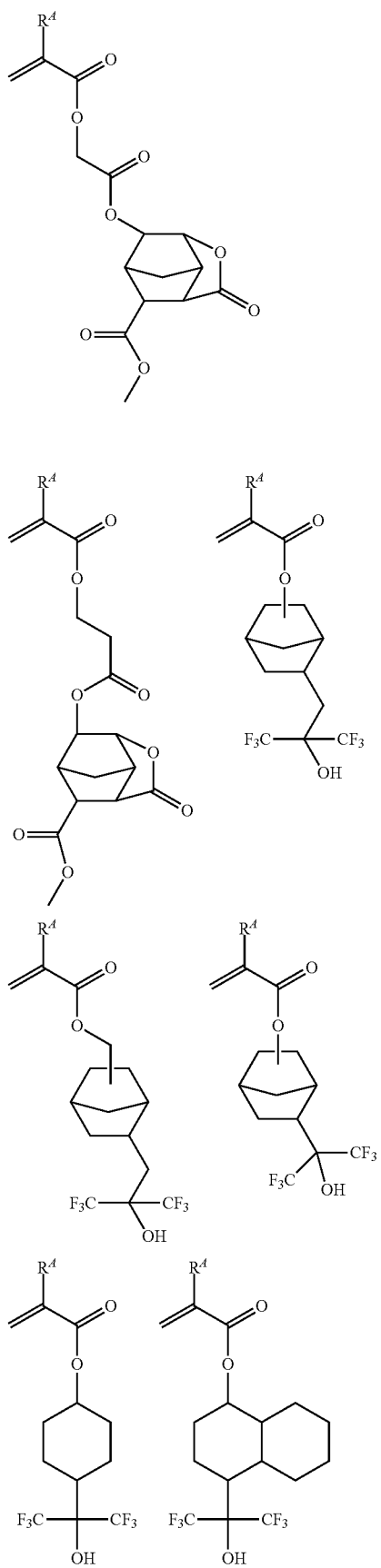

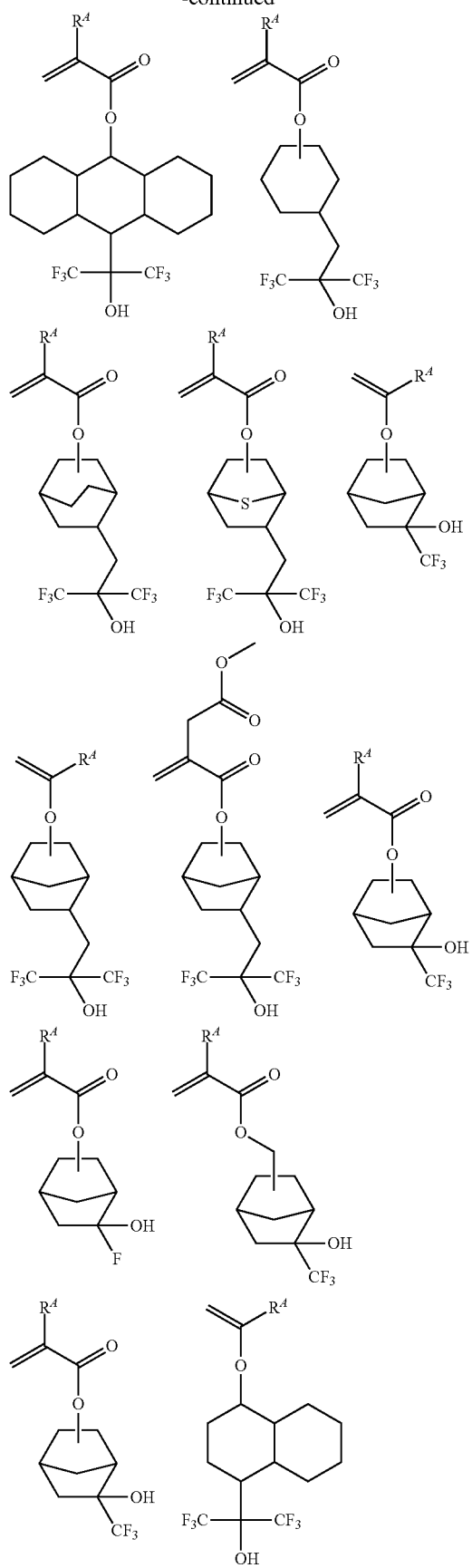
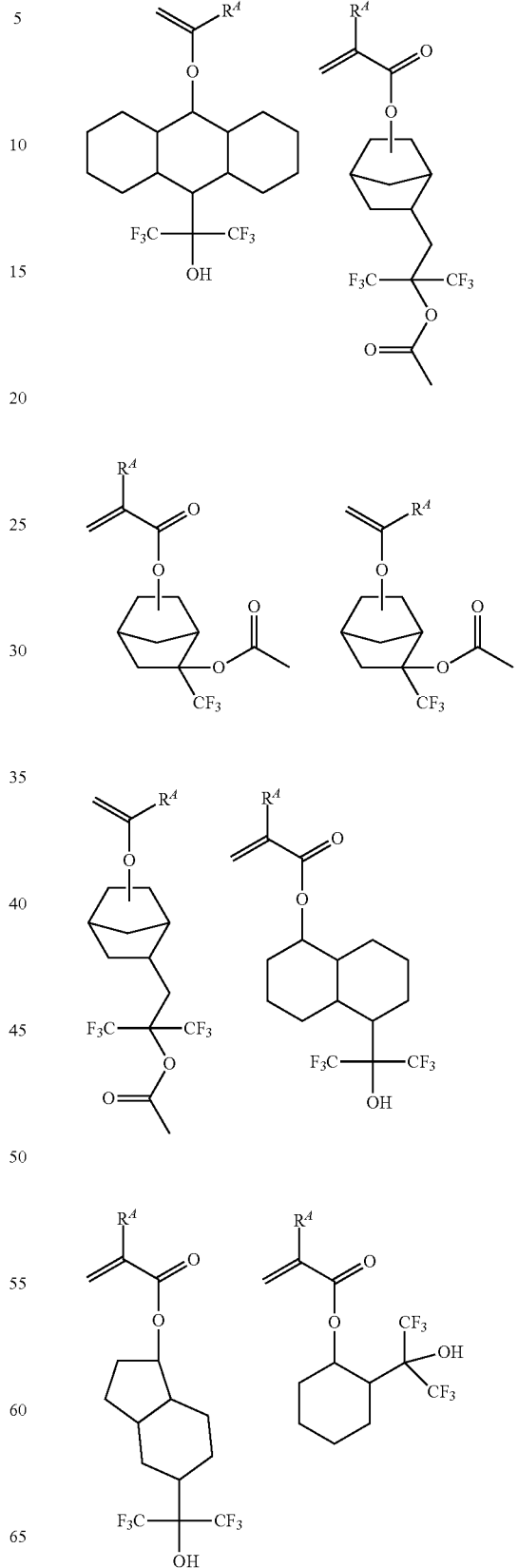

-continued
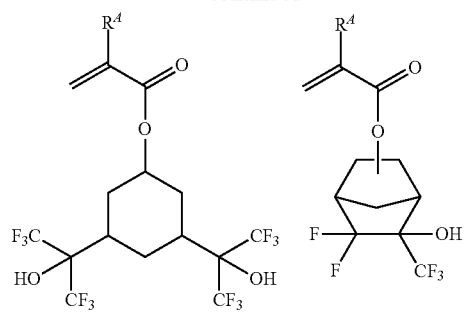
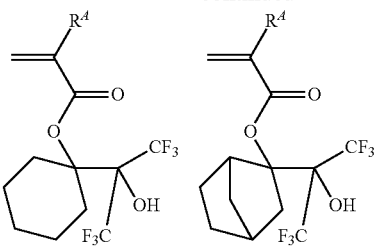
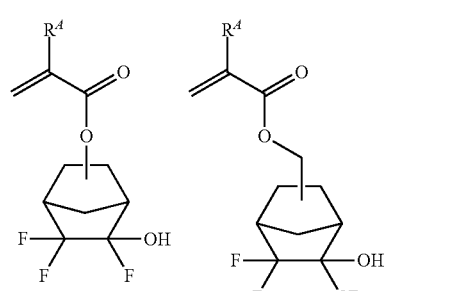
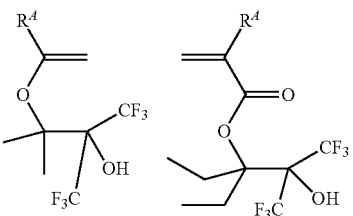
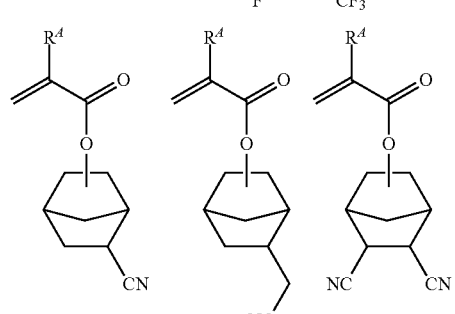
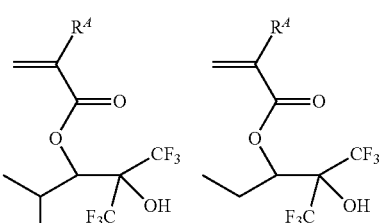
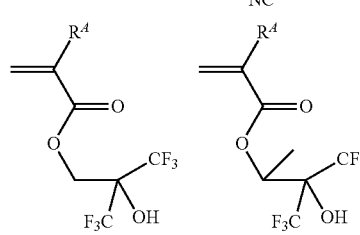
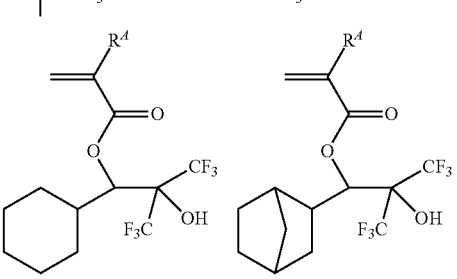
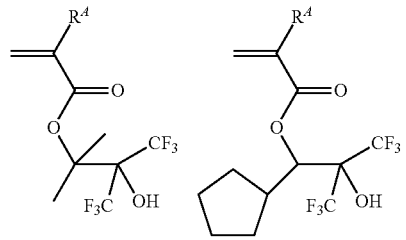
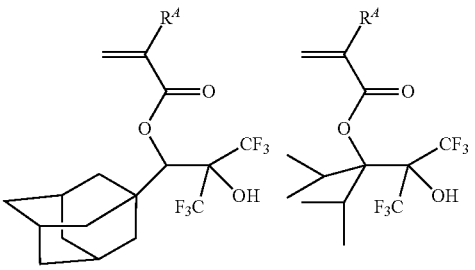
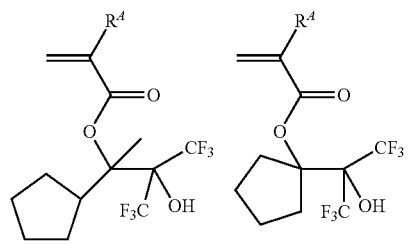
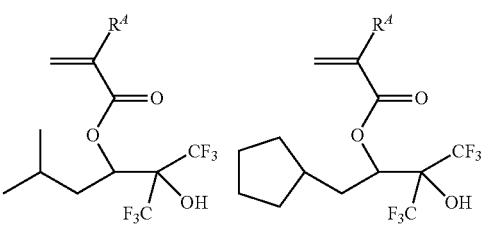
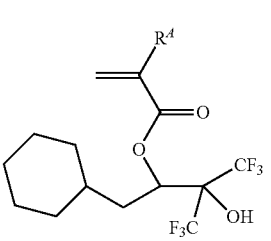

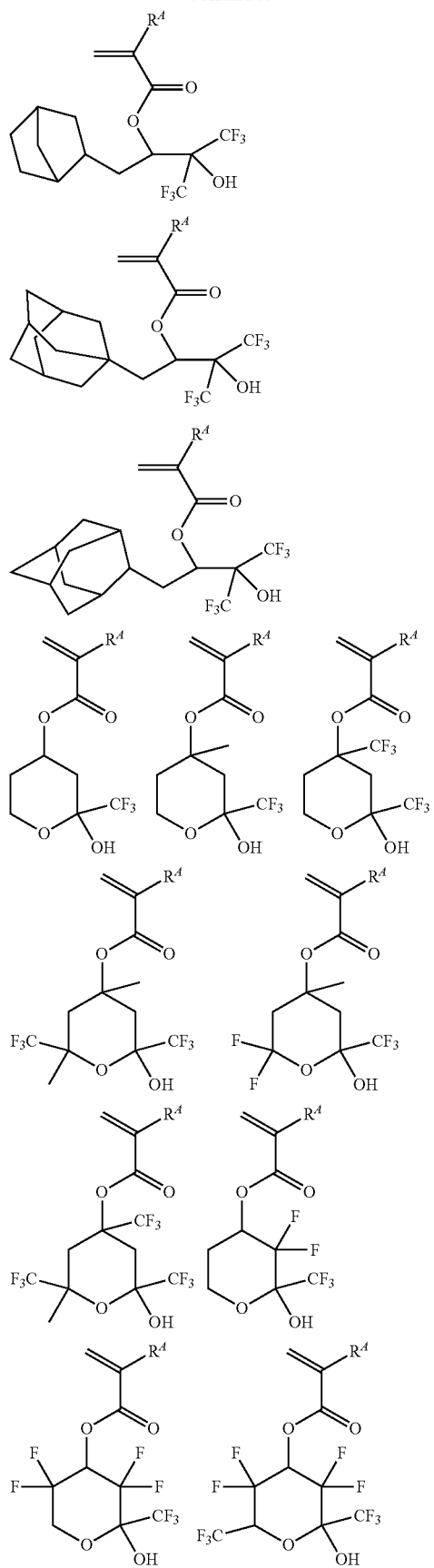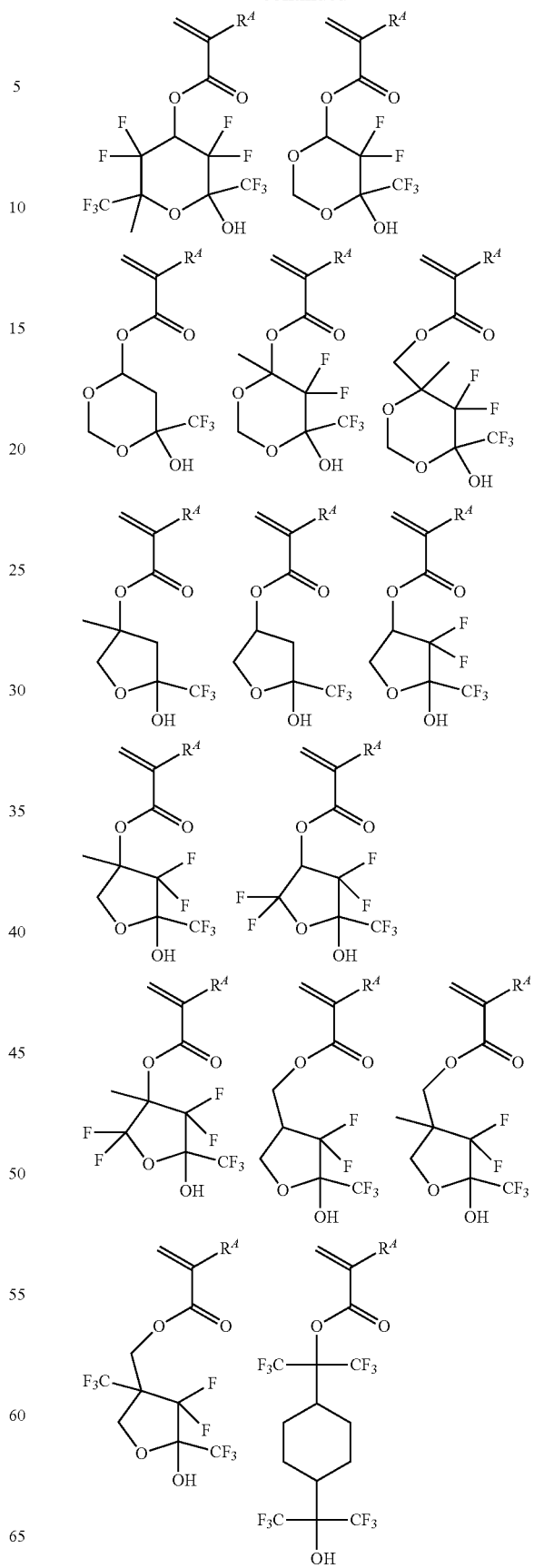

-continued
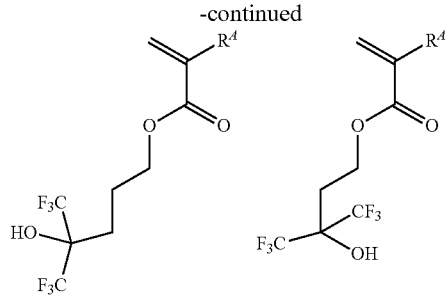
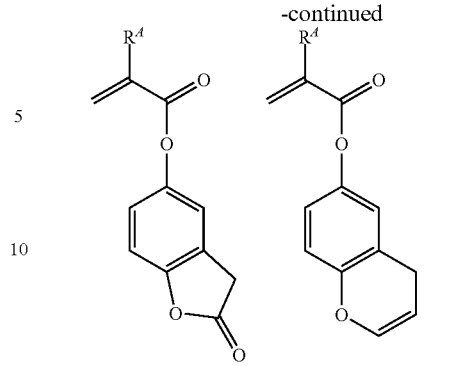
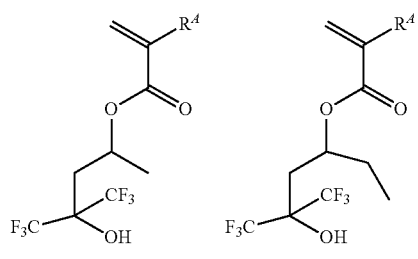
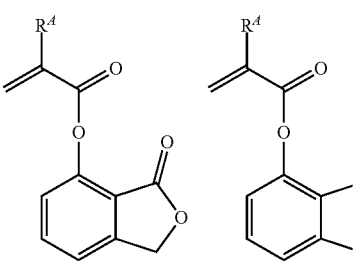
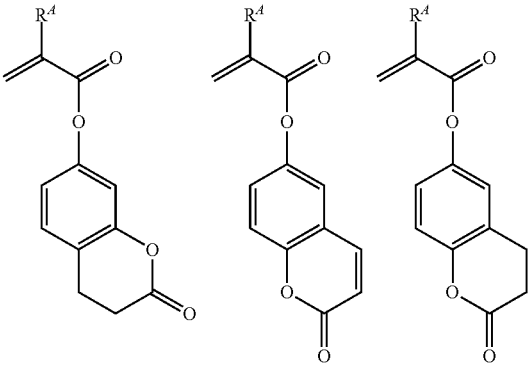
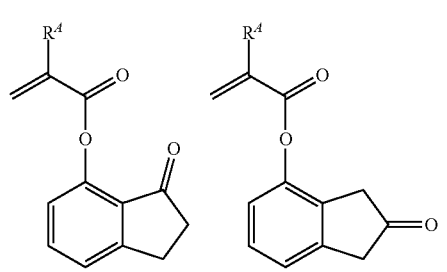
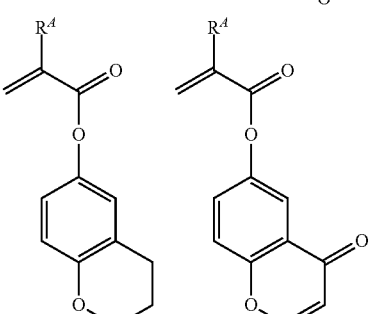
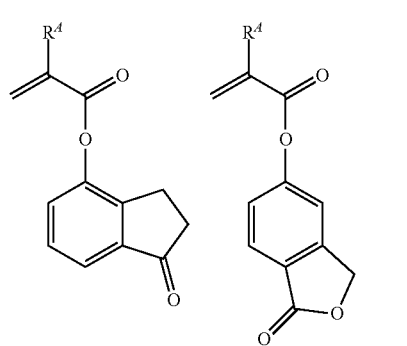
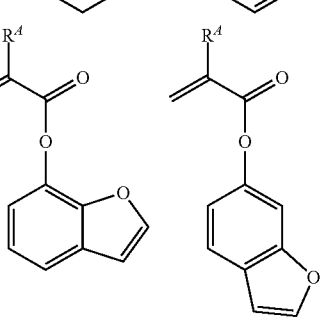

81
-continued
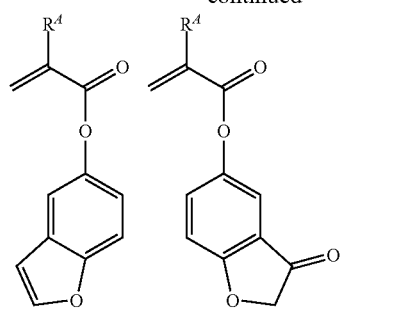
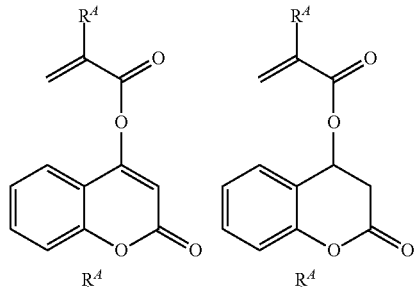
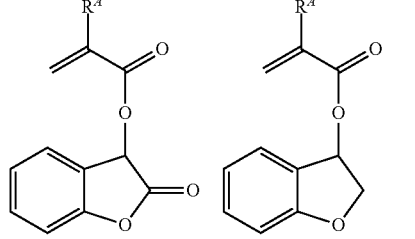
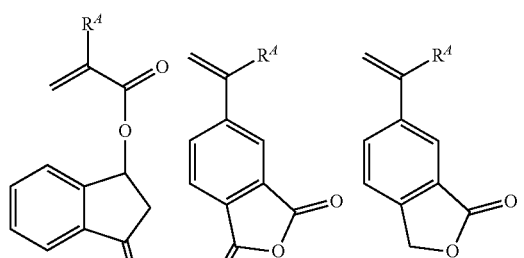
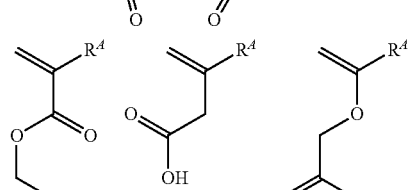
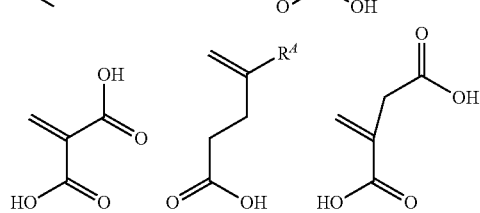
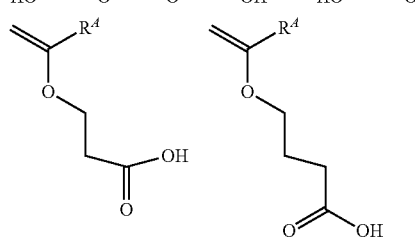
82
-continued
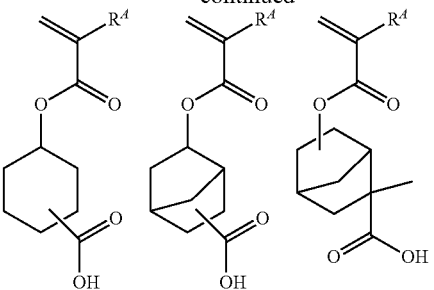
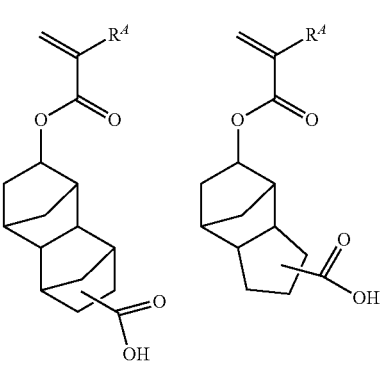
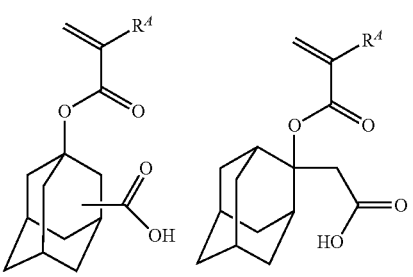
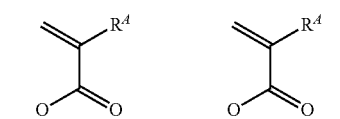
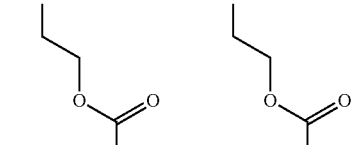
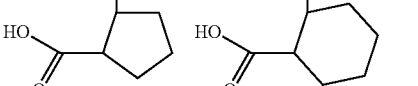
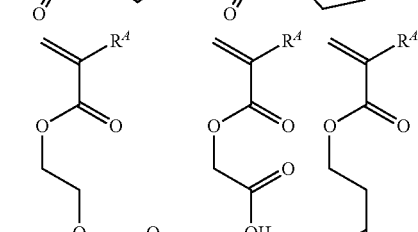
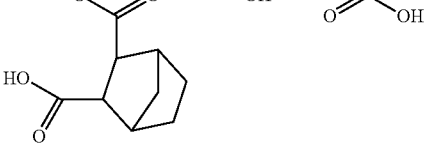

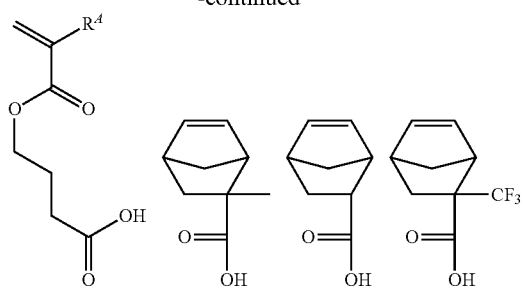
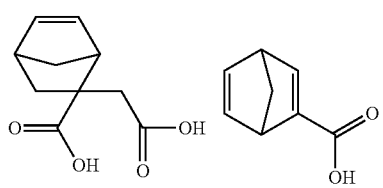
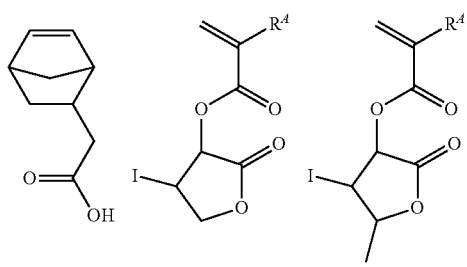
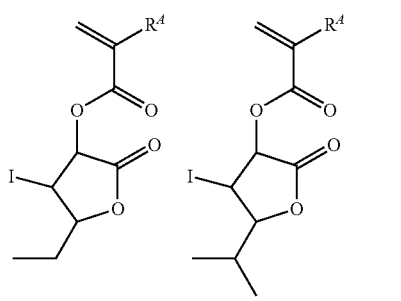
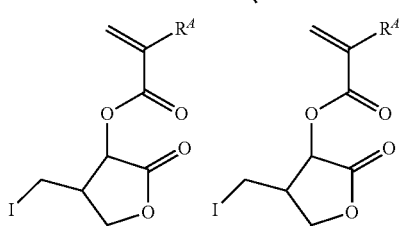
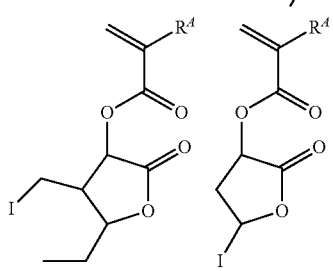
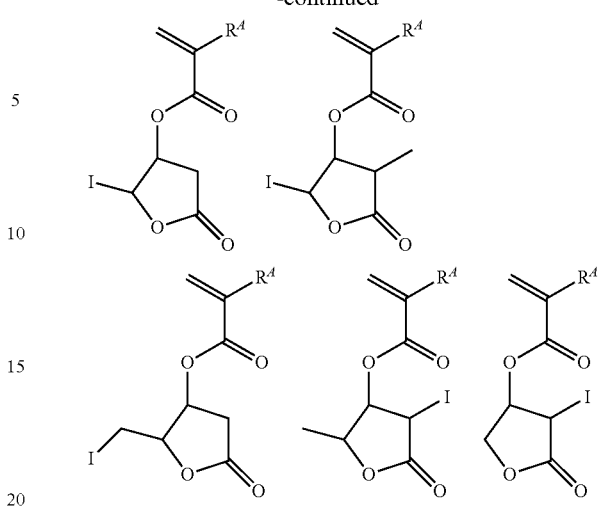

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In the embodiment wherein the polymer-bound acid generator also functions as a base polymer, it may further comprise recurring units (e) derived from indene, benzofuran, benzothiophene, acenaphthylene, chromone, coumarin, and norbornadiene, or derivatives thereof. Suitable monomers are exemplified below.

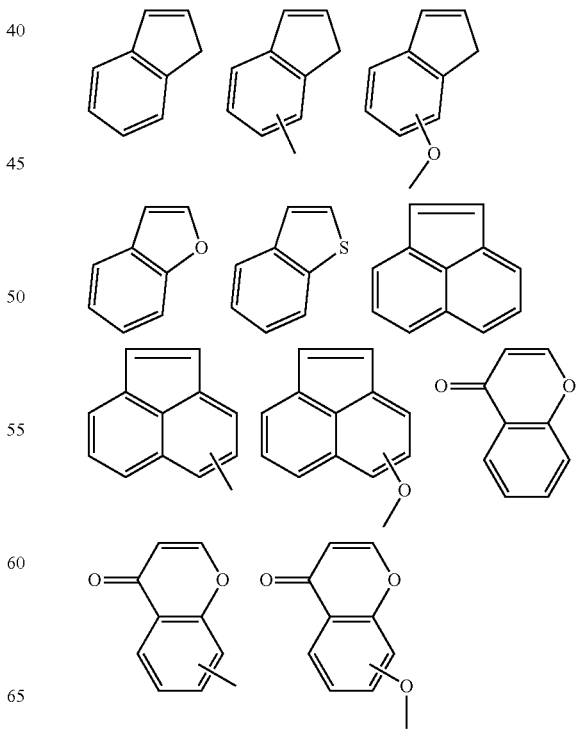

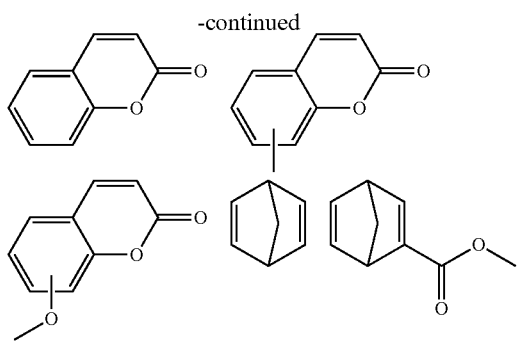

In the embodiment wherein the polymer-bound acid generator also functions as a base polymer, it may further comprise recurring units (f) derived from indane, vinylpyridine or vinylcarbazole.

The polymer-bound acid generator may further comprise recurring units (g) derived from an onium salt having a polymerizable unsaturated bond, other than recurring units (a1) and (a2). Such recurring units (g) are described in U.S. Pat. No. 9,810,983 (JP-A 2017-008181, paragraph [0060]).

The base polymer for formulating the positive resist composition comprises recurring units (a1) and/or (a2) and recurring units (b1) and/or (b2) having an acid labile group as essential components and additional recurring units (c), (d), (e), (f) and (g) as optional components. A fraction of units (a1), (a2), (b1), (b2), (c), (d), (e), (f) and (g) is: preferably $0 \leq a1 < 1.0$, $0 \leq a2 < 1.0$, $0 < a1+a2 < 1.0$, $0 \leq b1 < 1.0$, $0 \leq b2 < 1.0$, $0 < b1+b2 < 1.0$, $0 \leq c \leq 0.9$, $0 \leq 0.9$, $0 \leq e \leq 0.8$, $0 \leq f \leq 0.8$, and $0 \leq g \leq 0.4$; more preferably $0 \leq a1 \leq 0.7$, $0 \leq a2 \leq 0.7$, $0.02 \leq a1+a2 \leq 0.7$, $0 \leq b1 \leq 0.9$, $0 \leq b2 \leq 0.9$, $0.1 \leq b1+b2 \leq 0.9$, $0 \leq c \leq 0.8$, $0 \leq d \leq 0.8$, $0 \leq e \leq 0.7$, $0 f \leq 0.7$, and $0 \leq g \leq 0.3$; and even more preferably $0 \leq a1 \leq 0.5$, $0 \leq a2 \leq 0.5$, $0.03 \leq a1+a2 \leq 0.5$, $0 \leq b1 \leq 0.8$, $0 \leq b2 \leq 0.8$, $0.1 \leq b1+b2 \leq 0.8$, $0 \leq c \leq 0.7$, $0 \leq d \leq 0.7$, $0 \leq e \leq 0.6$, $0 f \leq 0.6$, and $0 \leq g \leq 0.2$. Notably, $a1+a2+b1+b2+c+d+e+f+g=1.0$.

For the base polymer for formulating the negative resist composition, an acid labile group is not necessarily essential. The base polymer comprises recurring units (a1) and/or (a2) as essential component, and recurring units (c), (d), (e), (0 and/or (g) as optional components. A fraction of these units is: preferably $0 \leq a1 \leq 1.0$, $0 \leq a2 < 1.0$, $0 < a1+a2 < 1.0$, $0 \leq c < 1.0$, $0 \leq 0.9$, $0 \leq 0.8$, $0 \leq 0.8$, and $0.4$; more preferably $0 \leq a1 \leq 0.7$, $0 \leq a2 \leq 0.7$, $0.02 \leq a1+a2 \leq 0.7$, $0.2 \leq c < 1.0$, $0 \leq d \leq 0.8$, $0 \leq e \leq 0.7$, $0 \leq f \leq 0.7$, and $0 \leq g \leq 0.3$; and even more preferably $0 \leq a1 \leq 0.5$, $0 \leq a2 \leq 0.5$, $0.03 \leq a1+a2 \leq 0.5$, $0.3 \leq c < 1.0$, $0 \leq d \leq 0.75$, $0 \leq e \leq 0.6$, $0 \leq f \leq 0.6$, and $0 \leq g \leq 0.2$. Notably, $a1+a2+c+d+e+f+g=1.0$.

The polymer-bound acid generator may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is preferably 2 to 100 hours, more preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the relevant units to hydroxystyrene or hydroxyvinylnaphthalene units. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The polymer-bound acid generator should preferably have a weight average molecular weight (Mw) in the range of 1,000 to 500,000, and more preferably 2,000 to 30,000, as measured by GPC versus polystyrene standards using tetrahydrofuran (THF) solvent. The range of Mw ensures that the resist composition is heat resistant.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the polymer-bound acid generator should preferably have a narrow dispersity (Mw/Mn) of 1.0 to 2.0, especially 1.0 to 1.5, in order to provide a resist composition suitable for micropatterning to a small feature size.

The polymer-bound acid generator may be a blend of two or more polymers which differ in compositional ratio, Mw or Mw/Mn.

Other Components With the polymer-bound acid generator defined above, other components such as another acid generator, organic solvent, surfactant, dissolution inhibitor, crosslinker and quencher may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when a chemically amplified positive resist composition capable of utilizing acid catalyzed reaction is formulated, the composition has a higher sensitivity and is further improved in the properties described above.

The resist composition may contain an acid generator other than the polymer-bound acid generator as long as the benefits of the invention are not compromised. The other acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

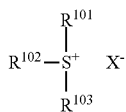
(1-1)

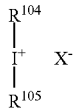
(1-2)

In formulae (1-1) and (1-2), $R^{101}$, $R^{102}$, $R^{103}$, $R^{104}$ and $R^{105}$ are each independently a $C_1$-$C_{20}$ straight, branched or cyclic monovalent hydrocarbon group which may contain a heteroatom. Any two of $R^{101}$, $R^{102}$ and $R^{103}$ may bond together to form a ring with the sulfur atom to which they are attached.

Suitable examples of the cation moiety in the sulfonium salt having formula (1-1) are as exemplified above as the cation moiety in the recurring unit (a1). Suitable examples of the cation moiety in the iodonium salt having formula (1-2) are as exemplified above as the cation moiety in the recurring unit (a2).

In formulae (1-1) and (1-2), $X^-$ is an anion of the following formula (1A), (1B), (1C) or (1D).

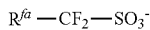
(1A)

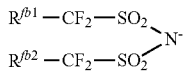
(1B)

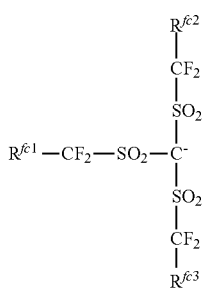
(1C)

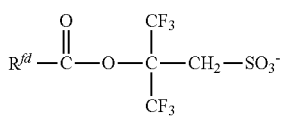
(1D)

In formula (1A), $R^{fa}$ is fluorine or a $C_1$-$C_{40}$ straight, branched or cyclic monovalent hydrocarbon group which may contain a heteroatom.

Of the anions of formula (1A), an anion having the formula (1A') is preferred.

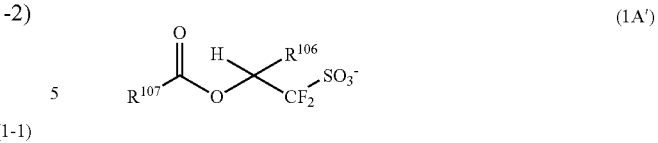
(1A')

In formula (1A'), $R^{106}$ is hydrogen or trifluoromethyl, preferably trifluoromethyl. $R^{107}$ is a $C_1$-$C_{38}$ straight, branched or cyclic monovalent hydrocarbon group which may contain a heteroatom. As the heteroatom, oxygen, nitrogen, sulfur and halogen atoms are preferred, with oxygen being most preferred. Of the monovalent hydrocarbon groups represented by $R^{107}$, those groups of 6 to 30 carbon atoms are preferred from the aspect of achieving a high resolution in forming patterns of fine feature size. Suitable monovalent hydrocarbon groups include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. In these groups, one or more hydrogen atoms may be substituted by a moiety containing a heteroatom such as oxygen, sulfur, nitrogen or halogen, or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion of formula (1A) are shown below, but not limited thereto.

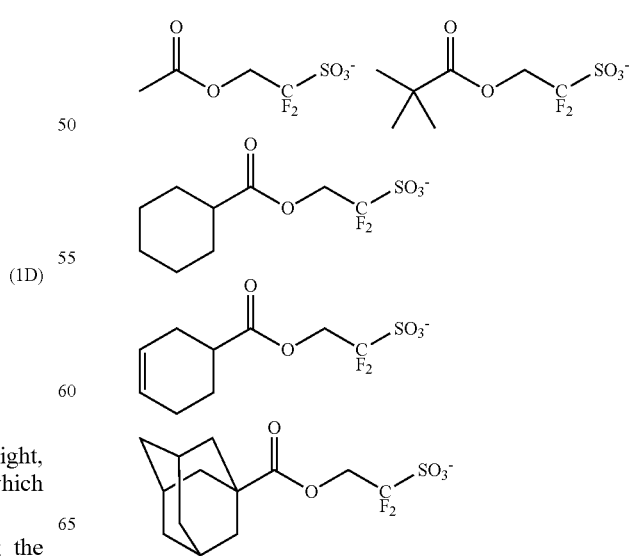

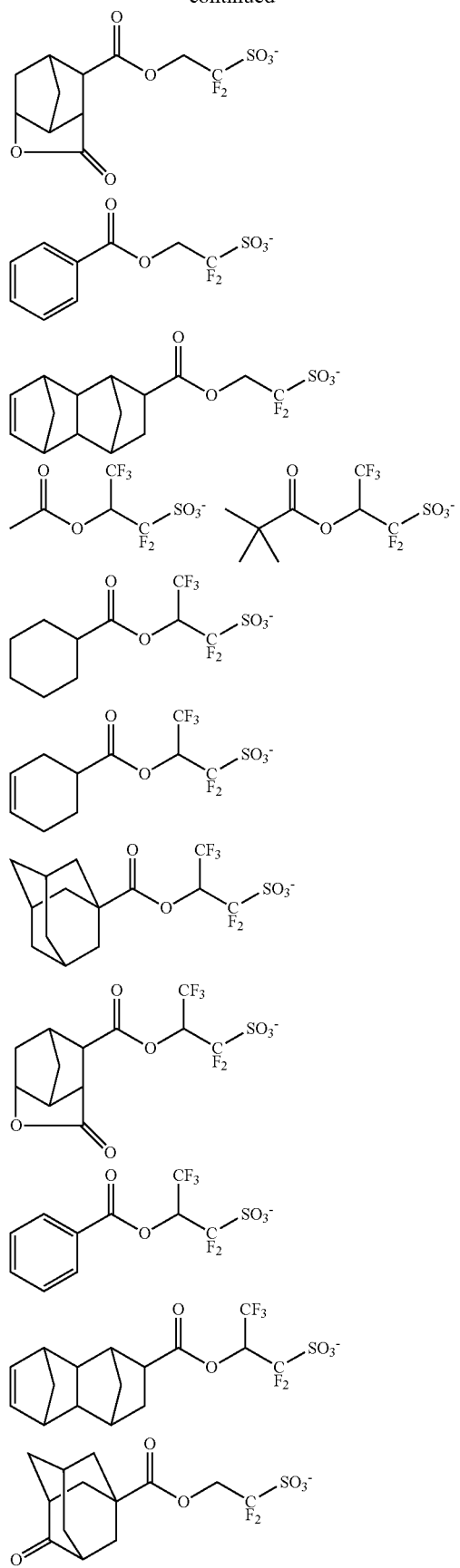
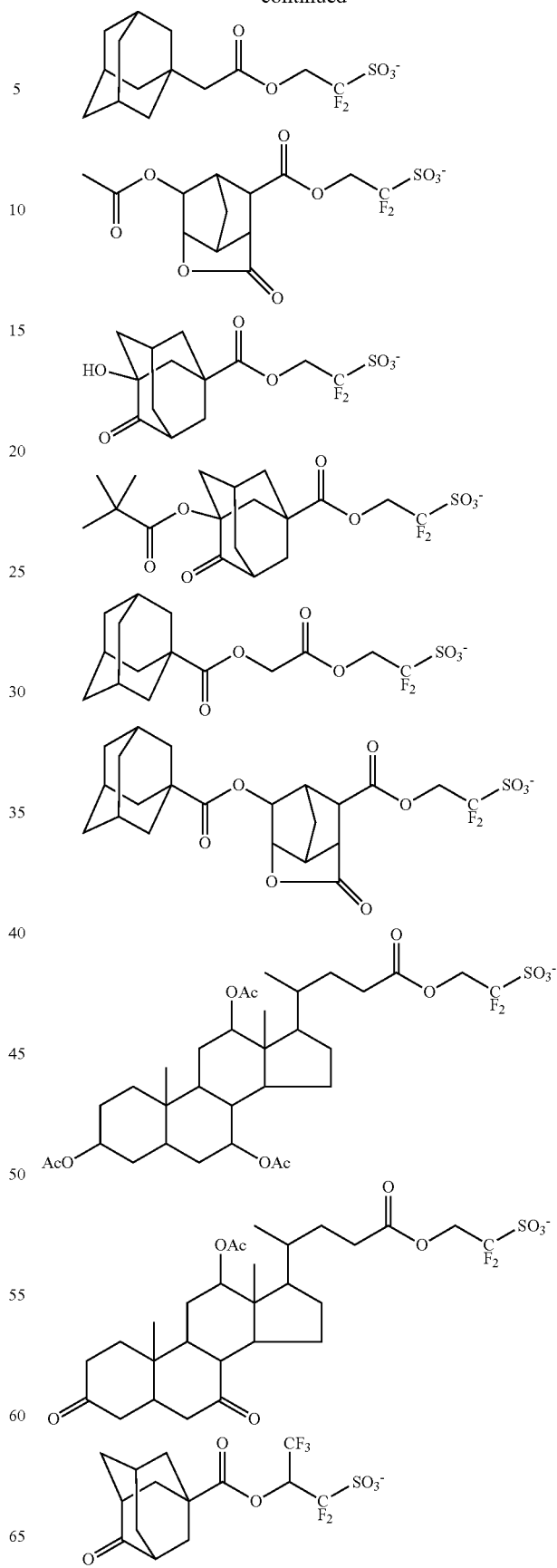

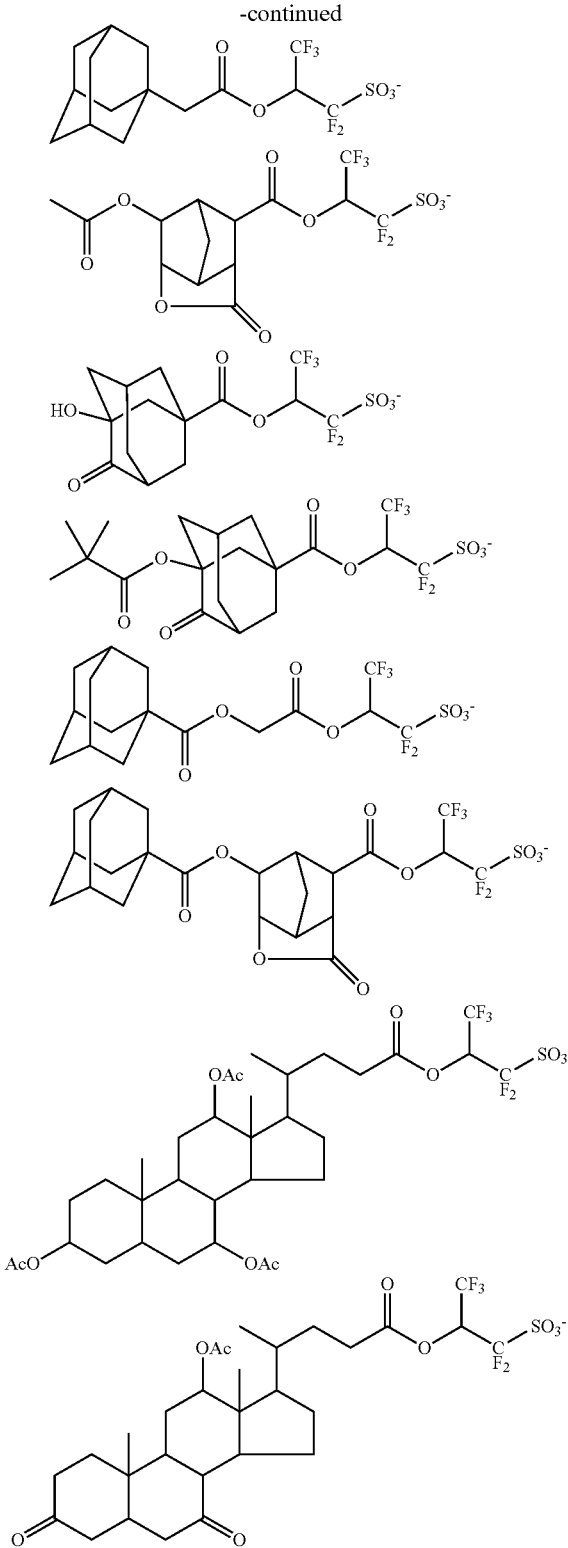

In formula (1B), $R^{fb1}$ and $R^{fb2}$ are each independently fluorine or a $C_1$-$C_{40}$ straight, branched or cyclic monovalent hydrocarbon group which may contain a heteroatom. Illustrative examples of the monovalent hydrocarbon group are as exemplified for $R^{107}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—$N^-$—$SO_2$—$CF_2$— to which they are attached. The preferred ring-forming structure of $R^{fb1}$ and $R^{fb2}$ taken together is a fluorinated ethylene or fluorinated propylene group.

In formula (1C), $R^{fc1}$, $R^{fc2}$ and $R^{fc3}$ are each independently fluorine or a $C_1$-$C_{40}$ straight, branched or cyclic monovalent hydrocarbon group which may contain a heteroatom. Illustrative examples of the monovalent hydrocarbon group are as exemplified for $R^{107}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. The preferred ring-forming structure of $R^{fc1}$ and $R^{fc2}$ taken together is a fluorinated ethylene or fluorinated propylene group.

In formula (1D), $R^{fd}$ is a $C_1$-$C_{40}$ straight, branched or cyclic monovalent hydrocarbon group which may contain a heteroatom. Illustrative examples of the monovalent hydrocarbon group are as exemplified for $R^{107}$.

With respect to the synthesis of the sulfonium salt having an anion of formula (1D), reference may be made to JP-A 2010-215608 and JP-A 2014-133723.

Examples of the anion of formula (1D) are shown below, but not limited thereto.

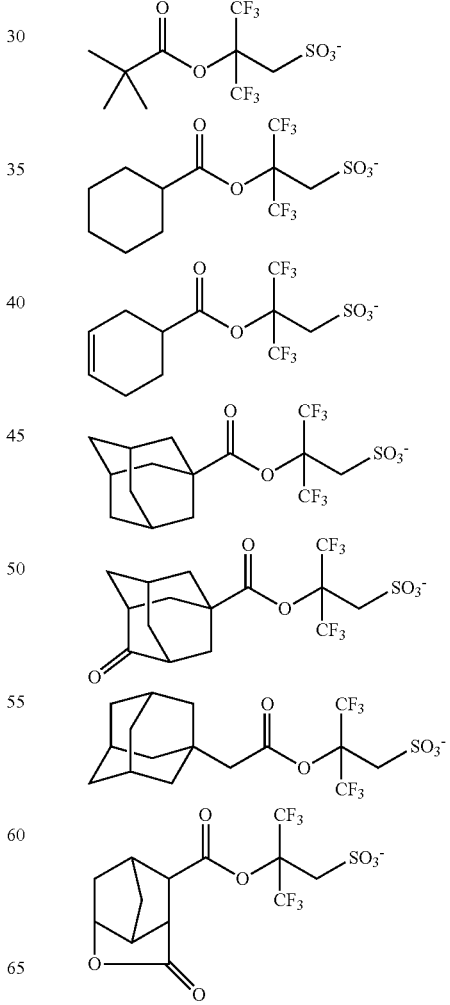

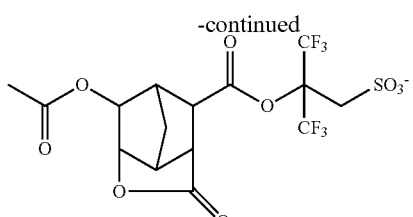

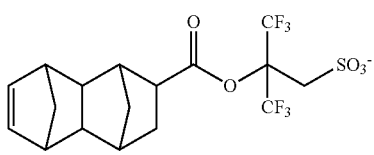

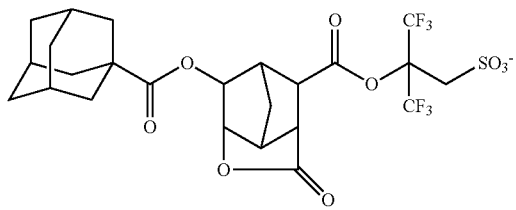

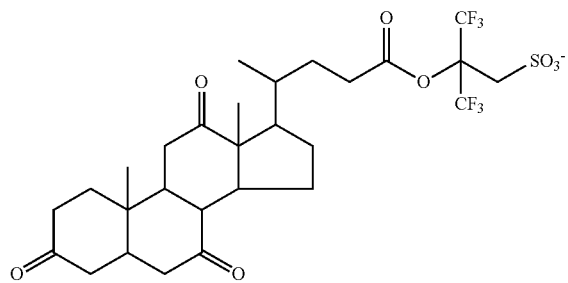

Notably, the compound having the anion of formula (1D) does not have fluorine at the α-position relative to the sulfo group, but two trifluoromethyl groups at the β-position. For this reason, it has a sufficient acidity to sever the acid labile groups in the resist polymer. Thus the compound is an effective PAG.

Another preferred PAG is a compound having the formula (2).

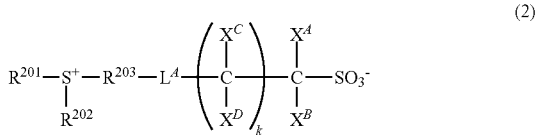

In formula (2), $R^{201}$ and $R^{202}$ are each independently a $C_1$-$C_{30}$ straight, branched or cyclic monovalent hydrocarbon group which may contain a heteroatom. $R^{203}$ is a $C_1$-$C_{30}$ straight, branched or cyclic divalent hydrocarbon group which may contain a heteroatom.

Any two of $R^{201}$, $R^{202}$ and $R^{203}$ may bond together to form a ring with the sulfur atom to which they are attached. $L^A$ is a single bond, ether bond or a $C_1$-$C_{20}$ straight, branched or cyclic divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Examples of the monovalent hydrocarbon group include methyl, ethyl, propyl, isopropyl, n-butyl, s-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.0$^{2,6}$]decanyl, adamantyl, phenyl, naphthyl and anthracenyl. In these groups, one or more hydrogen atoms may be substituted by a heteroatom such as oxygen, sulfur, nitrogen or halogen, or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

Suitable divalent hydrocarbon groups include straight alkane-diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic divalent hydrocarbon groups such as cyclopentanediyl, cyclohexanediyl, norbornanediyl and adamantanediyl; and unsaturated cyclic divalent hydrocarbon groups such as phenylene and naphthylene. In these groups, one or more hydrogen atoms may be substituted by an alkyl moiety such as methyl, ethyl, propyl, n-butyl or t-butyl; one or more hydrogen atoms may be substituted by a moiety containing a heteroatom such as oxygen, sulfur, nitrogen or halogen; or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety. Of the heteroatoms, oxygen is preferred.

Of the PAGs having formula (2), those having formula (2') are preferred.

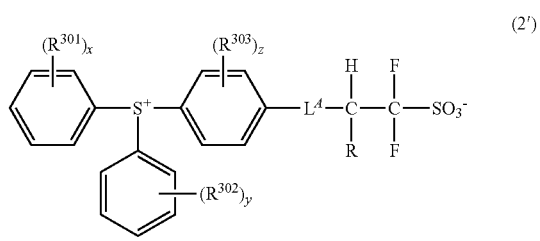

In formula (2'), $L^A$ is as defined above. R is hydrogen or trifluoromethyl, preferably trifluoromethyl. $R^{301}$, $R^{302}$ and $R^{303}$ are each independently hydrogen or a $C_1$-$C_{20}$ straight, branched or cyclic monovalent hydrocarbon group which may contain a heteroatom. Suitable monovalent hydrocarbon groups are as described above for $R^{107}$. The subscripts x and y are each independently an integer of 0 to 5, and z is an integer of 0 to 4.

Examples of the PAG having formula (2) are shown below, but not limited thereto. Notably, R is as defined above.

-continued
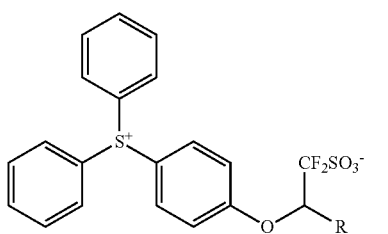
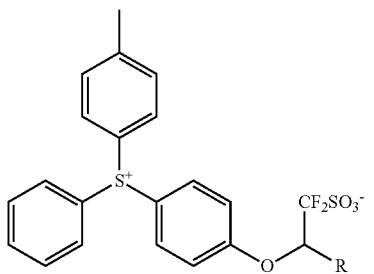
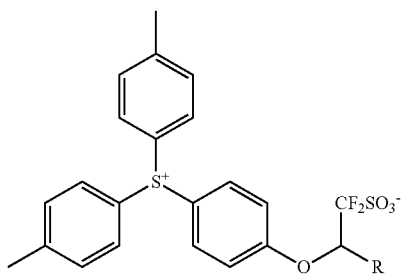
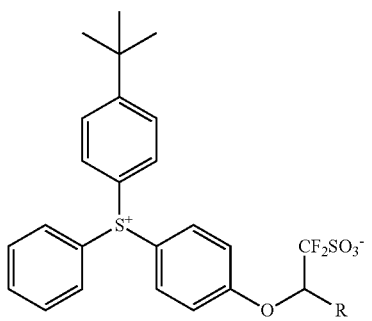
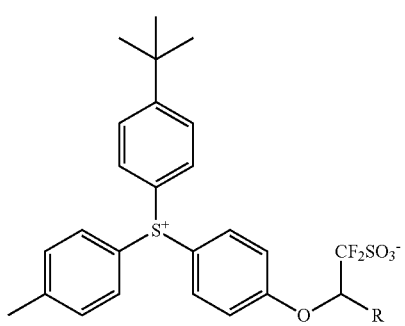
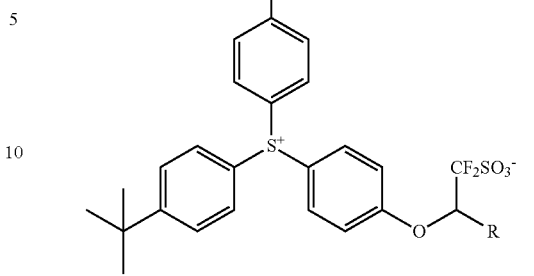
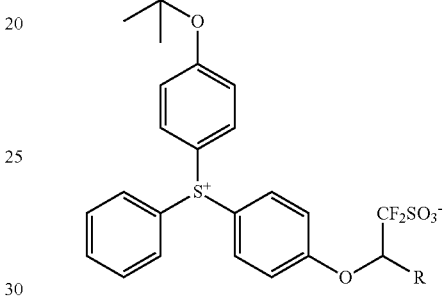
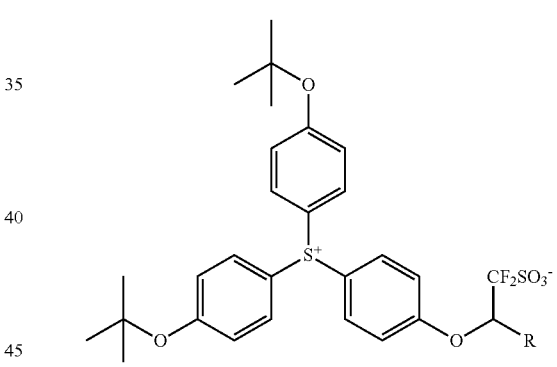
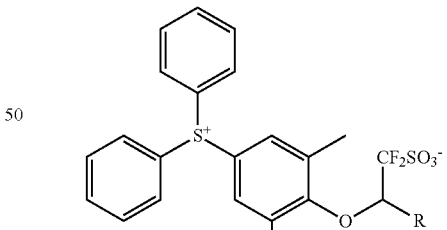
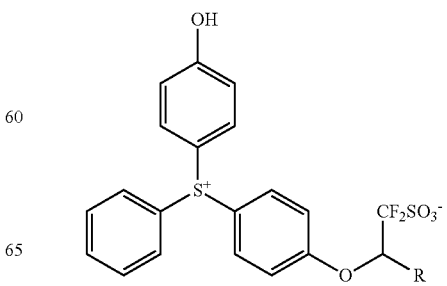

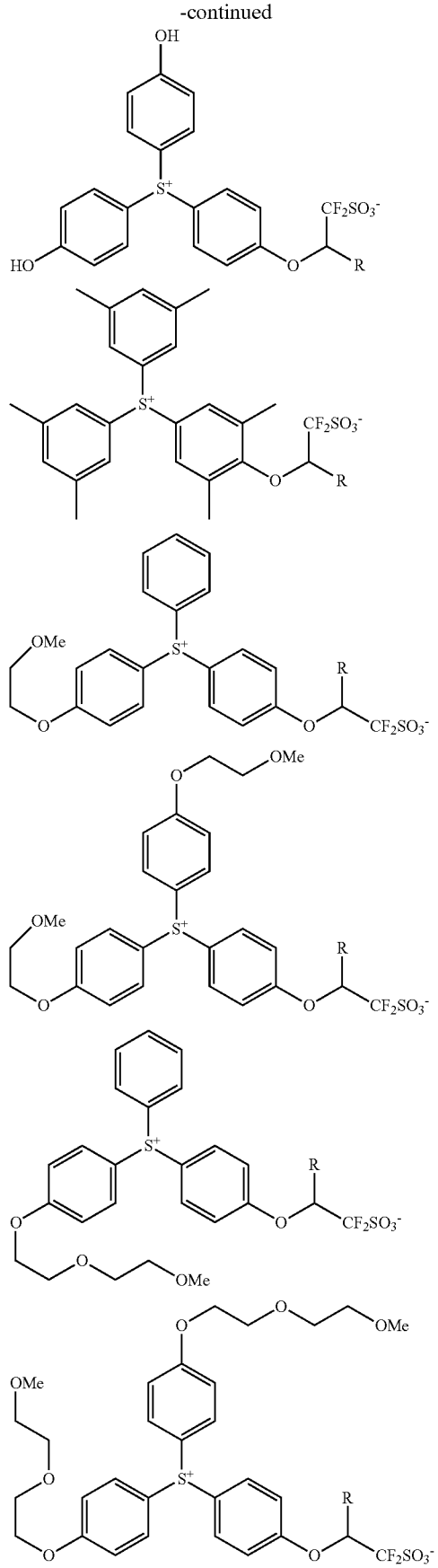
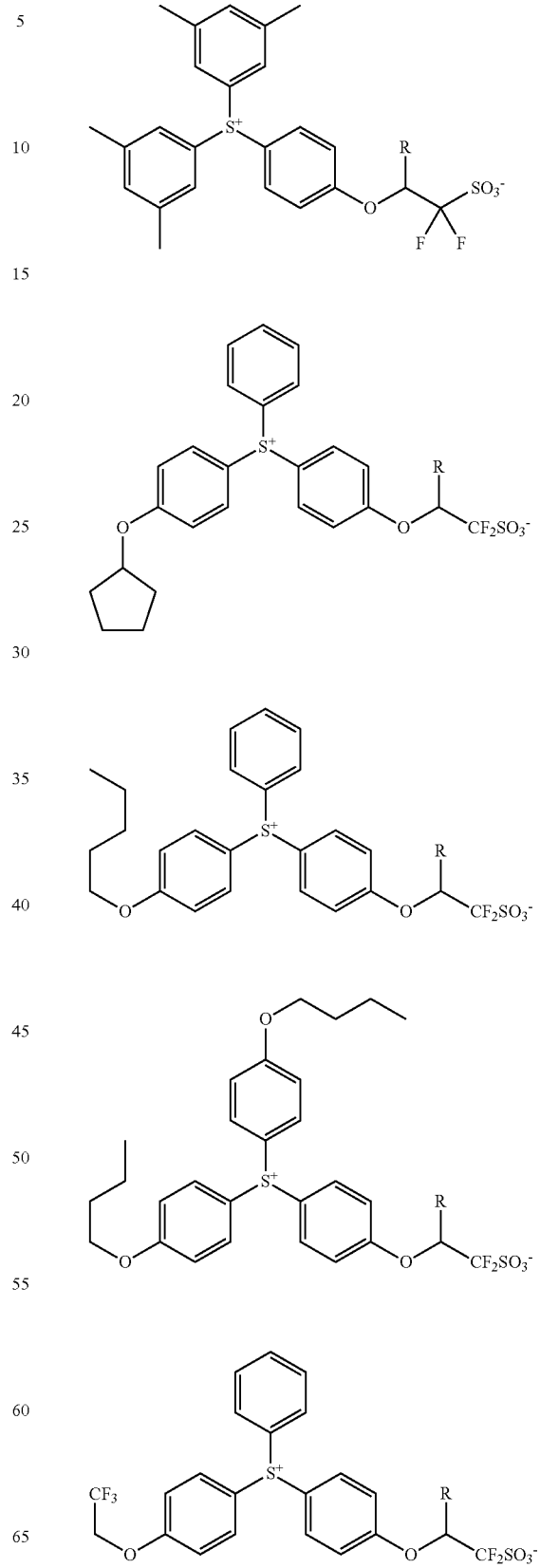

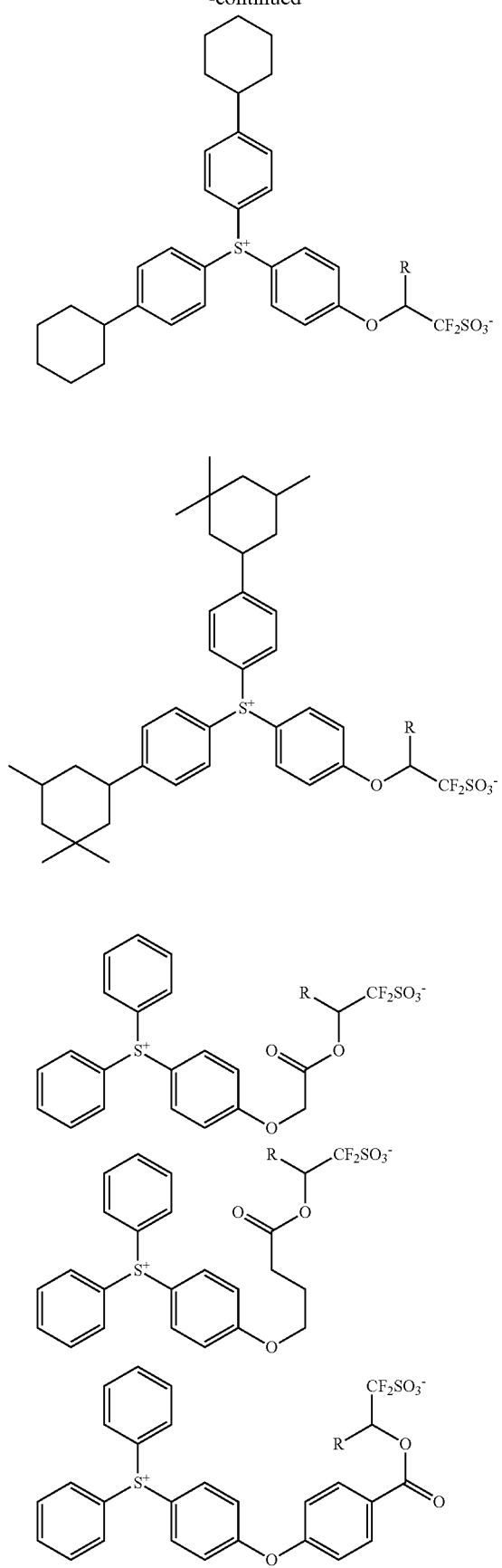
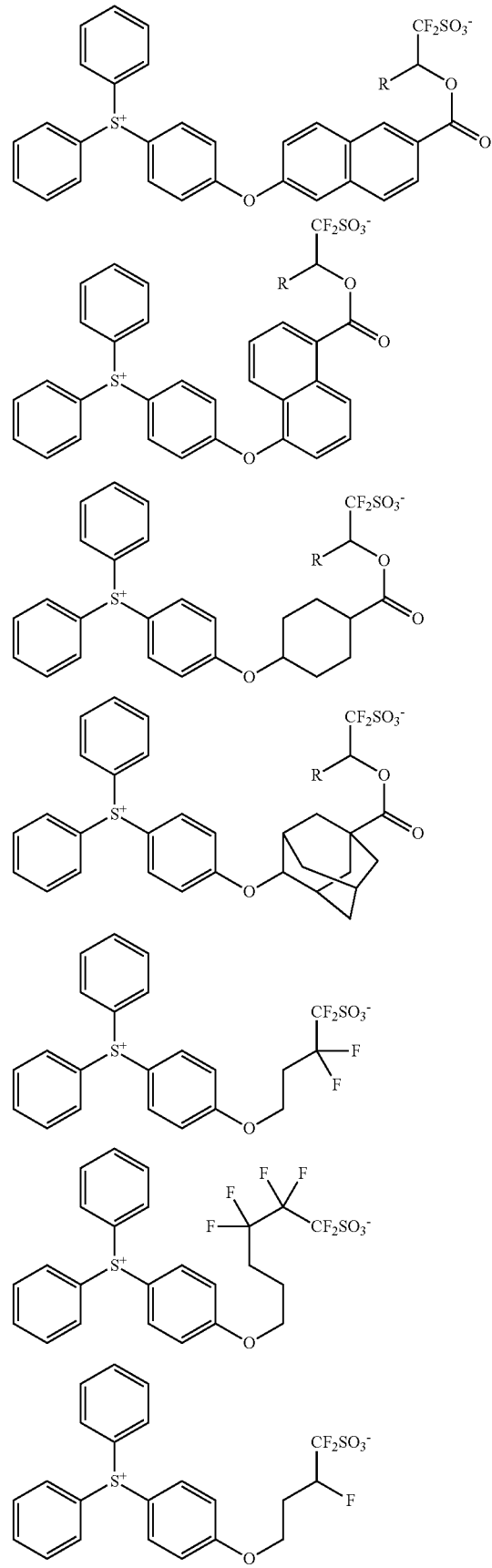

-continued

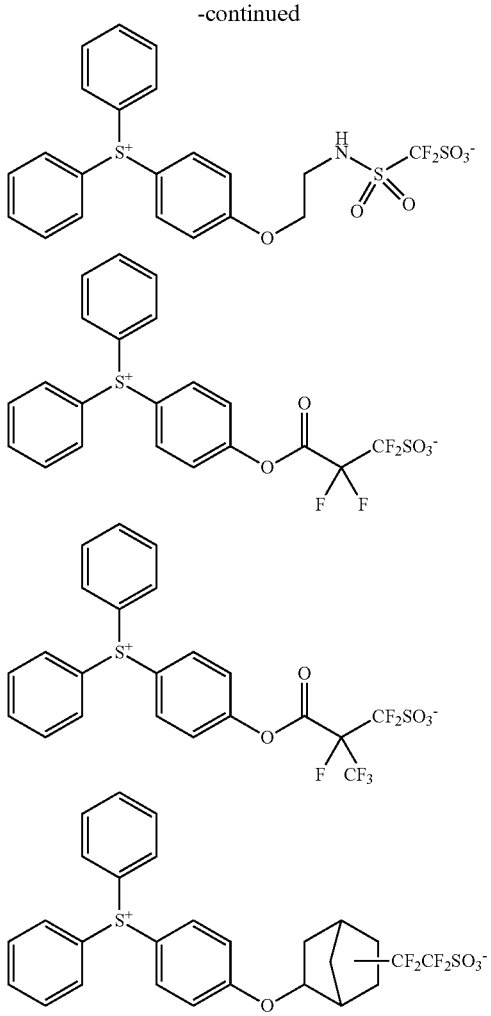

Of the foregoing PAGs, those having an anion of formula (1A') or (1D) are especially preferred because of reduced acid diffusion and high solubility in the resist solvent. Also those having an anion of formula (2') are especially preferred because of extremely reduced acid diffusion.

Other useful PAGs are sulfonium and iodonium salts of iodized benzoyloxy-containing fluorinated sulfonic acid having the formulae (3-1) and (3-2), respectively.

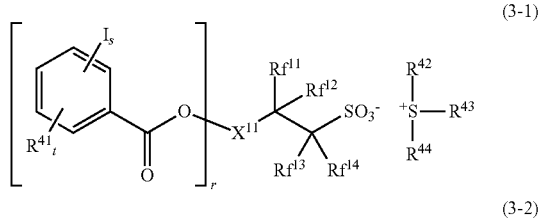
(3-1)

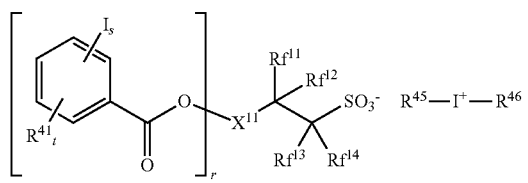
(3-2)

In formulae (3-1) and (3-2), $R^{41}$ is hydrogen, hydroxyl, carboxyl, nitro, cyano, fluorine, chlorine, bromine, amino group, or a straight, branched or cyclic, $C_1$-$C_{20}$ alkyl, $C_1$-$C_{20}$ alkoxy, $C_2$-$C_{20}$ alkoxycarbonyl, $C_2$-$C_{20}$ acyloxy or $C_1$-$C_4$ alkylsulfonyloxy group, which may contain fluorine, chlorine, bromine, hydroxy, amino or alkoxy moiety, or —$NR^{47}$—$C(=O)$—$R^{48}$ or —$NR^{47}$—$C(=O)$—$O$—$R^{48}$, wherein $R^{47}$ is hydrogen, or a straight, branched or cyclic $C_1$-$C_6$ alkyl group which may contain halogen, hydroxy, alkoxy, acyl or acyloxy moiety, $R^{48}$ is a straight, branched or cyclic, $C_1$-$C_{16}$ alkyl or $C_2$-$C_{16}$ alkenyl group, or $C_6$-$C_{12}$ aryl group, which may contain halogen, hydroxy, alkoxy, acyl or acyloxy moiety. $X^{11}$ is a single bond or a $C_1$-$C_{20}$ divalent linking group when r=1, or a $C_1$-$C_{20}$ tri- or tetravalent linking group when r=2 or 3, the linking group optionally containing an oxygen, sulfur or nitrogen atom. $Rf^{11}$ to $Rf^{14}$ are each independently hydrogen, fluorine or trifluoromethyl, at least one of $Rf^{11}$ to $Rf^{14}$ being fluorine or trifluoromethyl, or $Rf^{11}$ and $Rf^{12}$, taken together, may form a carbonyl group. $R^{42}$, $R^{43}$, $R^{44}$, $R^{45}$ and $R^{46}$ are each independently a $C_1$-$C_{12}$ straight, branched or cyclic alkyl group, $C_2$-$C_{12}$ straight, branched or cyclic alkenyl group, $C_2$-$C_{12}$ straight, branched or cyclic alkynyl group, $C_6$-$C_{20}$ aryl group, $C_7$-$C_{12}$ aralkyl group or $C_7$-$C_{12}$ aryloxyalkyl group, in which at least one hydrogen (one or more or even all hydrogen atoms) may be substituted by a hydroxyl, carboxyl, halogen, cyano, oxo, amide, nitro, sultone, sulfone or sulfonium salt-containing moiety, or in which at least one carbon atom may be substituted by an ether, ester, carbonyl, carbonate or sulfonic acid ester moiety, or $R^{42}$ and $R^{43}$ may bond together to form a ring with the sulfur atom to which they are attached, r is an integer of 1 to 3, s is an integer of 1 to 5, and t is an integer of 0 to 3.

Further useful PAGs are sulfonium and iodonium salts of iodized benzene-containing fluorinated sulfonic acid having the formulae (3-3) and (3-4), respectively.

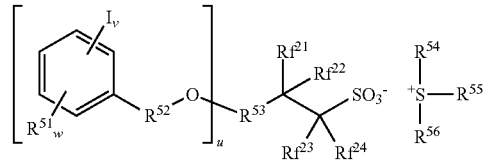
(3-3)

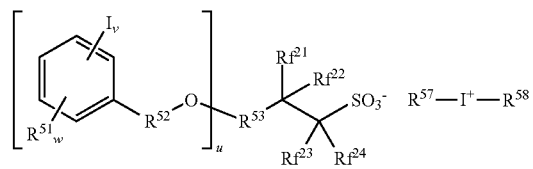
(3-4)

In formulae (3-3) and (3-4), $R^{51}$ is each independently a hydroxyl, $C_1$-$C_{20}$ straight, branched or cyclic alkyl or alkoxy group, $C_2$-$C_{20}$ straight, branched or cyclic acyl or acyloxy group, fluorine, chlorine, bromine, amino, or alkoxycarbonyl-substituted amino group. $R^{52}$ is each independently a single bond or alkylene group. $R^{53}$ is a single bond or $C_1$-$C_{20}$ divalent linking group when u=1, or a $C_1$-$C_{20}$ tri- or tetravalent linking group when u=2 or 3, the linking group optionally containing an oxygen, sulfur or nitrogen atom. $Rf^{21}$ to $Rf^{24}$ are each independently hydrogen, fluorine or trifluoromethyl, at least one of $Rf^{21}$ to $Rf^{24}$ being fluorine or trifluoromethyl, or $Rf^{21}$ and $Rf^{22}$, taken together, may form a carbonyl group. $R^{54}$, $R^{55}$, $R^{56}$, $R^{57}$ and $R^{58}$ are each independently a $C_1$-$C_{12}$ straight, branched or cyclic alkyl group, $C_2$-$C_{12}$ straight, branched or cyclic alkenyl group, $C_6$-$C_{20}$ aryl group, $C_7$-$C_{12}$ aralkyl group or $C_7$-$C_{12}$ aryloxyalkyl group, in which at least one hydrogen (one or more or even all hydrogen atoms) may be substituted by a hydroxyl, carboxyl, halogen, cyano, oxo, amide, nitro, sultone, sulfone, or sulfonium salt-containing moiety, or in which at least one carbon atom may be substituted by an ether, ester, carbonyl, carbonate or sulfonic acid ester moiety, or $R^{54}$ and $R^{55}$ may bond together to form a ring with the sulfur atom to which they are attached, u is an integer of 1 to 3, v is an integer of 1 to 5, and w is an integer of 0 to 3.

Suitable examples of the cation moiety in the sulfonium salt having formulae (3-1) and (3-3) are as exemplified above as the cation moiety in the recurring unit (a1). Suitable examples of the cation moiety in the iodonium salt having formulae (3-2) and (3-4) are as exemplified above as the cation moiety in the recurring unit (a2).

Examples of the anion moiety in the onium salts having formulae (3-1) to (3-4) are given below, but not limited thereto.

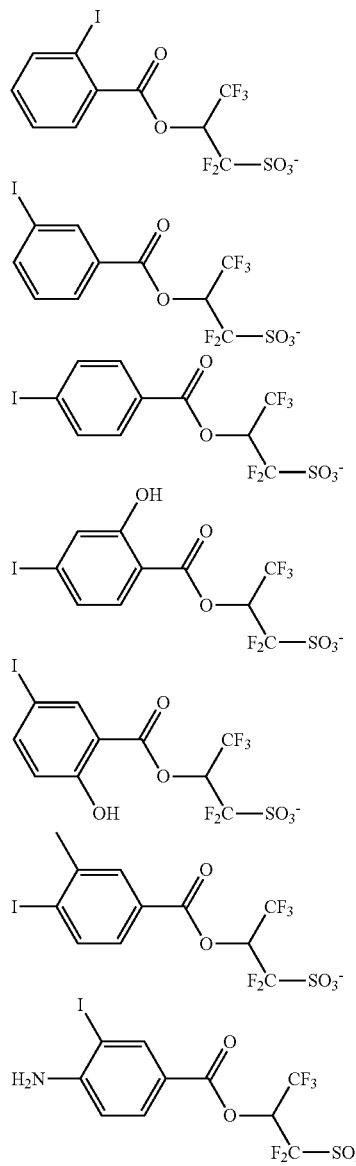

-continued

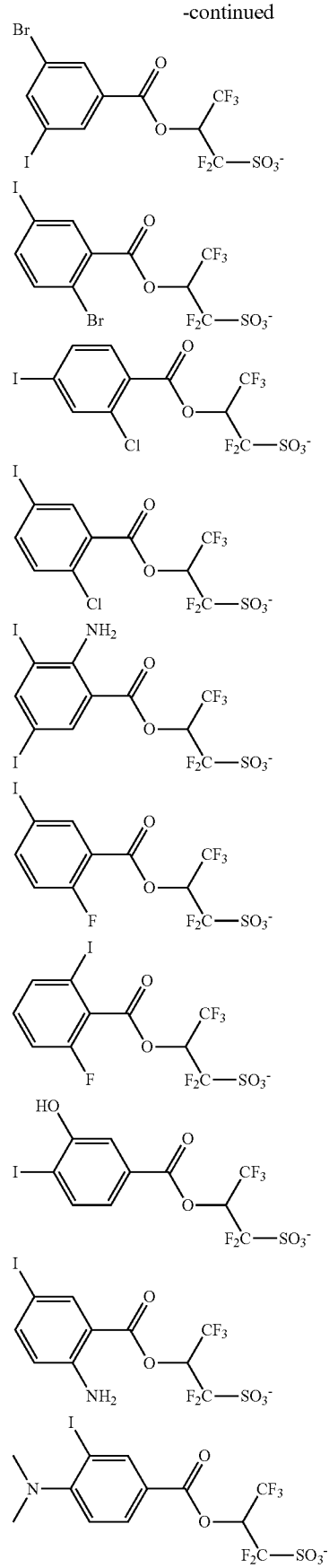

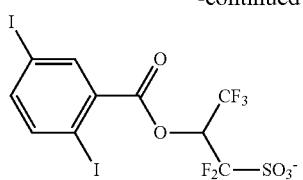
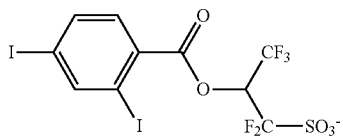
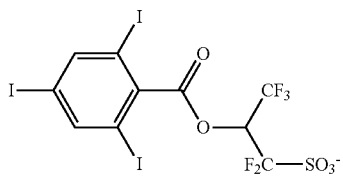
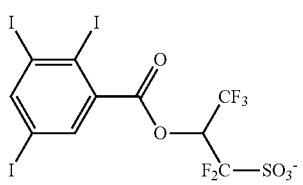
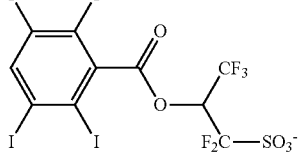
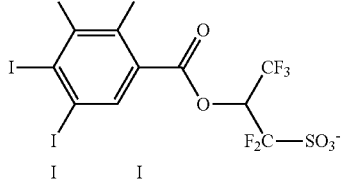
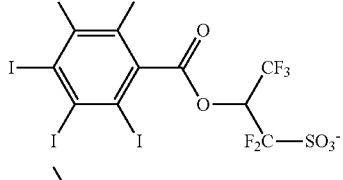
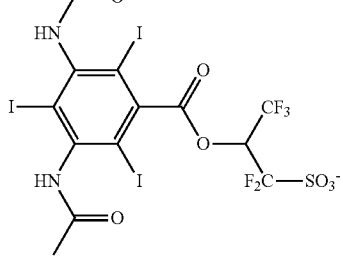
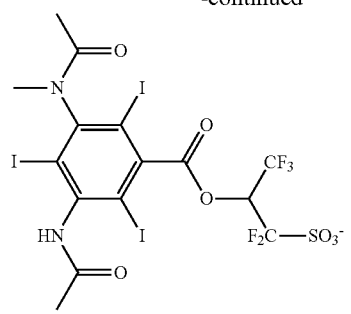
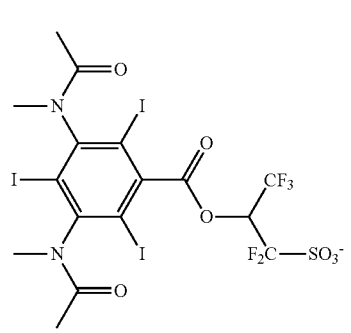
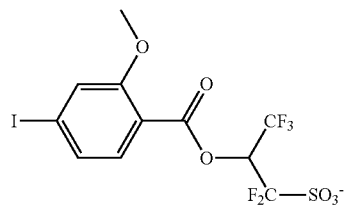
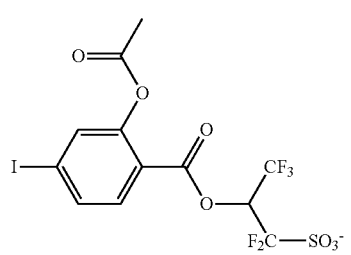
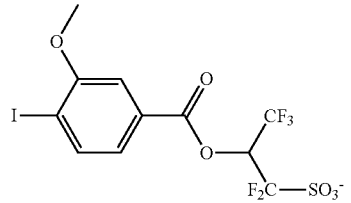
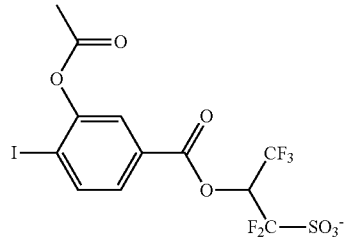

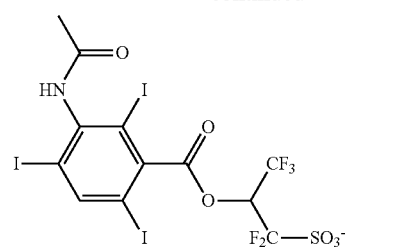
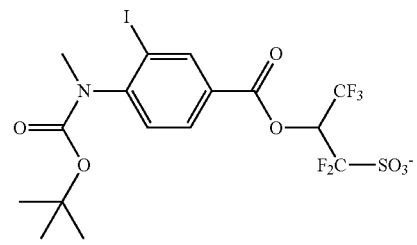
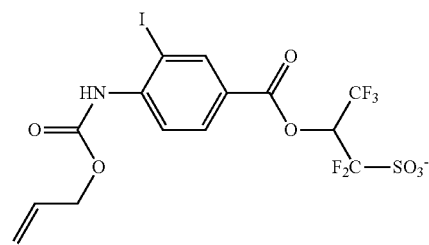
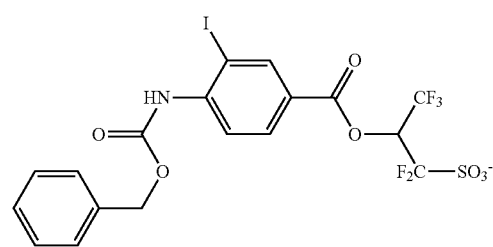
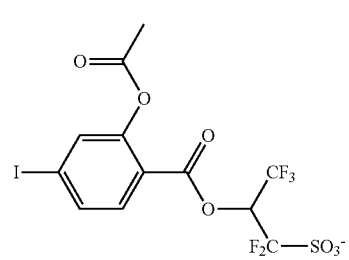
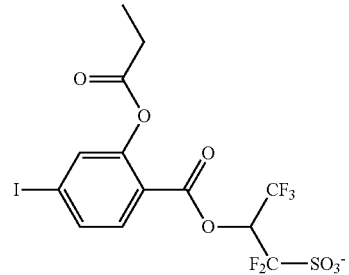
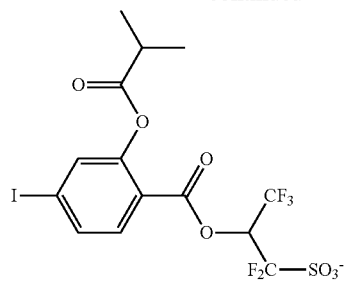
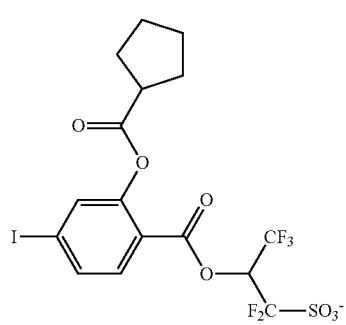
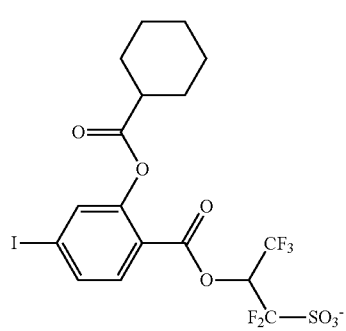
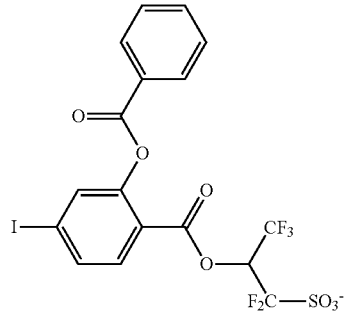
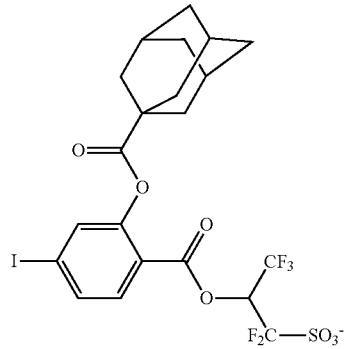

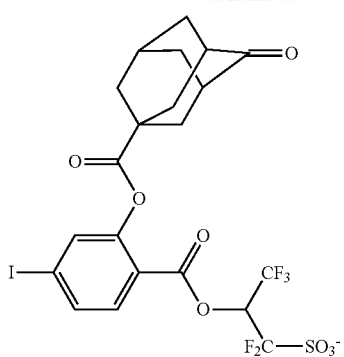
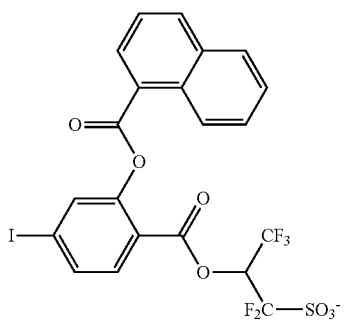
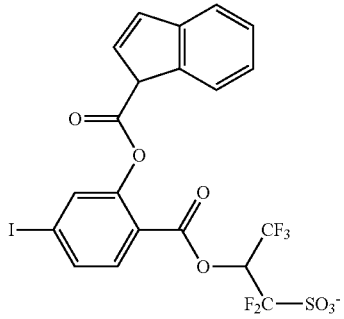
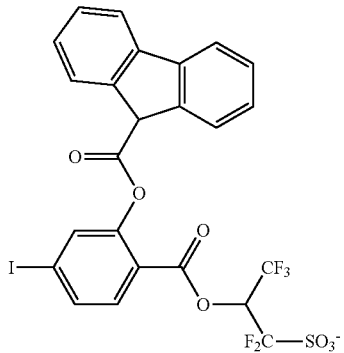
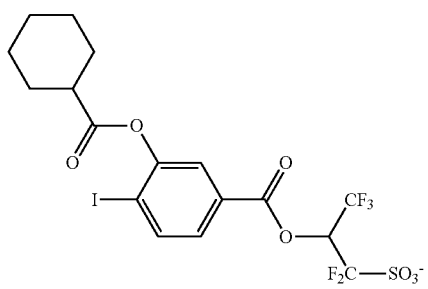
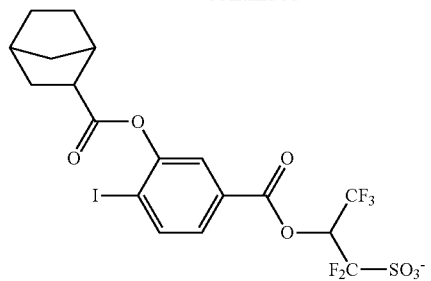
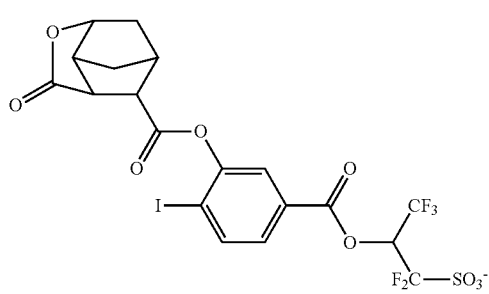
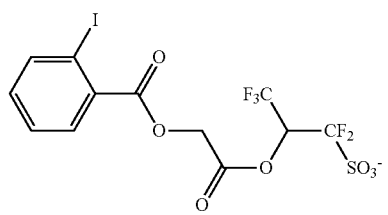
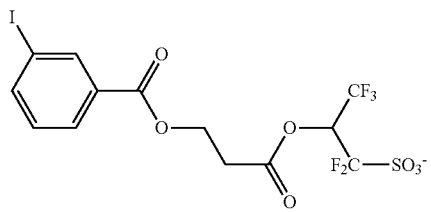
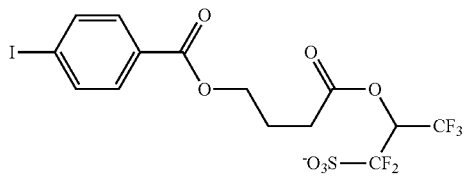
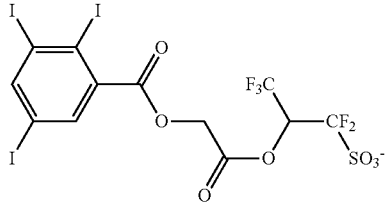
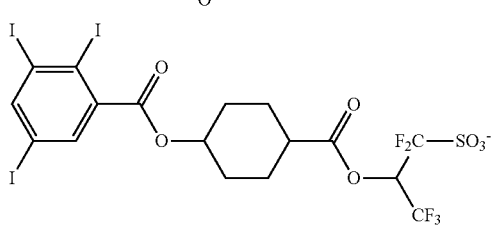

111
-continued
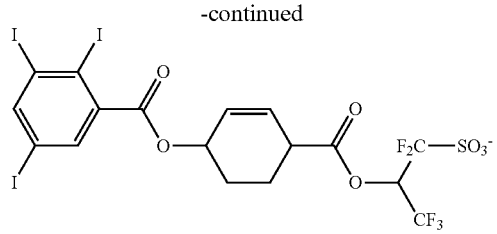
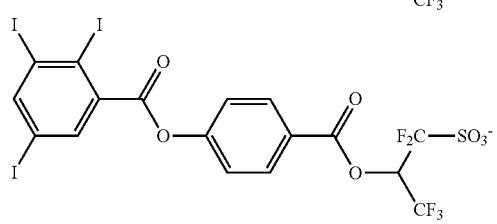
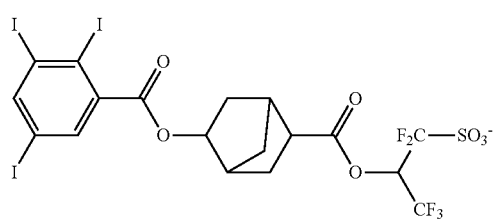
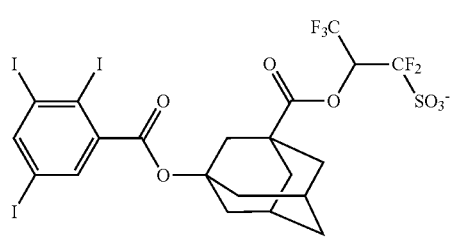
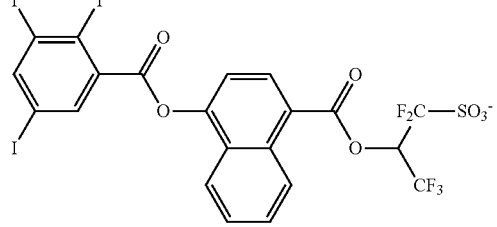
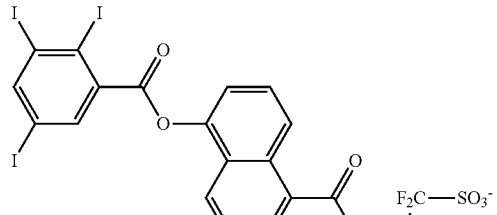
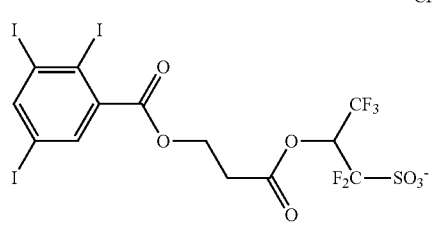
112
-continued
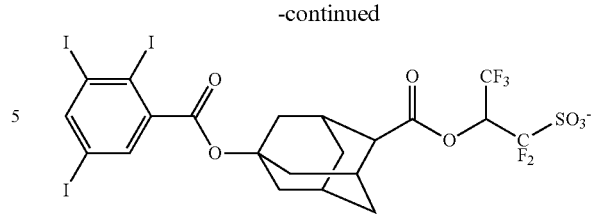
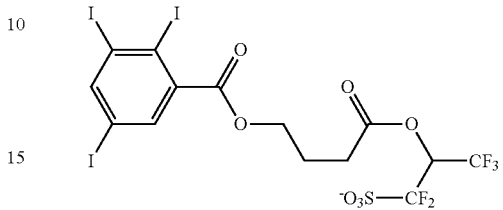
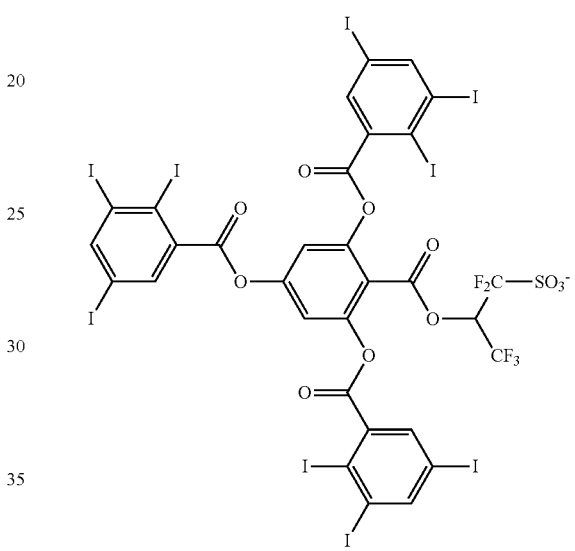
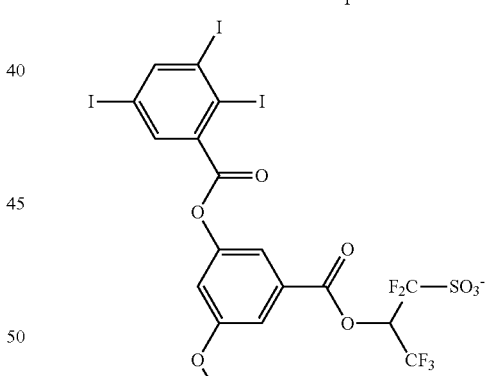
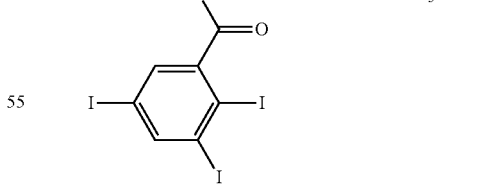
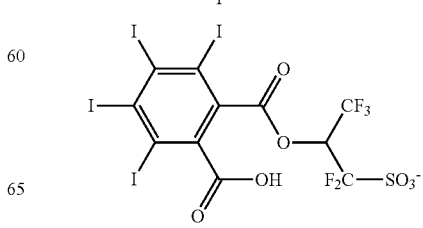

113
-continued
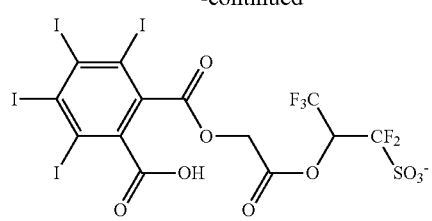
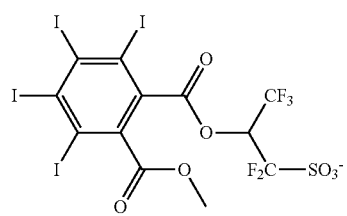
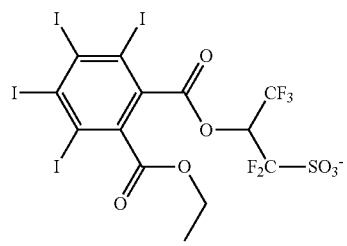
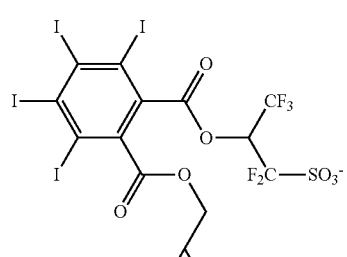
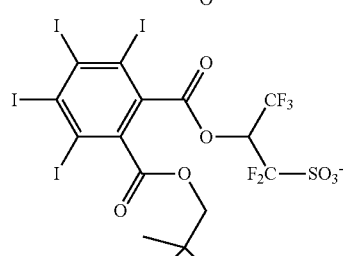
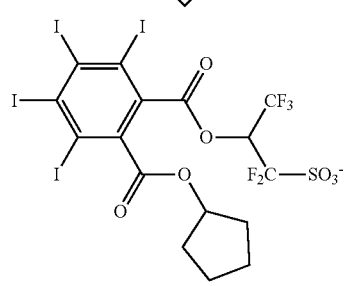
114
-continued
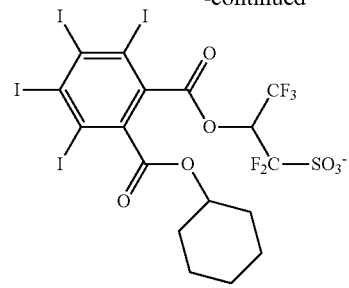
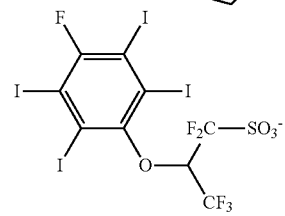
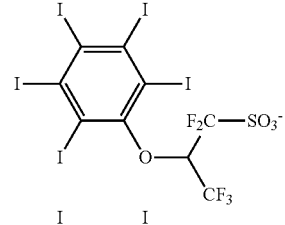
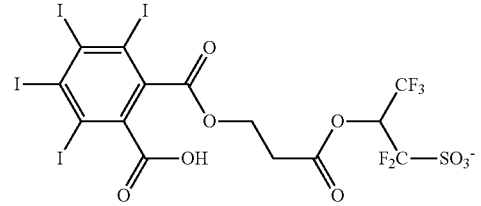
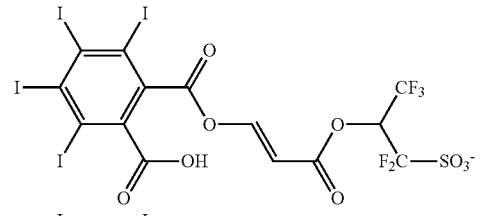
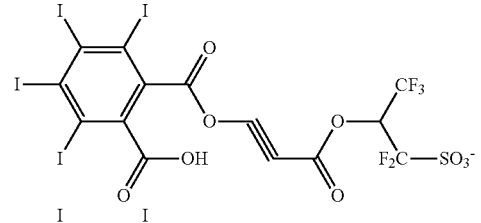
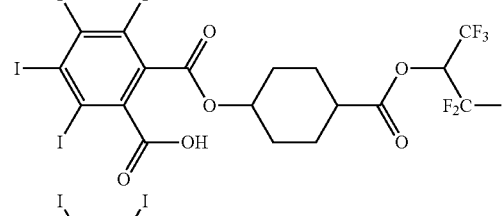
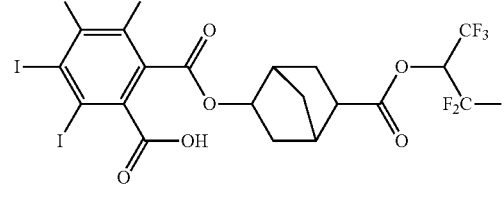

115
-continued
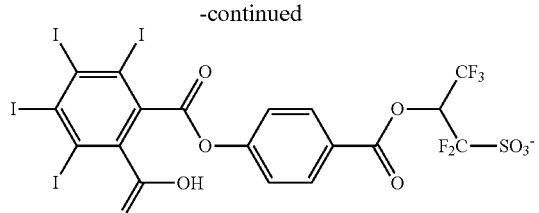
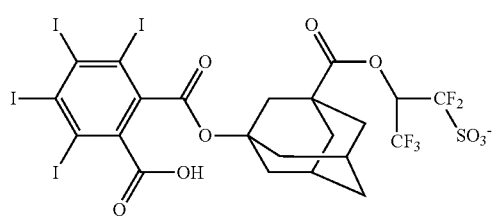
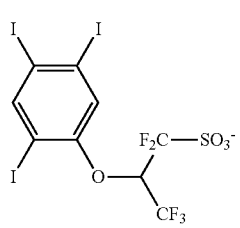
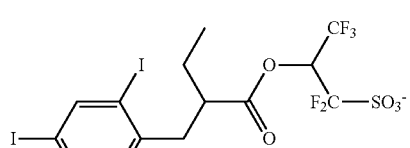
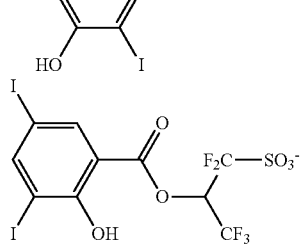
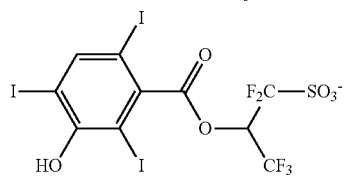
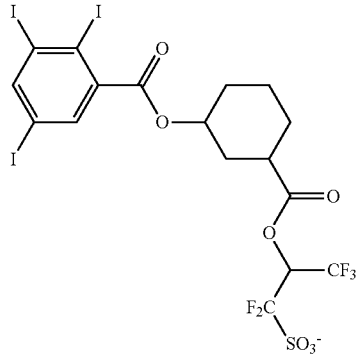
116
-continued
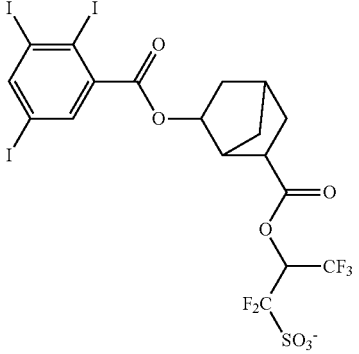
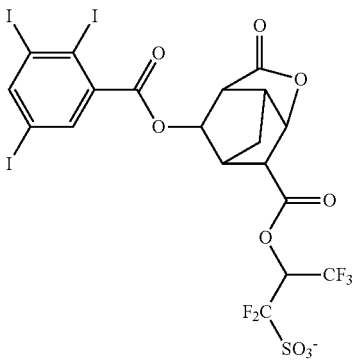
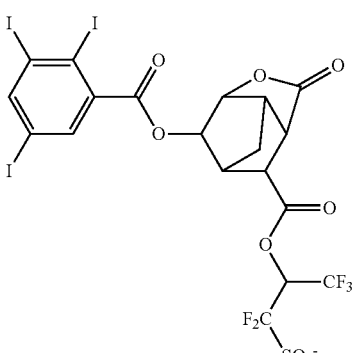
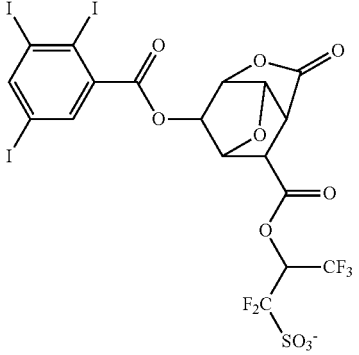

117
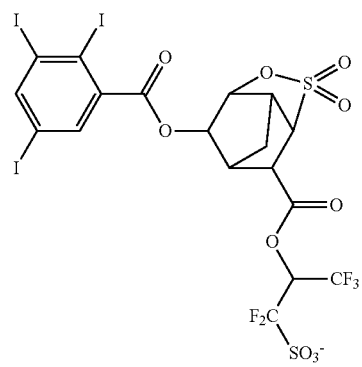
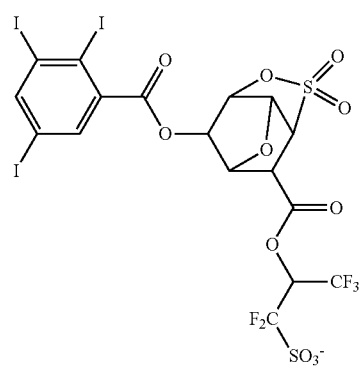
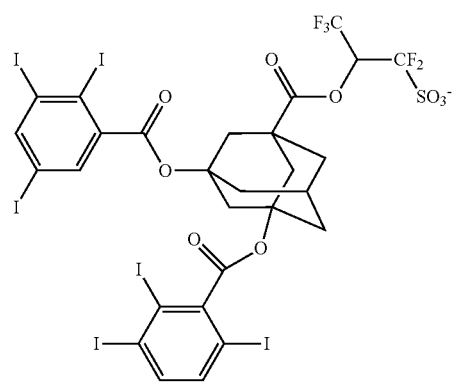
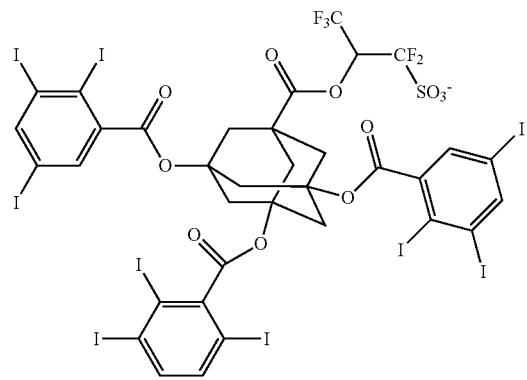
118
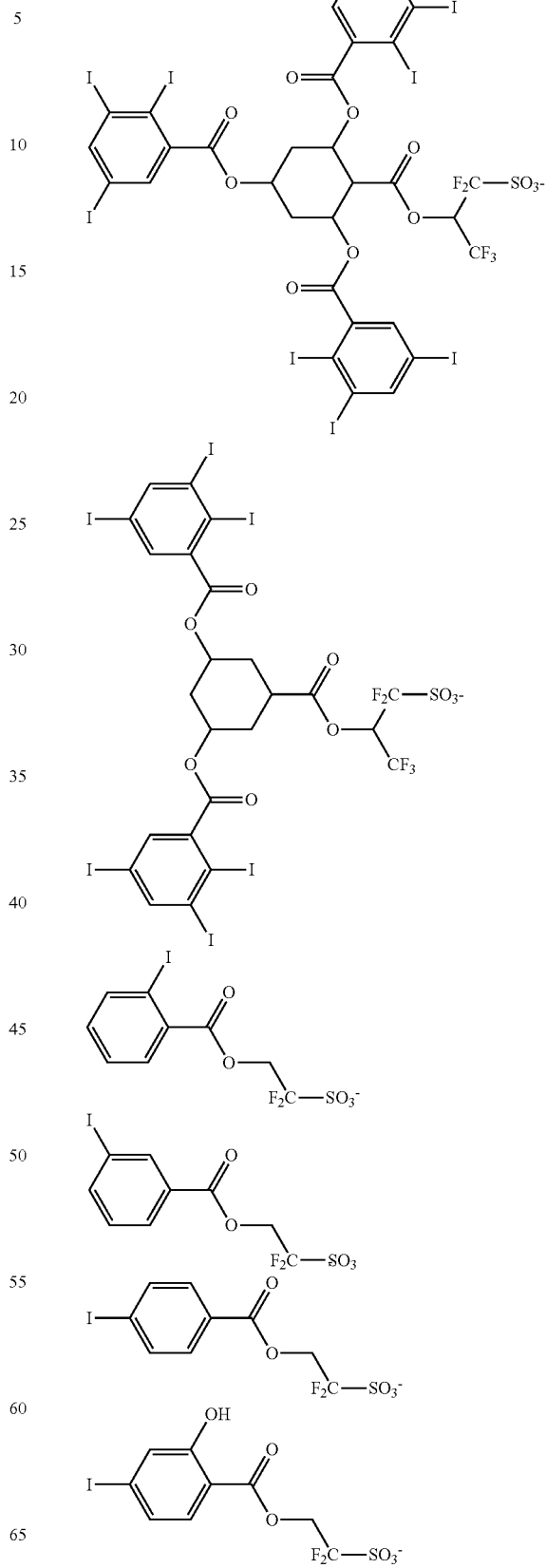

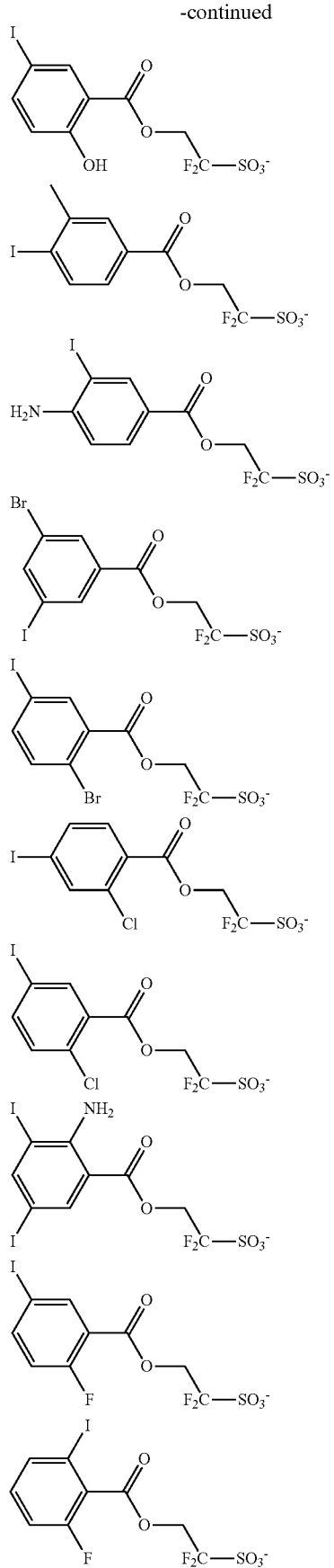
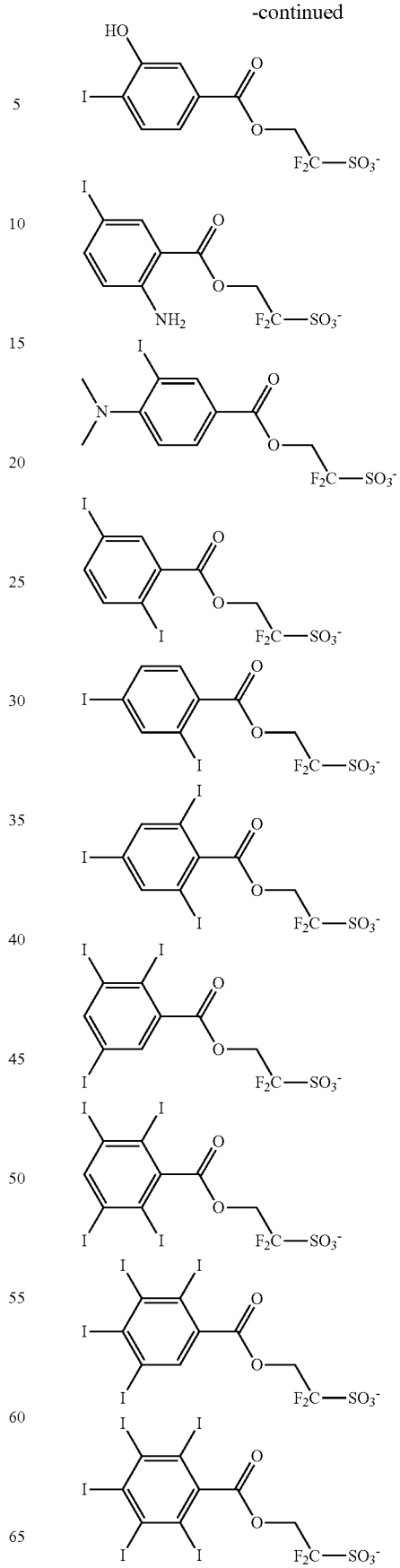

-continued
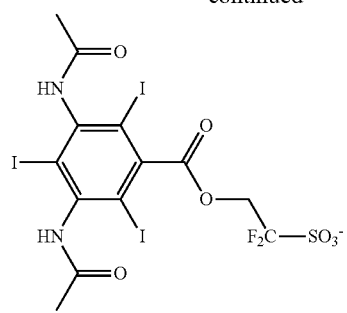
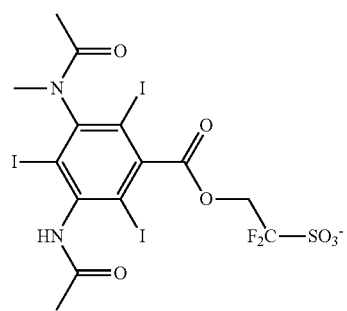
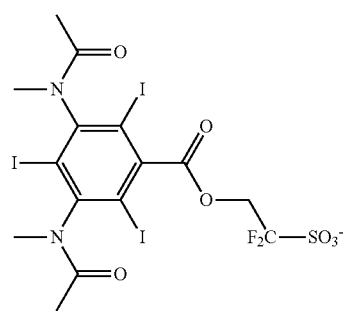
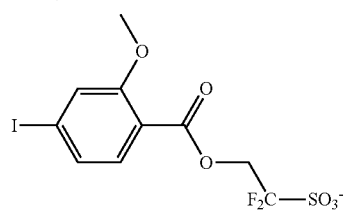
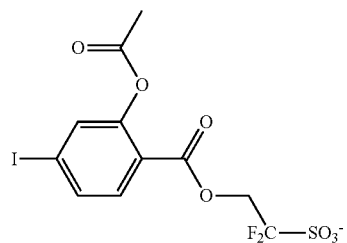
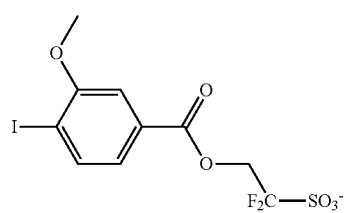
-continued
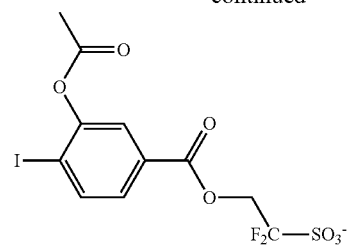
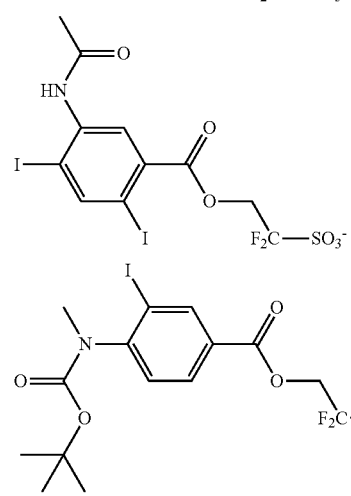
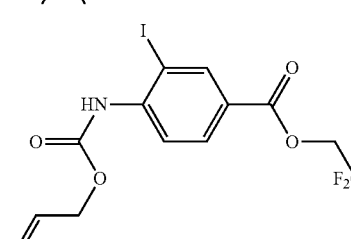
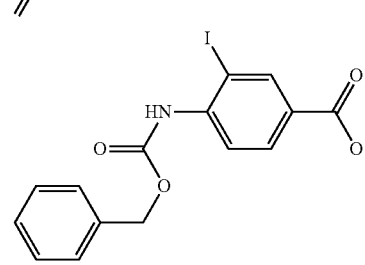
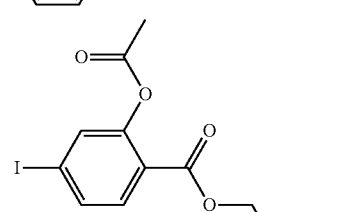
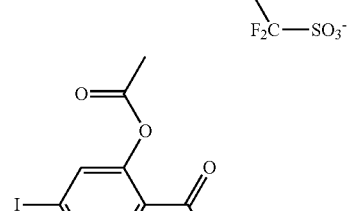
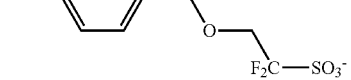

123
-continued
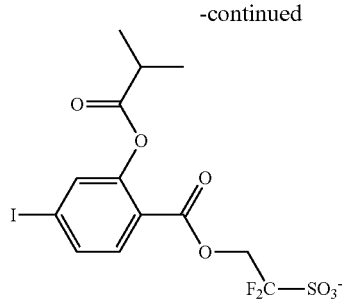
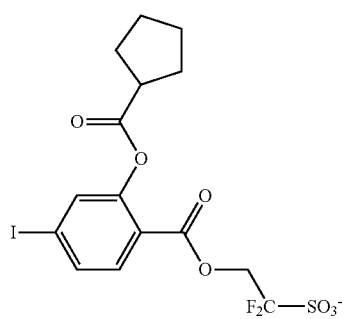
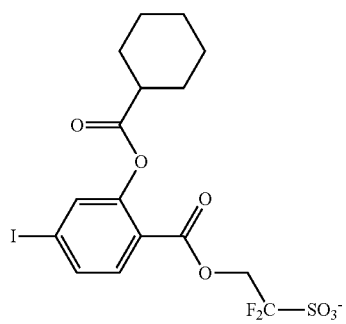
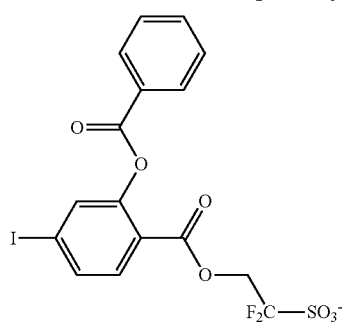
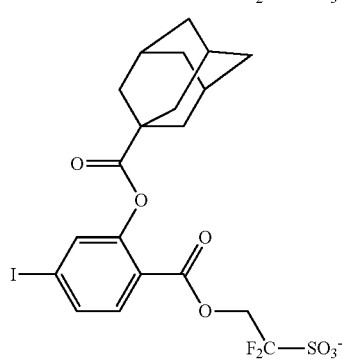
124
-continued
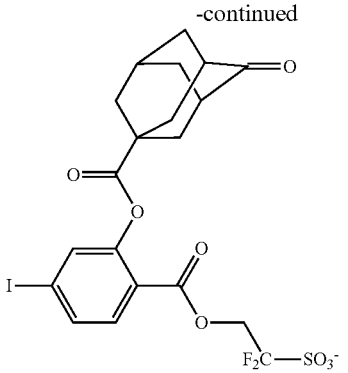
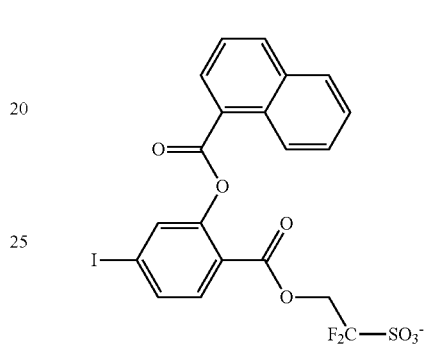
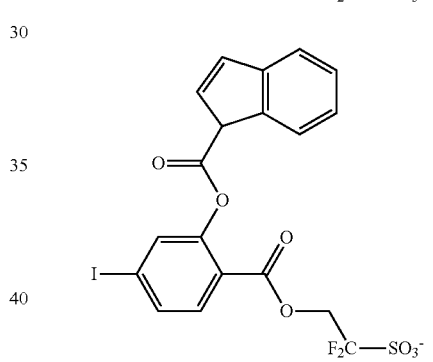
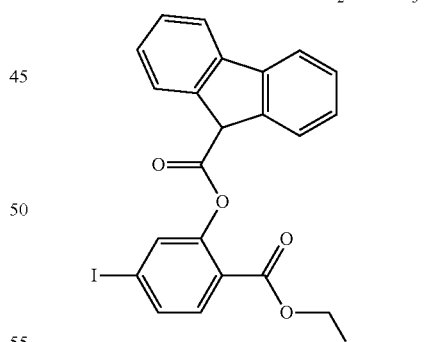
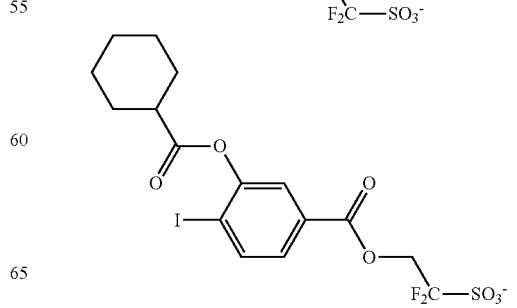

125
-continued
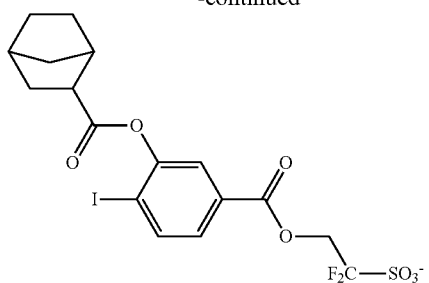
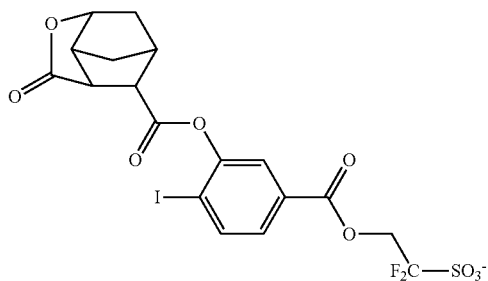
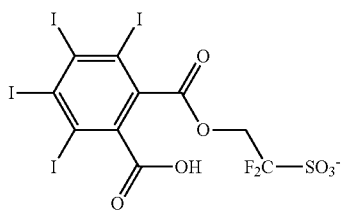
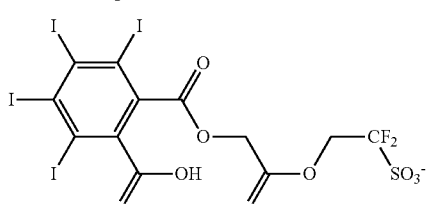
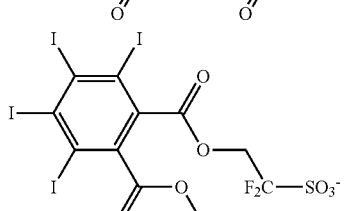
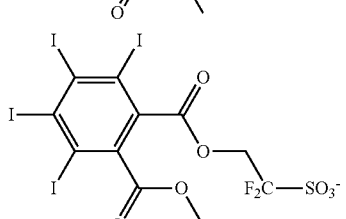
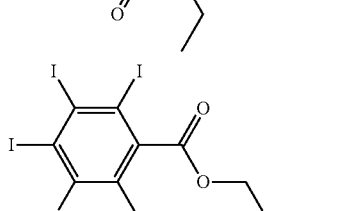
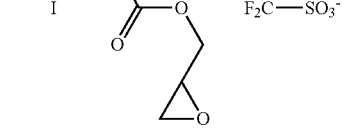
126
-continued
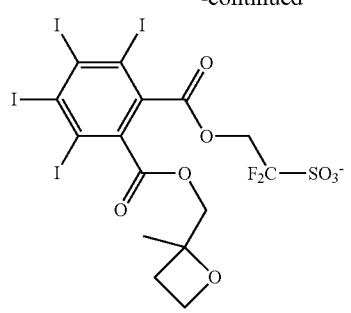
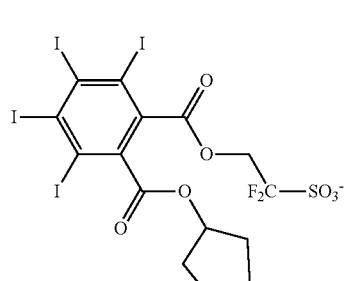
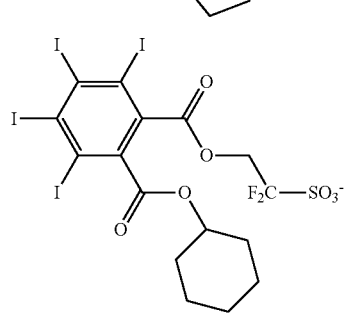
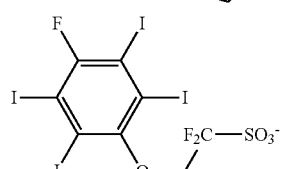
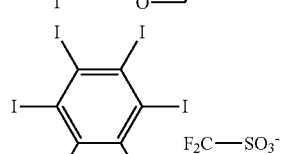
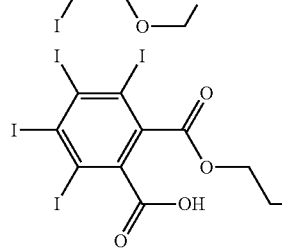
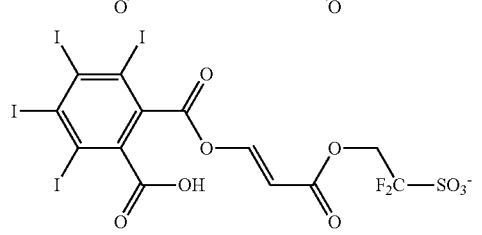

127
-continued
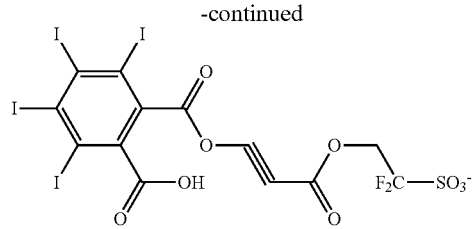
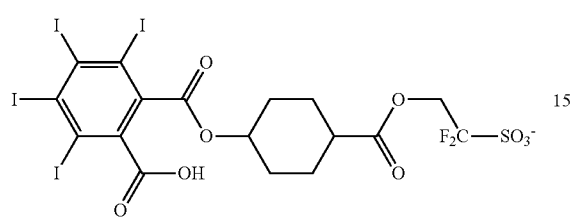
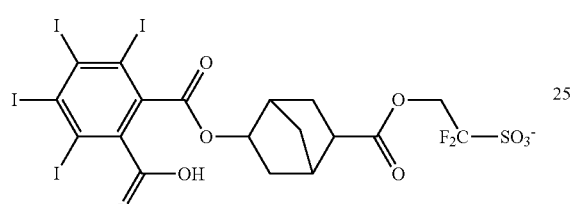
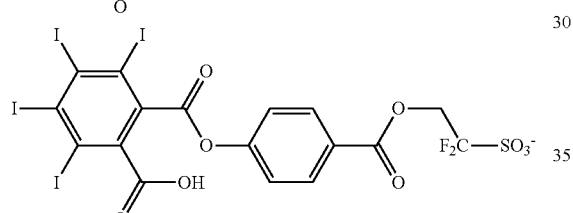
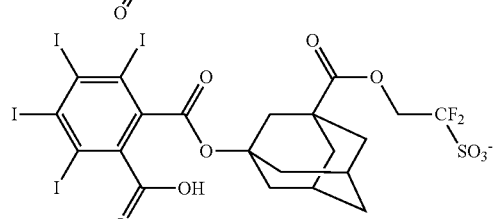
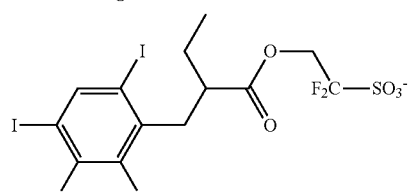
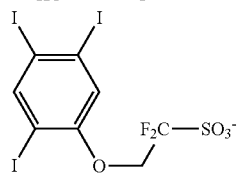
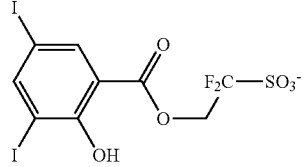
128
-continued
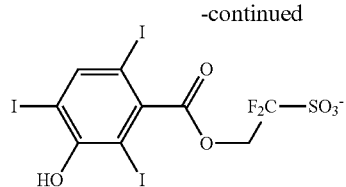
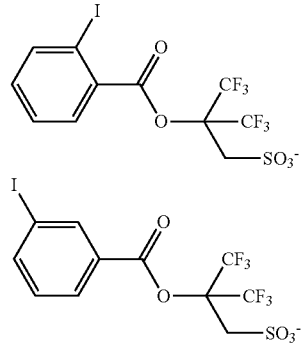
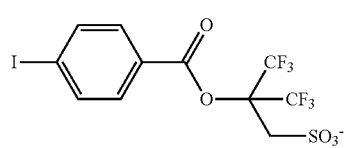
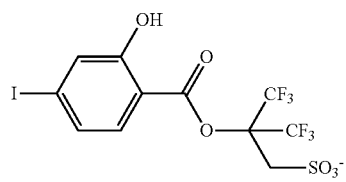
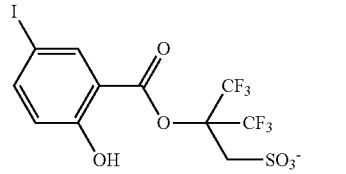
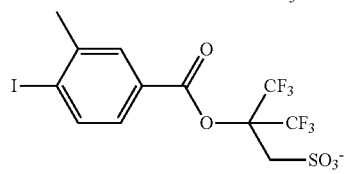
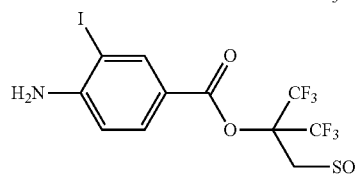

129
-continued
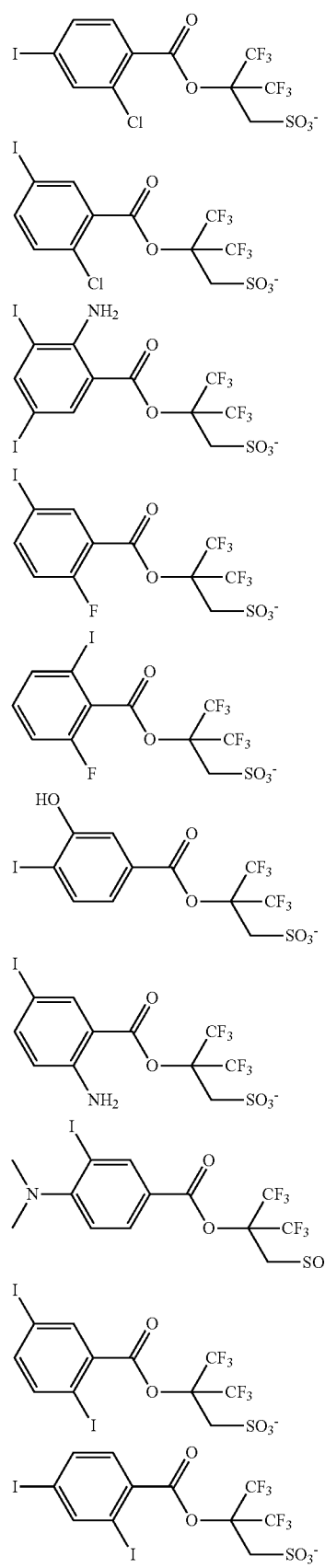
130
-continued
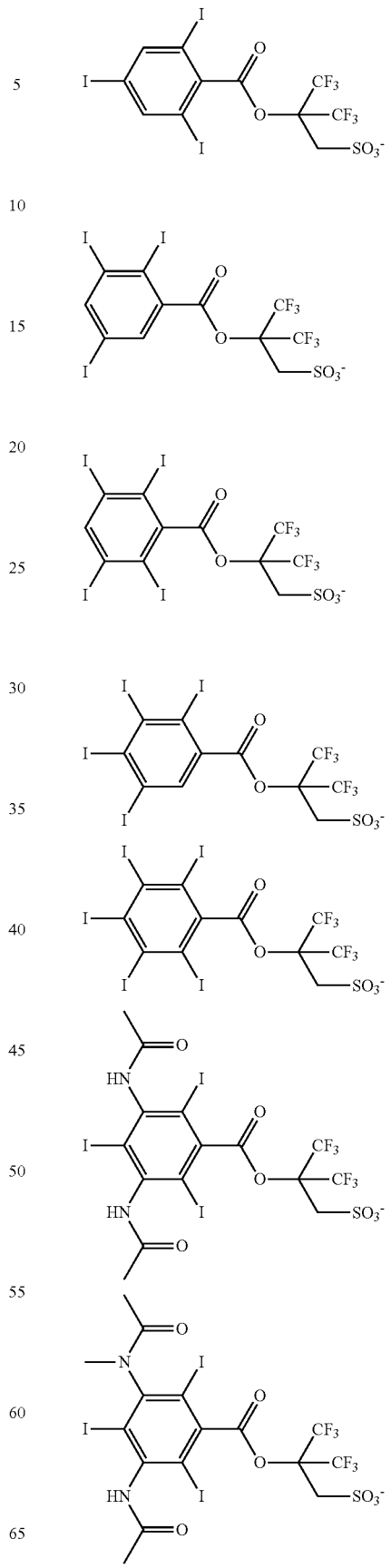

131
-continued
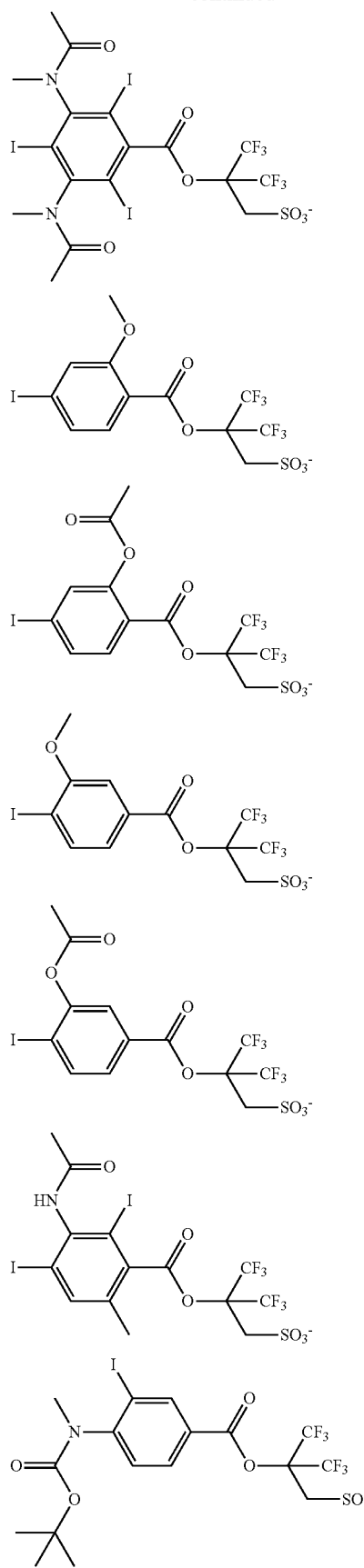
132
-continued
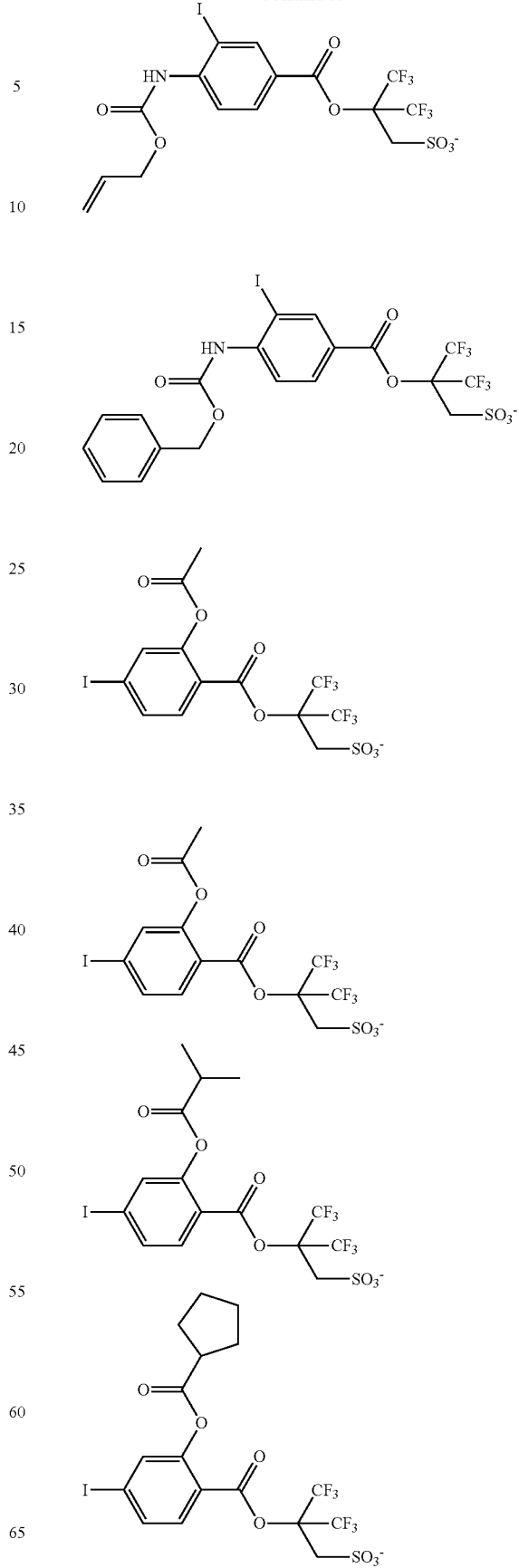

133
-continued
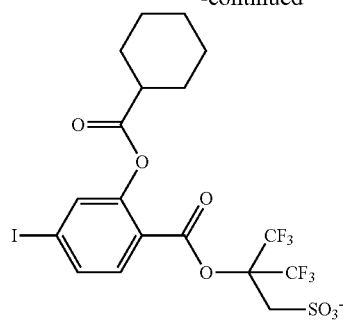
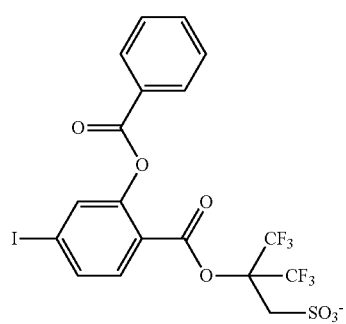
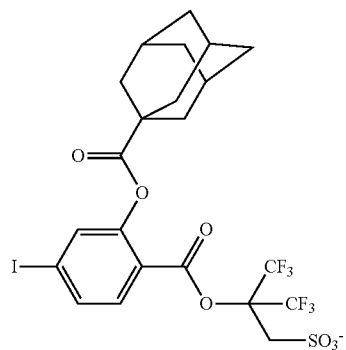
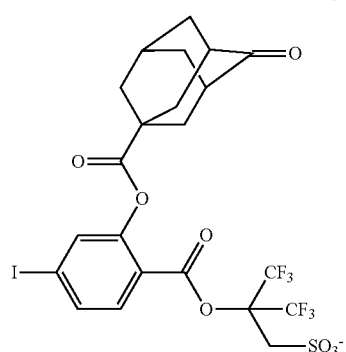
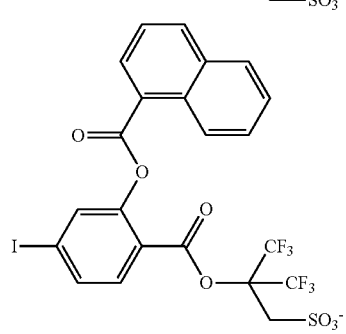
134
-continued
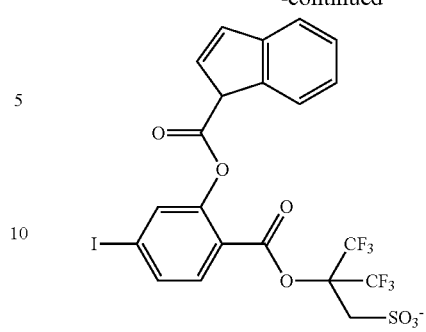
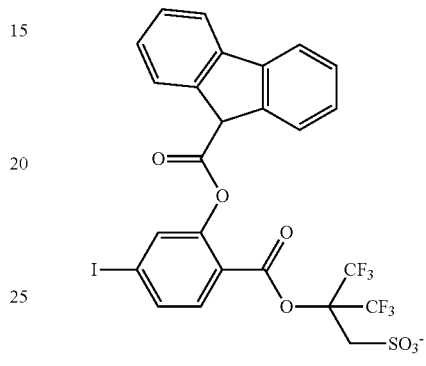
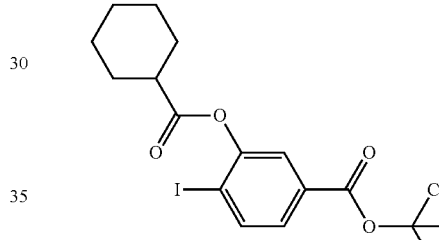
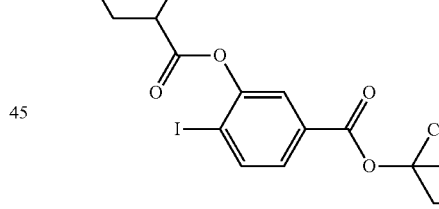
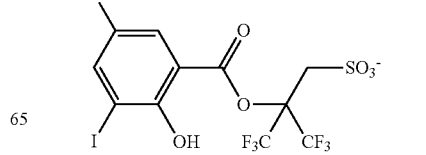

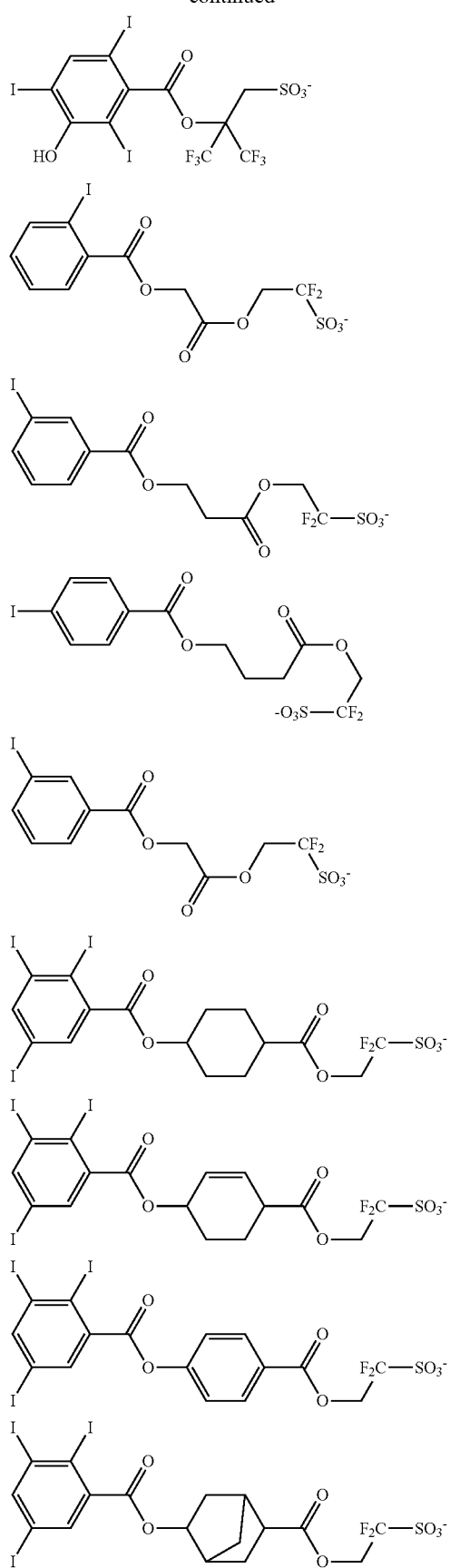
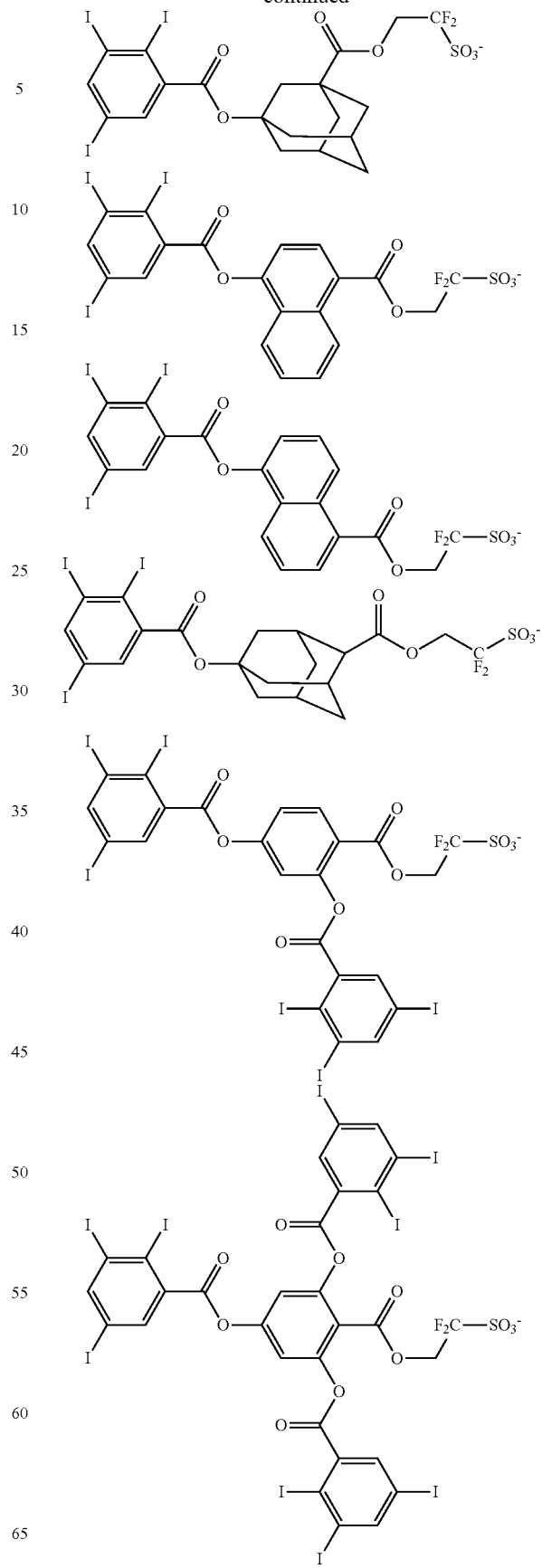

137
-continued
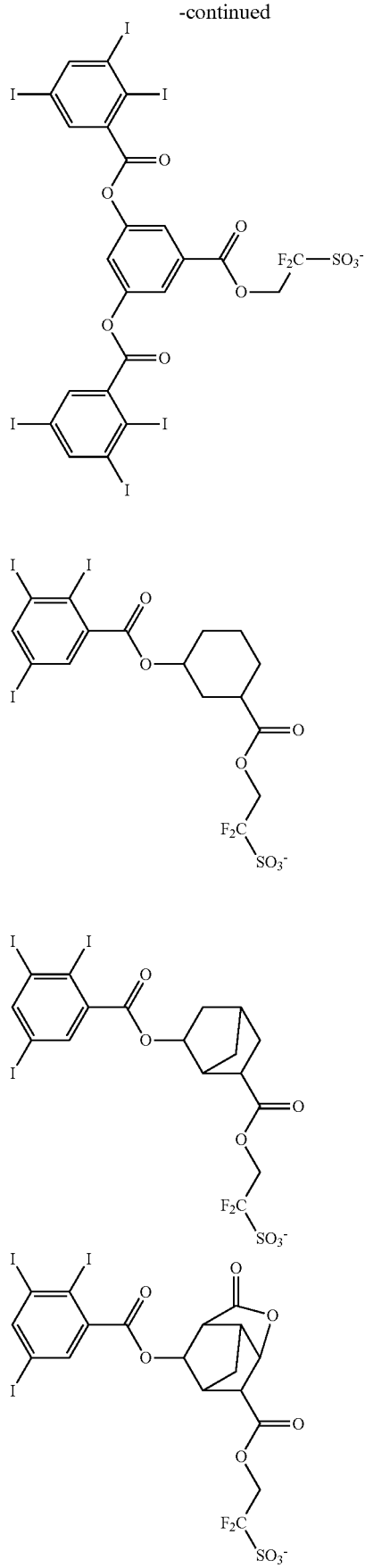
138
-continued
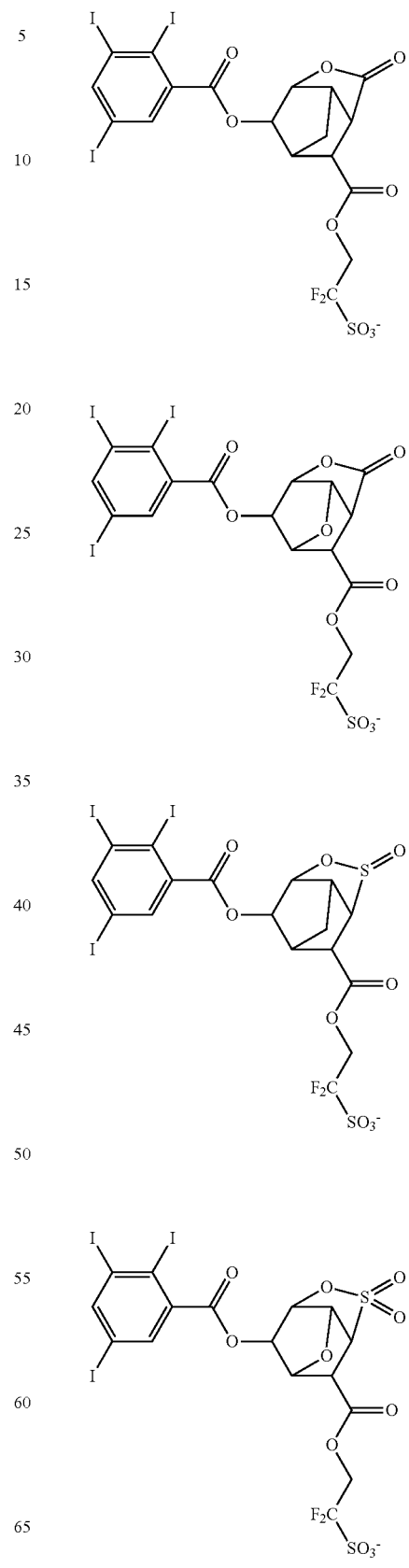

-continued
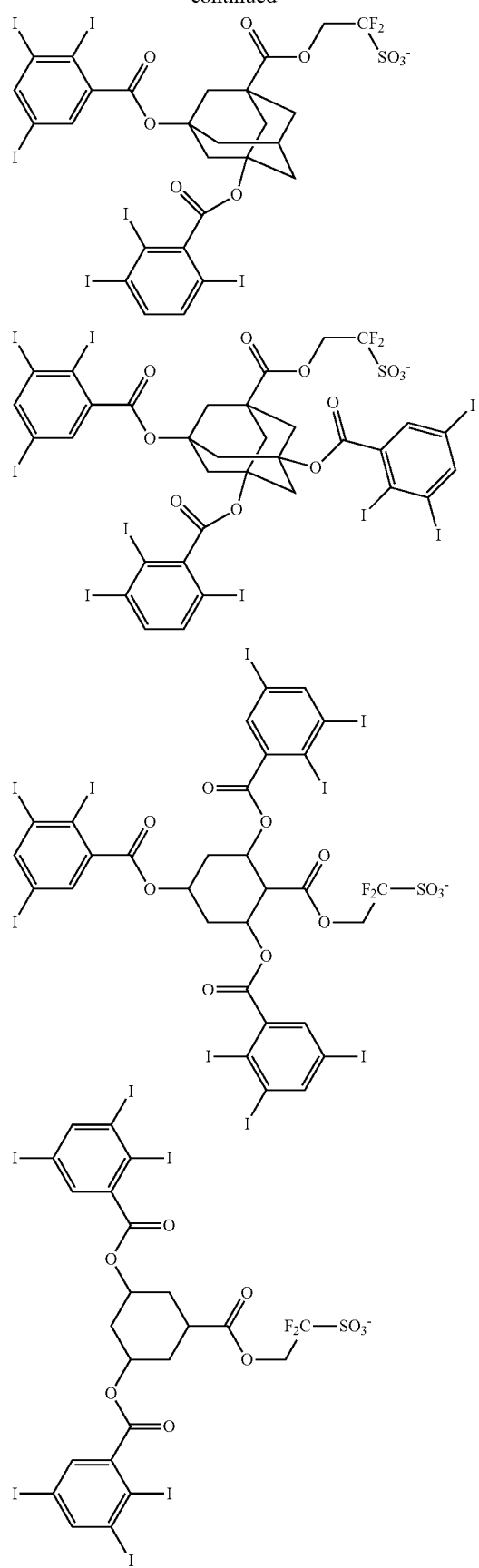
-continued
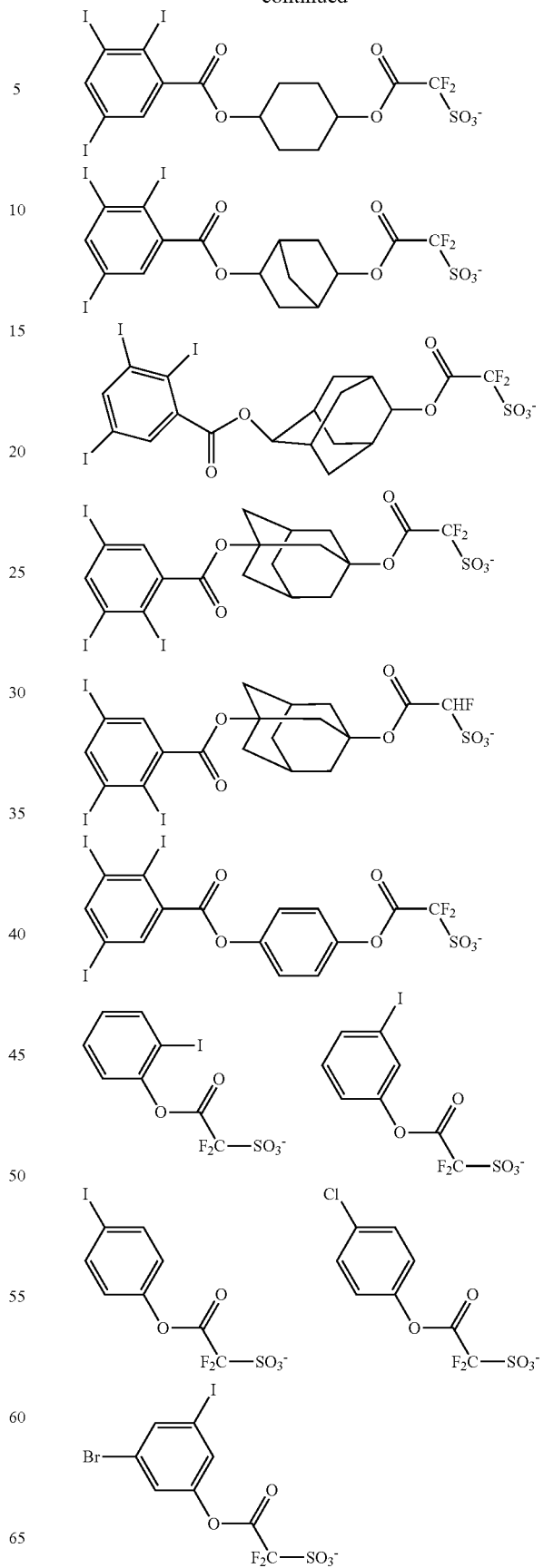

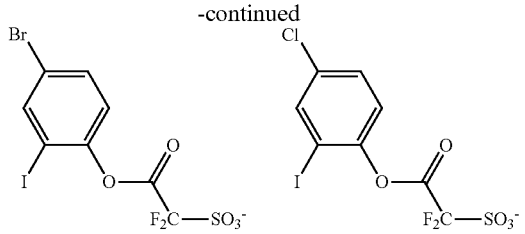
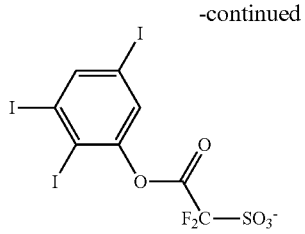
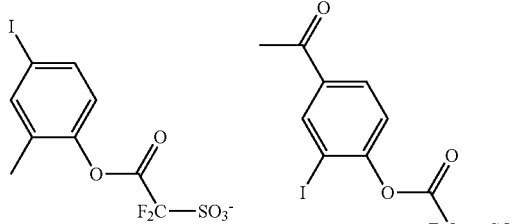
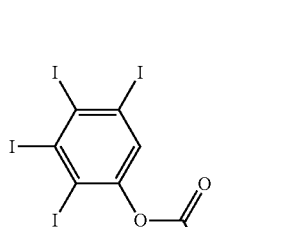
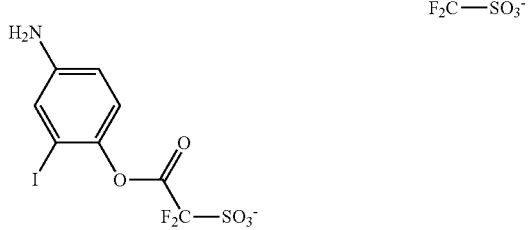
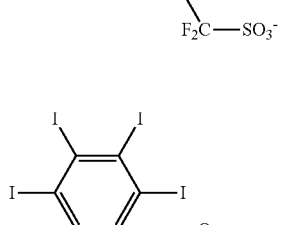
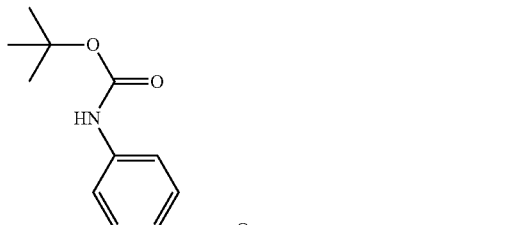
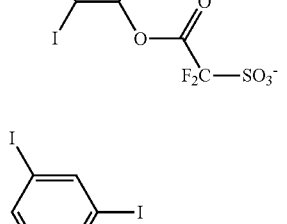
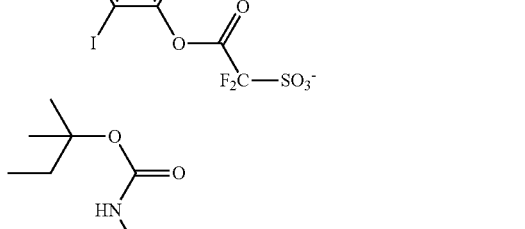
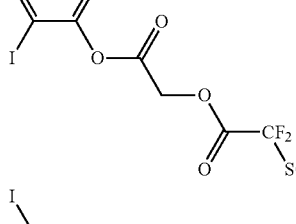
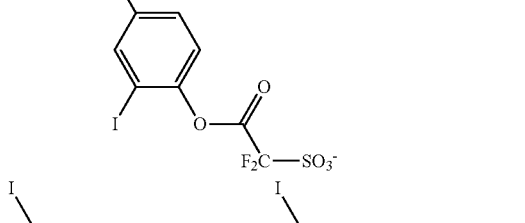
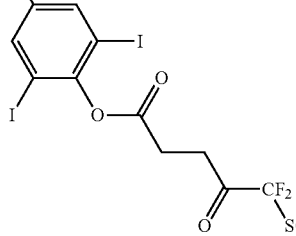
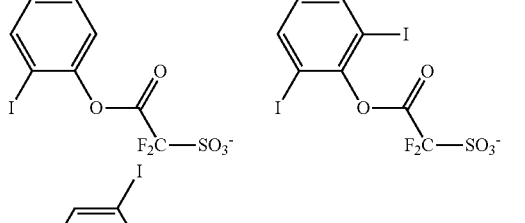

-continued
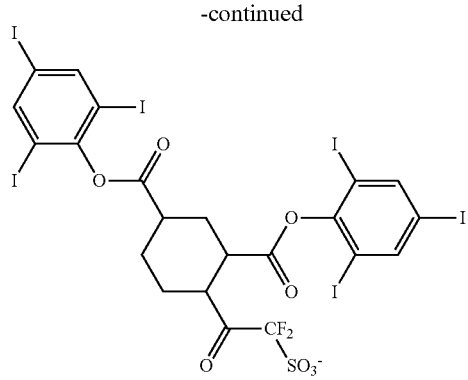
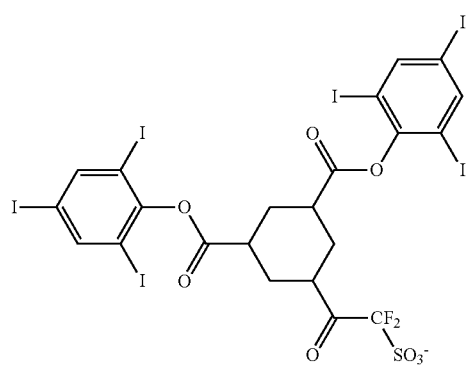
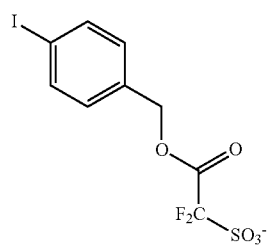
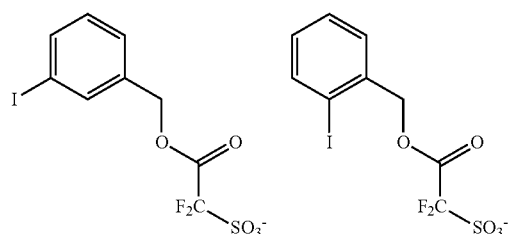
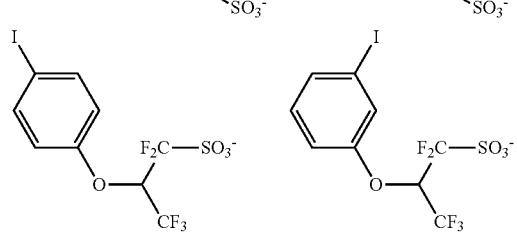
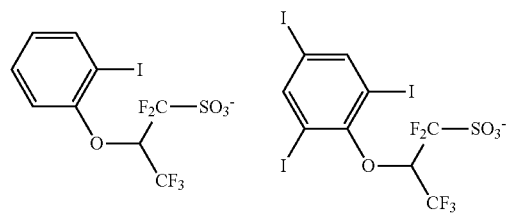
-continued
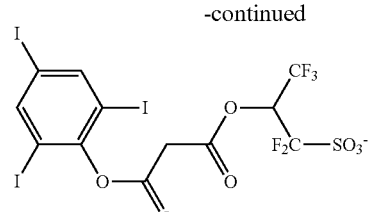
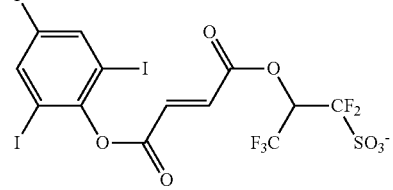
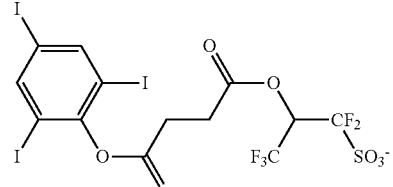
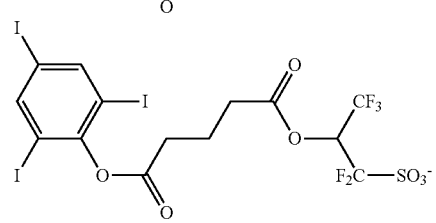
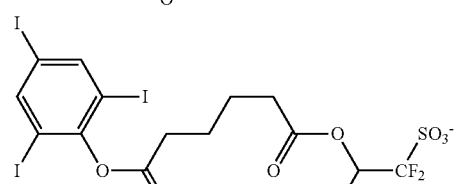
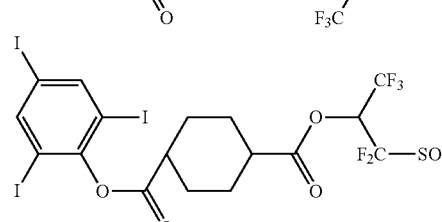
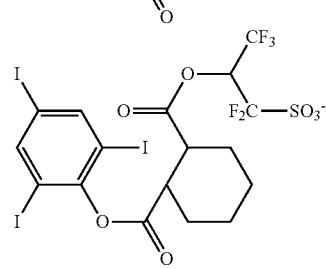
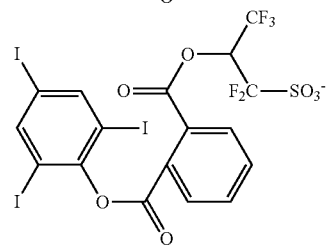

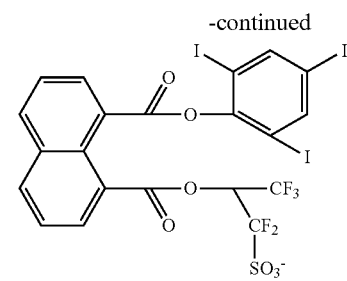
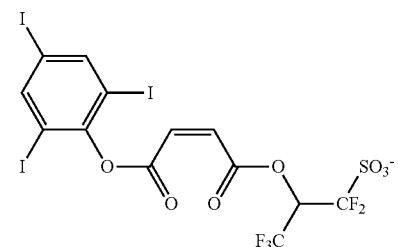
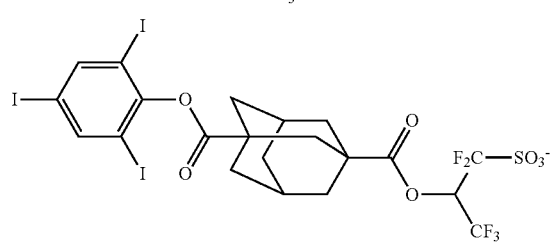
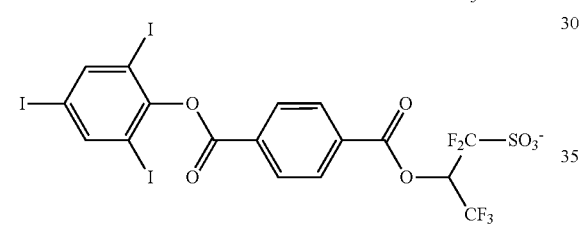
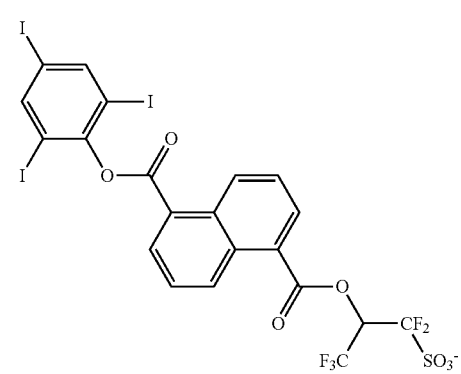
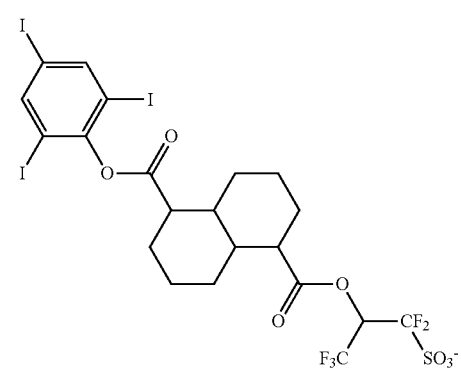
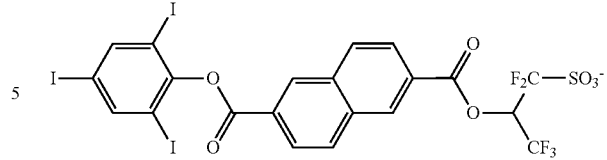
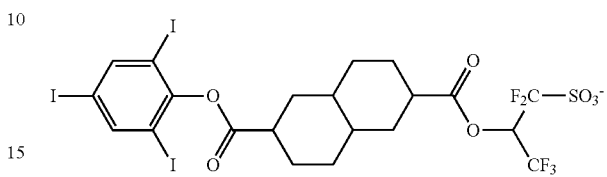
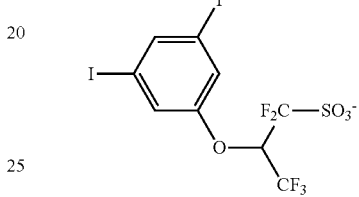
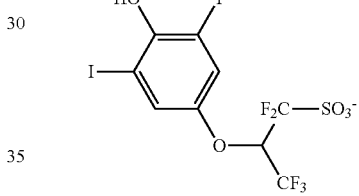
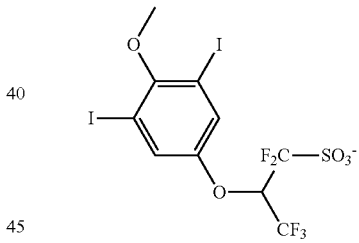
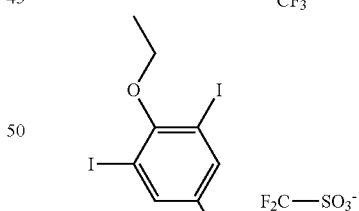
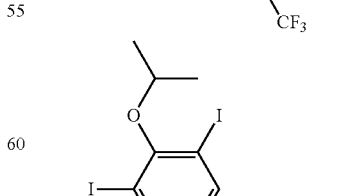
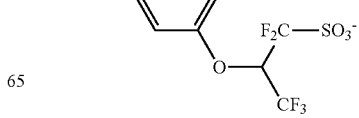

-continued
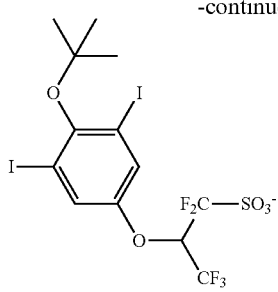
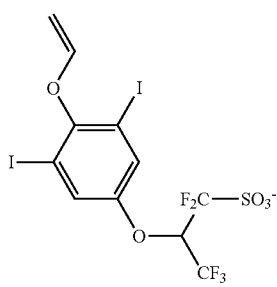
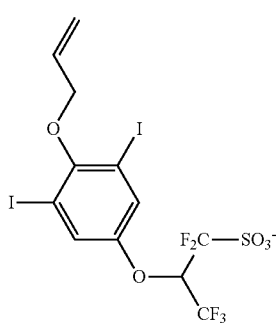
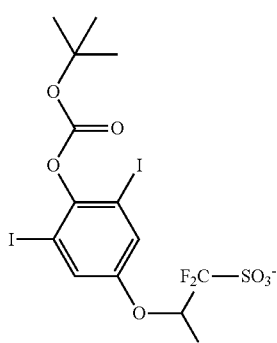
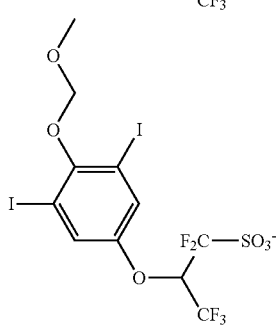
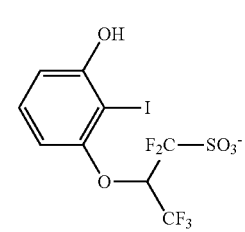
-continued
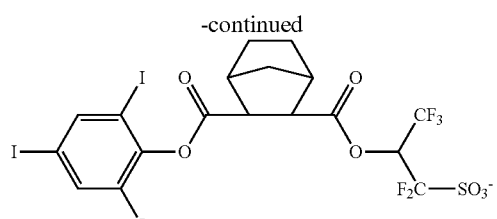
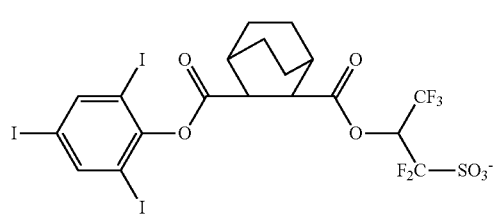
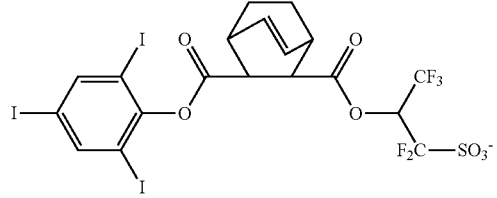
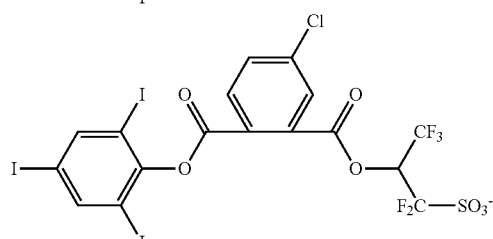
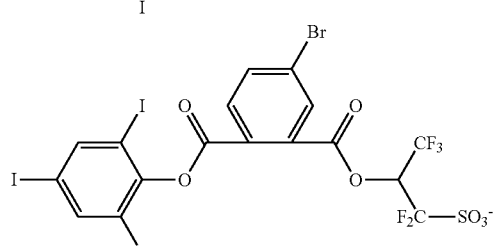
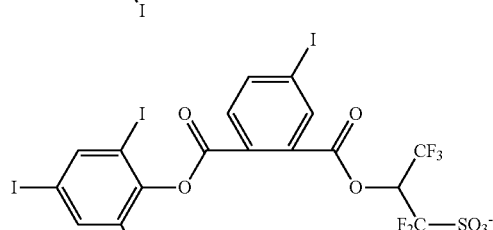
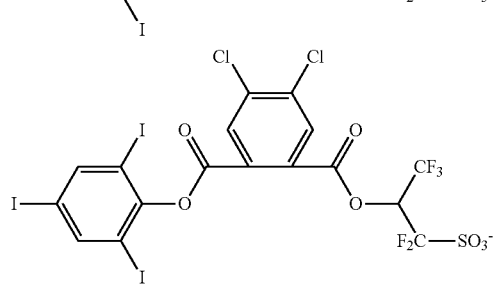

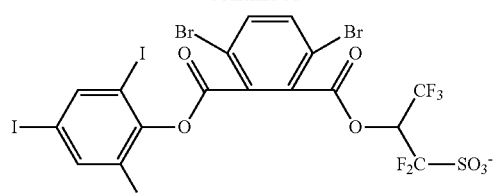
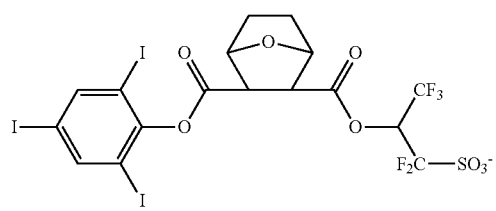
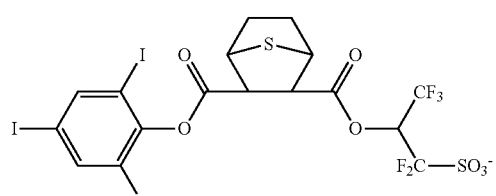
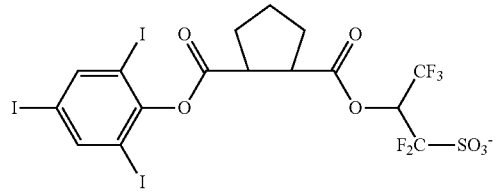
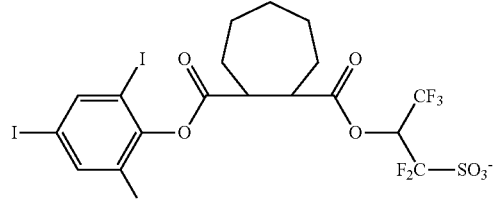
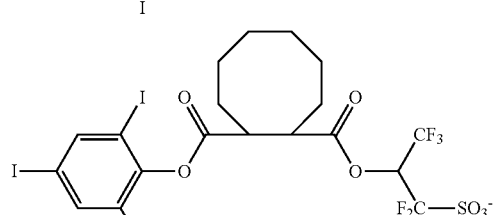
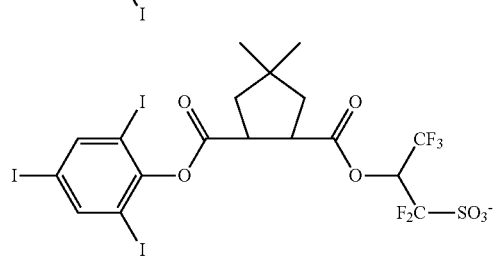
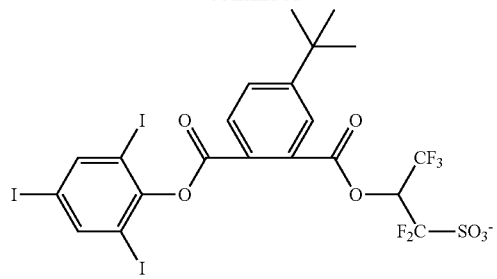
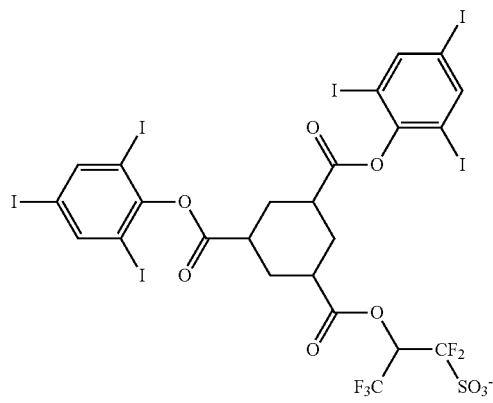
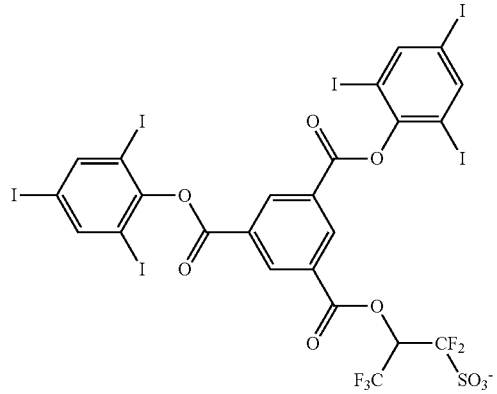
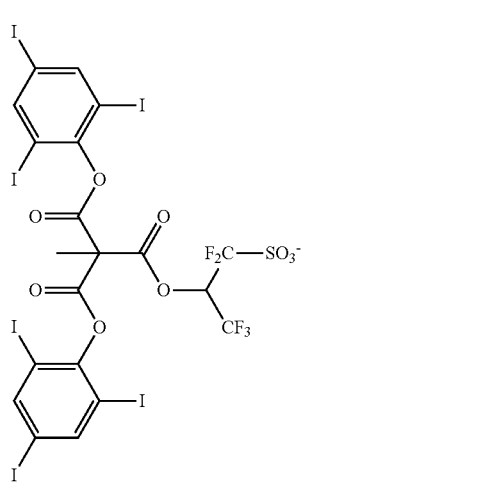

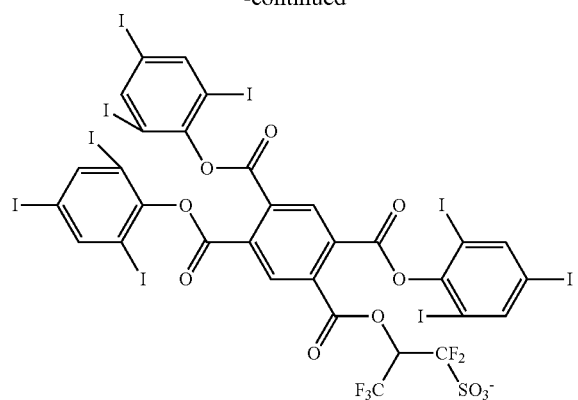
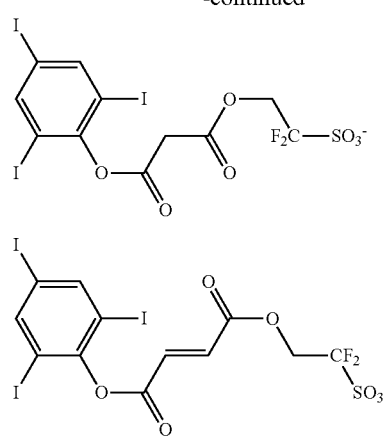

-continued
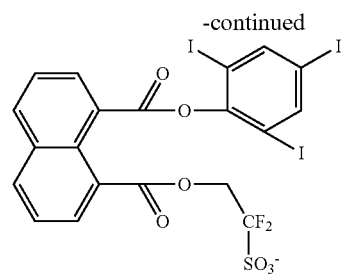
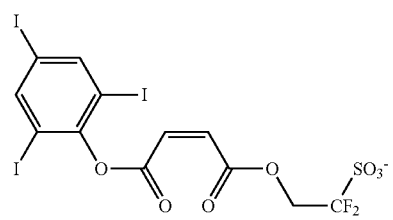
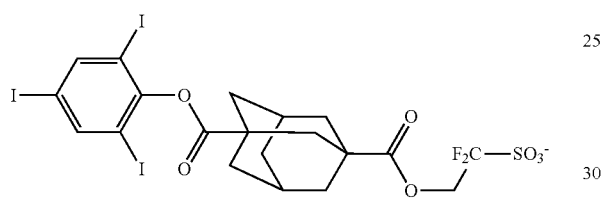
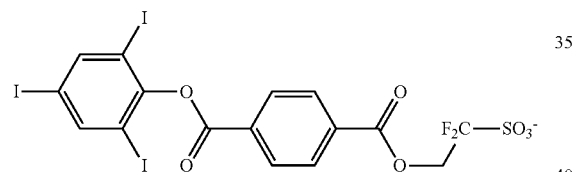
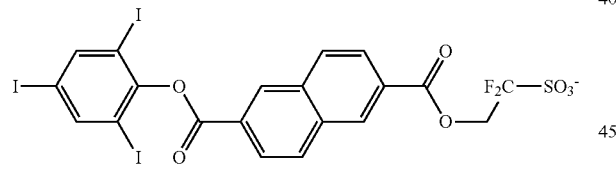
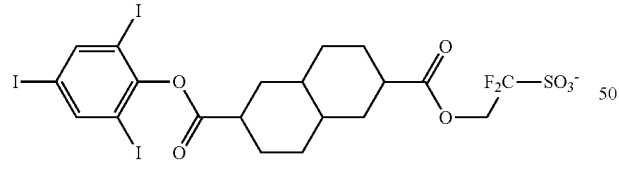
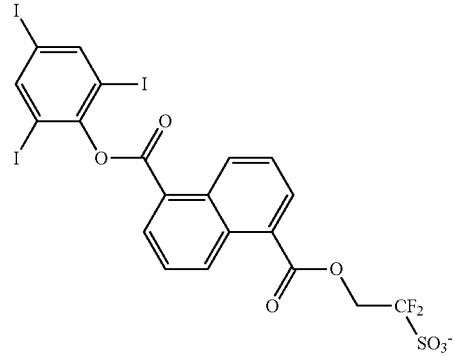
-continued
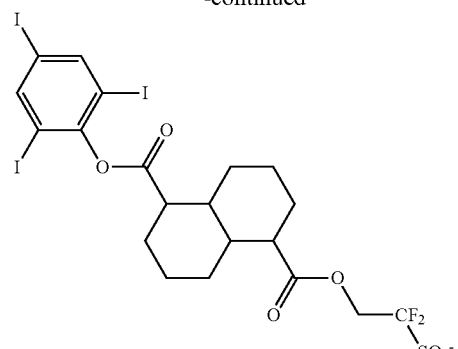
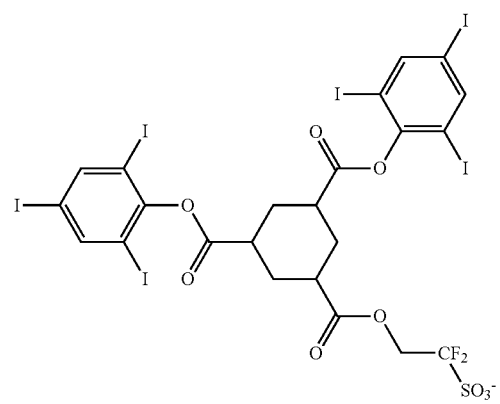
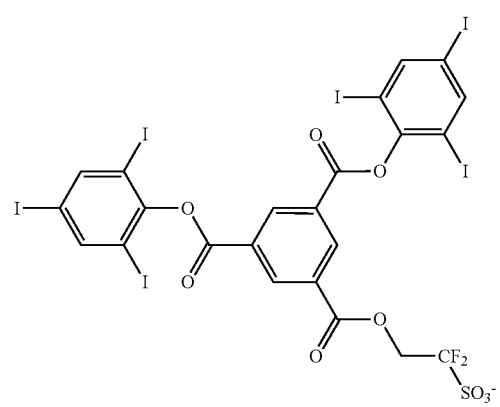
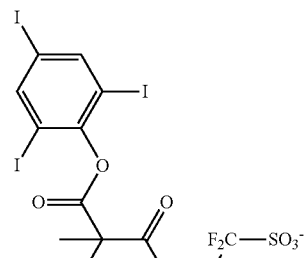
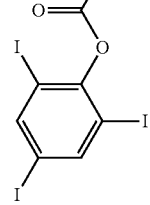

155
-continued
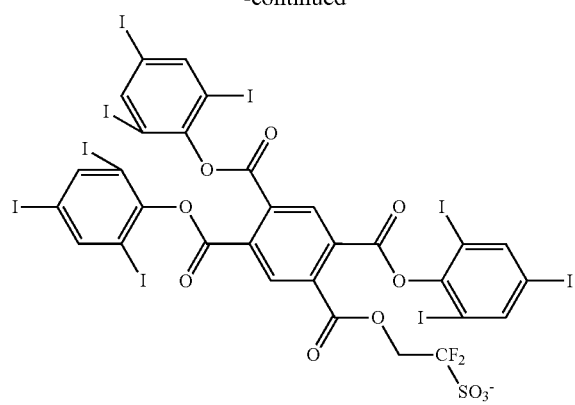
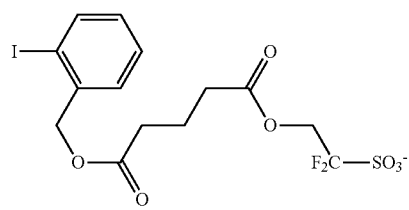
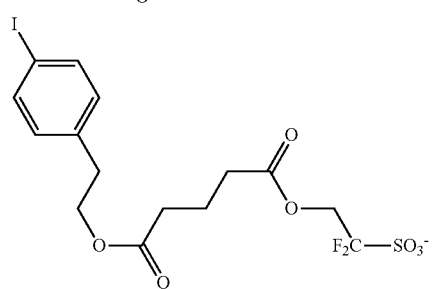
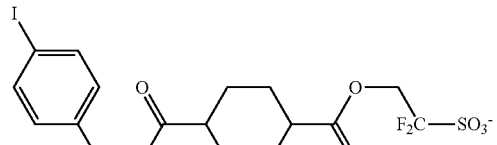
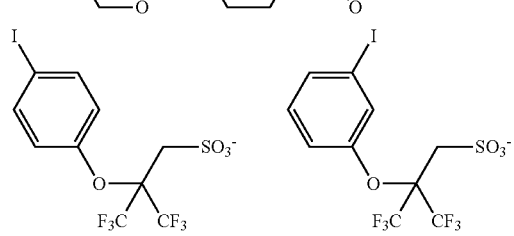
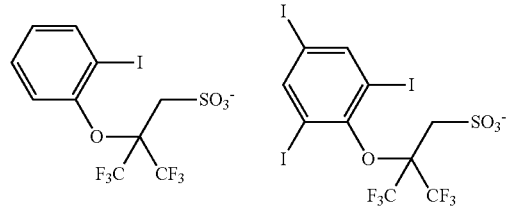
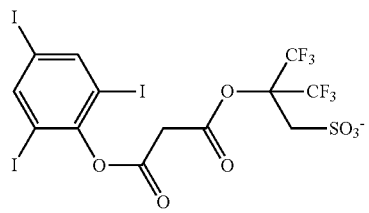
156
-continued
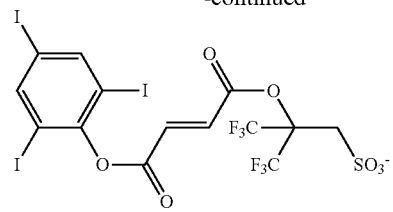
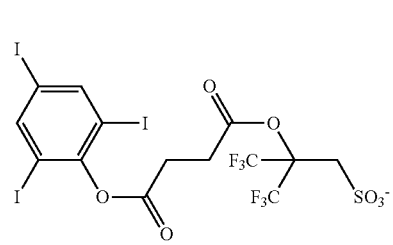
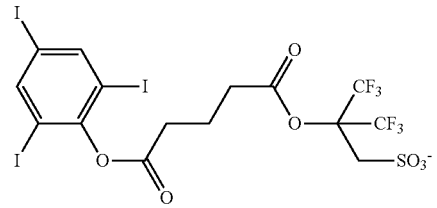
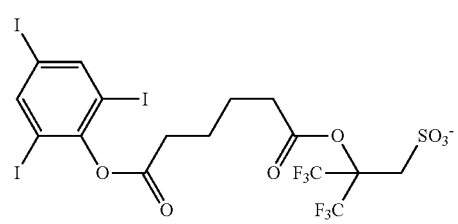
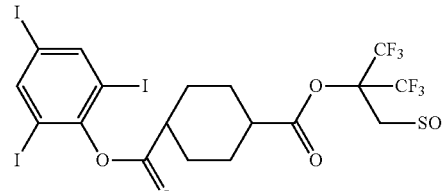
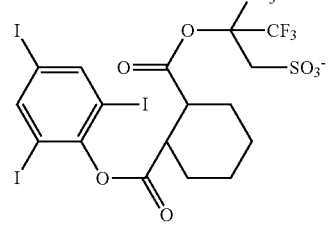
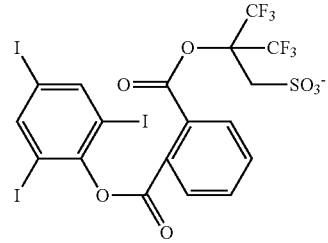

157
-continued
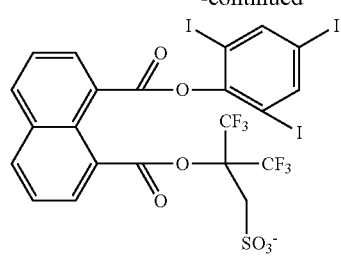
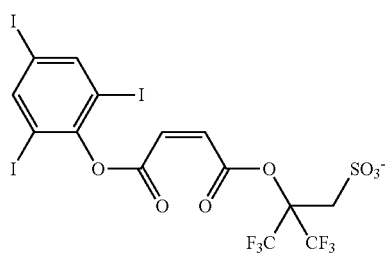
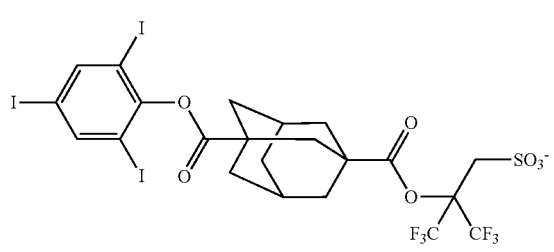
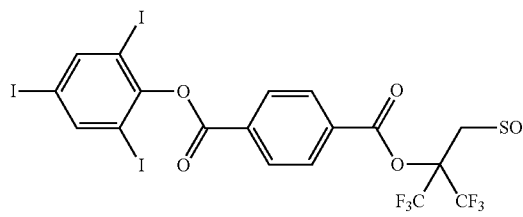
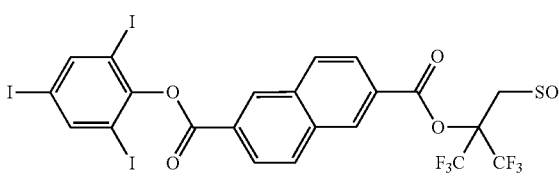
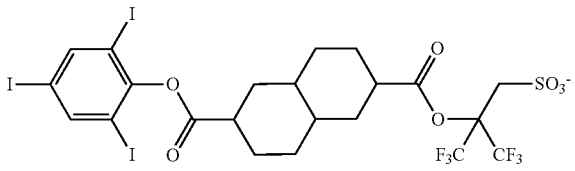
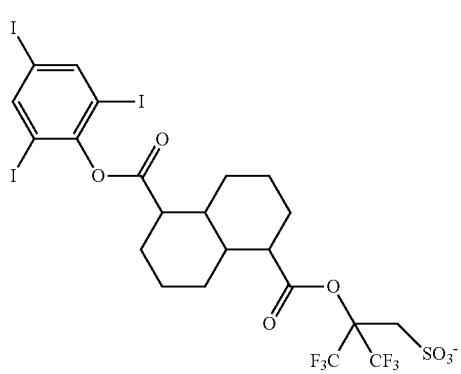
158
-continued
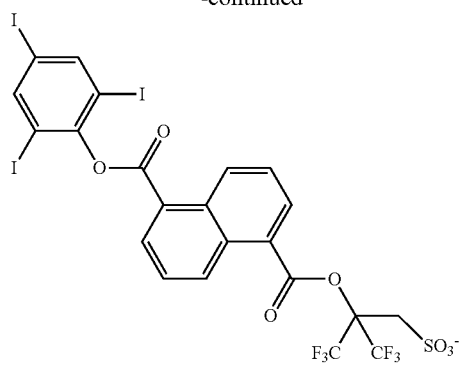
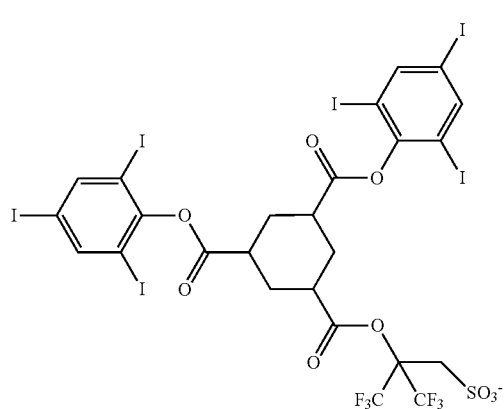
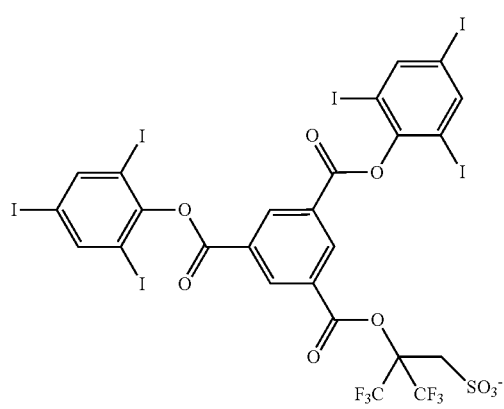
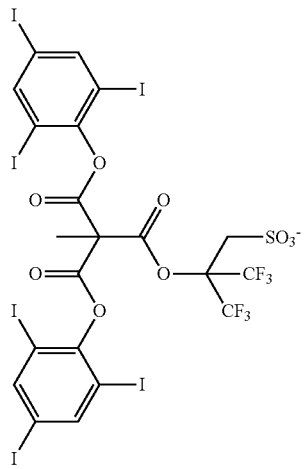

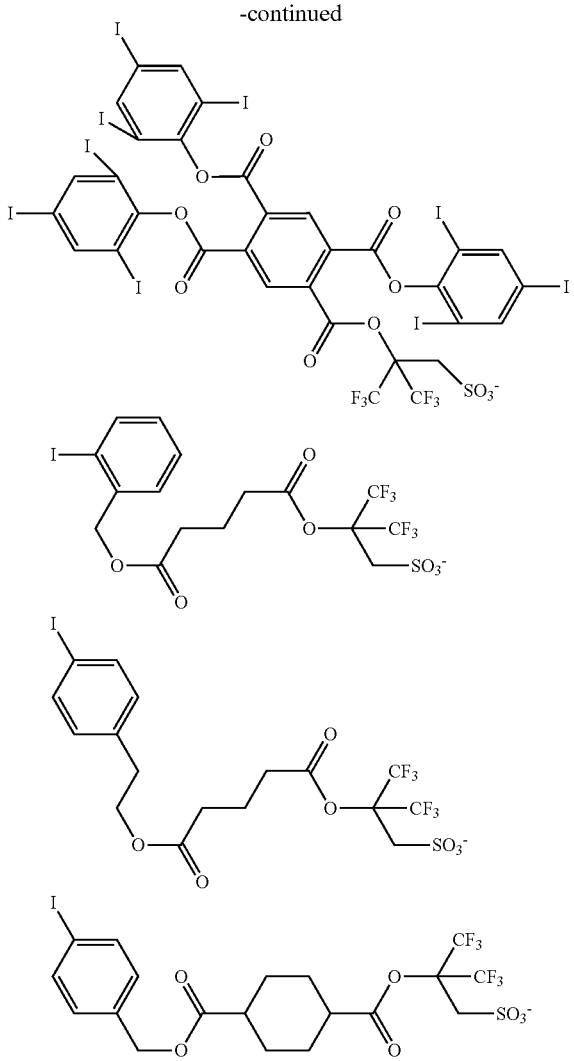

The other acid generator is preferably added in an amount of 0.1 to 50 parts, and more preferably 1 to 40 parts by weight per 100 parts by weight of the base polymer.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant is preferably added in an amount of 0.0001 to 10 parts by weight per 100 parts by weight of the base polymer.

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher may be blended. The quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position may also be used as the quencher. While an α-fluorinated sulfonic acid, imide acid, and methide acid are necessary to deprotect the acid labile group of carboxylic acid ester, an α-non-fluorinated sulfonic acid or a carboxylic acid is released by salt exchange with an α-non-fluorinated onium salt. An α-non-fluorinated sulfonic acid and a carboxylic acid function as a quencher because they do not induce deprotection reaction.

Another useful quencher is an onium salt of carboxylic acid having the formula (4):

$$R^{401}-CO_2^- M_A^+ \quad (4)$$

wherein $R^{4''}$ is a $C_1$-$C_{40}$ straight, branched or cyclic monovalent hydrocarbon group which may contain a heteroatom, and $M_A^+$ is an onium ion which is typically a sulfonium, iodonium or ammonium ion.

The preferred anion moiety of the carboxylic acid onium salt has the formula (5):

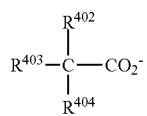

(5)

wherein $R^{402}$ and $R^{403}$ are each independently hydrogen, fluorine or trifluoromethyl, and $R^{404}$ is hydrogen, hydroxyl, a $C_1$-$C_{35}$ straight, branched or cyclic monovalent hydrocarbon group which may contain a heteroatom, or a substituted or unsubstituted $C_6$-$C_{30}$ aryl group.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The quencher is preferably added in an amount of 0 to 5 parts, more preferably 0 to 4 parts by weight per 100 parts by weight of the base polymer.

To the resist composition, a polymeric additive (or water repellency improver) may also be added for improving the water repellency on surface of a resist film as spin coated. The water repellency improver may be used in the topcoat-less immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Process

The resist composition is used in the fabrication of various integrated circuits. Pattern formation using the resist composition may be performed by well-known lithography processes. The process generally involves coating, prebaking, exposure, post-exposure baking (PEB), and development. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2.0 μm thick.

The resist film is then exposed to a desired pattern of high-energy radiation such as UV, deep-UV, EB, EUV, x-ray, soft x-ray, excimer laser light, γ-ray or synchrotron radiation, directly or through a mask. The exposure dose is preferably about 1 to 200 mJ/cm², more preferably about 10 to 100 mJ/cm², or about 0.1 to 100 μC/cm², more preferably about 0.5 to 50 μC/cm². The resist film is further baked (PEB) on a hot plate at 60 to 150° C. for 10 seconds to 30 minutes, preferably at 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV, x-ray, soft x-ray, γ-ray and synchrotron radiation.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon to atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation "pbw" is parts by weight.

PAG Monomers 1 to 7 and Comparative PAG Monomer 1 used in Synthesis Examples are identified below.

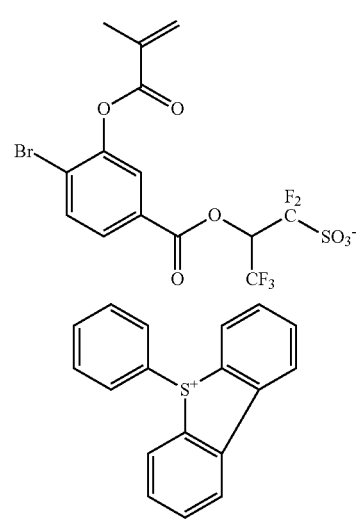

PAG Monomer 1

PAG Monomer 2
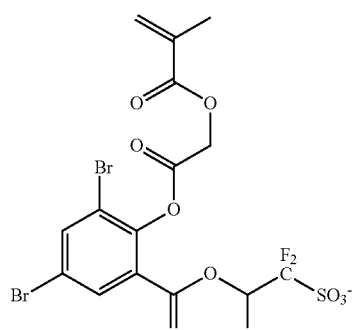
PAG Monomer 3
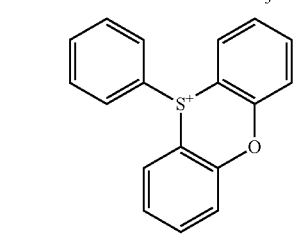
PAG Monomer 4
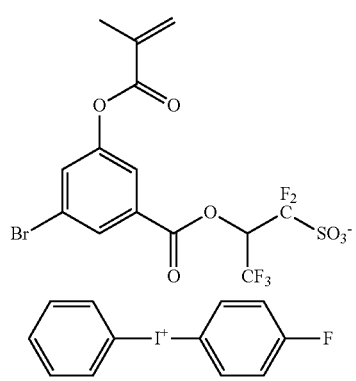
PAG Monomer 5
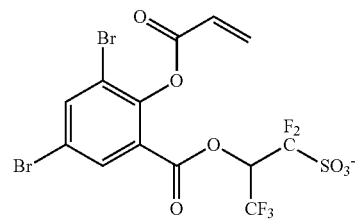
PAG Monomer 6
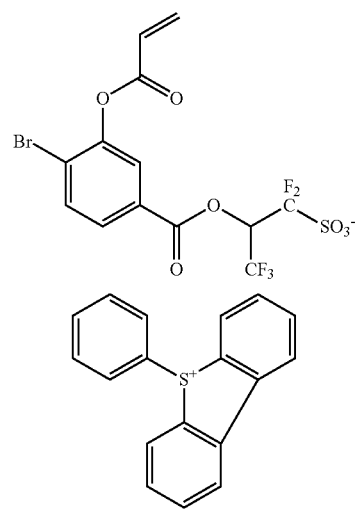
PAG Monomer 7
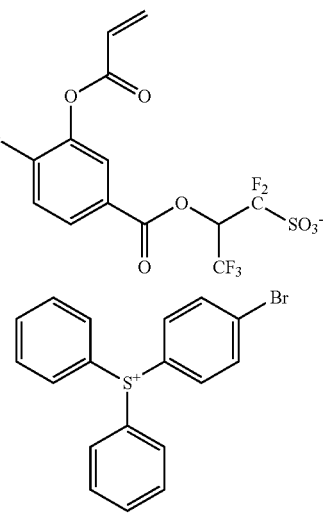

Comparative PAG Monomer 1

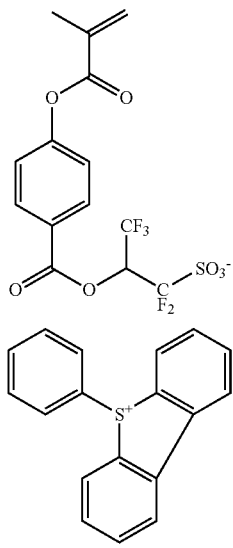

Synthesis Example 1

Synthesis of Polymer 1

A 2-L flask was charged with 8.4 g of 1-methylcyclopentyl methacrylate, 3.6 g of 4-hydroxyphenyl methacrylate, 4.5 g of 3-oxo-2,7-dioxatricyclo[4.2.1.0$^{4,8}$]nonan-9-yl methacrylate, 8.1 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 1 as white solid. The polymer was analyzed for composition by $^{13}$C- and $^1$H-NMR and for Mw and Mw/Mn by GPC, with the results shown below.

Polymer 1

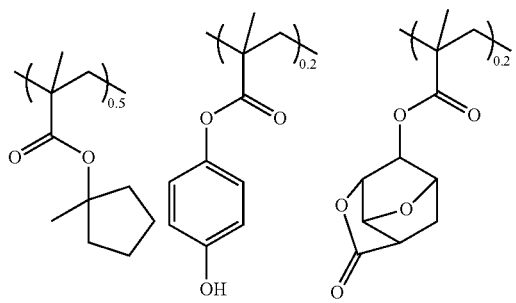

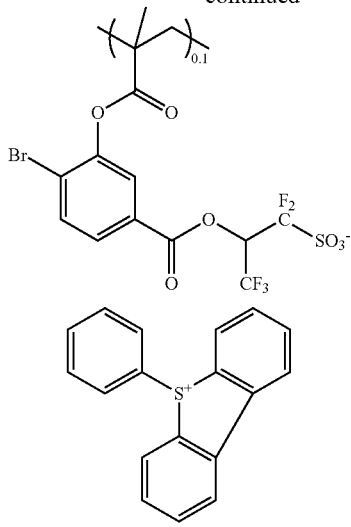

Mw = 8,900
Mw/Mn = 1.76

Synthesis Example 2

Synthesis of Polymer 2

Polymer 2 was synthesized as white solid by the same procedure as in Synthesis Example 1 aside from using 10.3 g of PAG Monomer 2 instead of PAG Monomer 1. The polymer was analyzed for composition by $^{13}$C- and $^1$H-NMR and for Mw and Mw/Mn by GPC.

Polymer 2

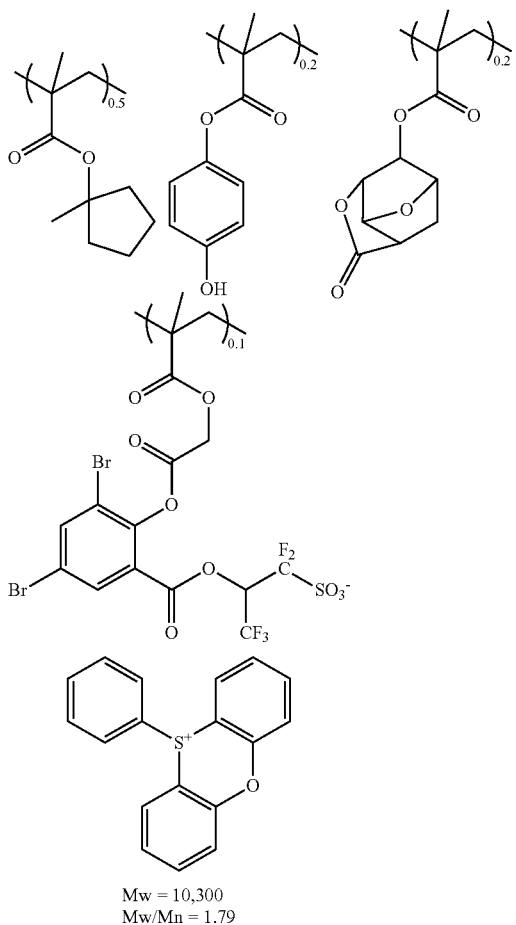

Mw = 10,300
Mw/Mn = 1.79

Synthesis Example 3

Synthesis of Polymer 3

Polymer 3 was synthesized as white solid by the same procedure as in Synthesis Example 1 aside from using 10.3 g of PAG Monomer 3 instead of PAG Monomer 1. The polymer was analyzed for composition by $^{13}C$- and $^{1}H$-NMR and for Mw and Mw/Mn by GPC.

Polymer 3

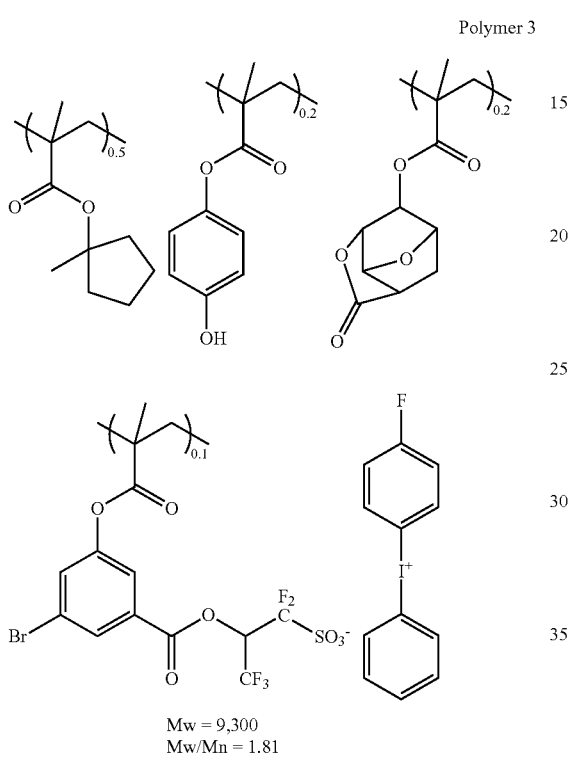

Mw = 9,300
Mw/Mn = 1.81

Synthesis Example 4

Synthesis of Polymer 4

Polymer 4 was synthesized as white solid by the same procedure as in Synthesis Example 1 aside from using 8.4 g of PAG Monomer 4 instead of PAG Monomer 1. The polymer was analyzed for composition by $^{13}C$- and $^{1}H$-NMR and for Mw and Mw/Mn by GPC.

Polymer 4

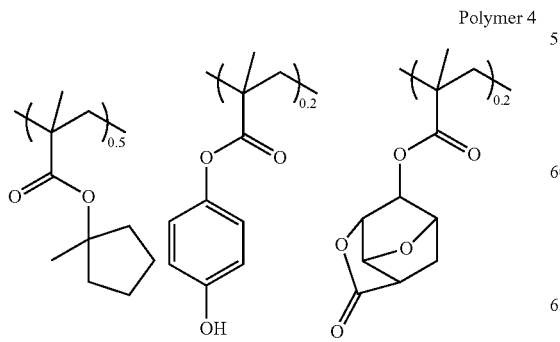

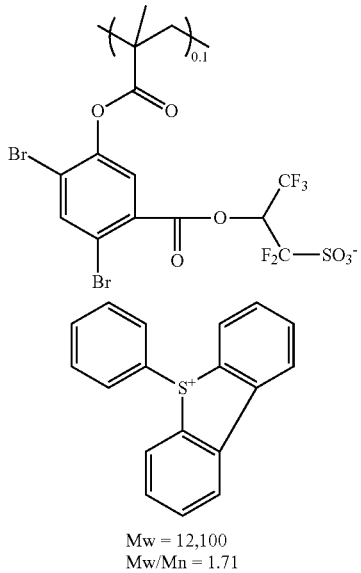

Mw = 12,100
Mw/Mn = 1.71

Synthesis Example 5

Synthesis of Polymer 5

A 2-L flask was charged with 8.4 g of 1-methylcyclopentyl methacrylate, 4.8 g of 4-hydroxystyrene, 8.1 g of PAG Monomer 5, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 5 as white solid. The polymer was analyzed for composition by $^{13}C$- and $^{1}H$-NMR and for Mw and Mw/Mn by GPC.

Polymer 5

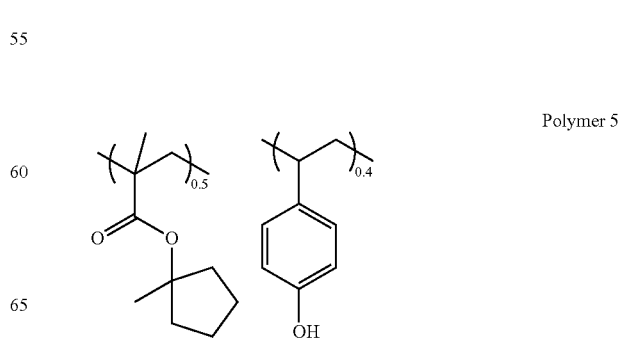

-continued

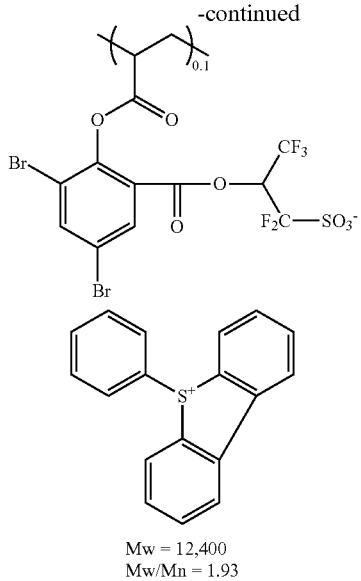

Mw = 12,400
Mw/Mn = 1.93

Synthesis Example 6

Synthesis of Polymer 6

Polymer 6 was synthesized as white solid by the same procedure as in Synthesis Example 5 aside from using 7.4 g of PAG Monomer 6 instead of PAG Monomer 5. The polymer was analyzed for composition by $^{13}$C- and $^{1}$H-NMR and for Mw and Mw/Mn by GPC.

Polymer 6

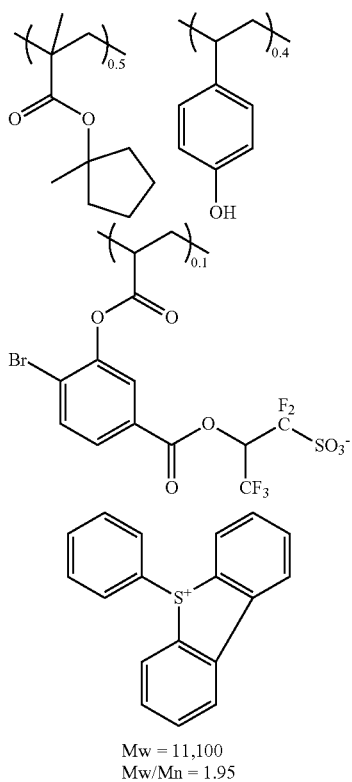

Mw = 11,100
Mw/Mn = 1.95

Synthesis Example 7

Synthesis of Polymer 7

Polymer 7 was synthesized as white solid by the same procedure as in Synthesis Example 5 aside from using 8.2 g of PAG Monomer 7 instead of PAG Monomer 5. The polymer was analyzed for composition by $^{13}$C- and $^{1}$H-NMR and for Mw and Mw/Mn by GPC.

Polymer 7

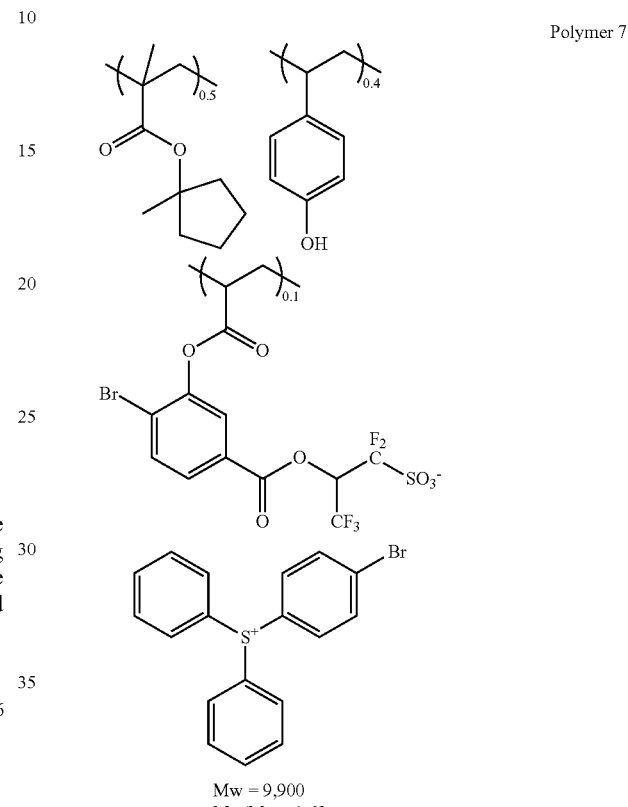

Mw = 9,900
Mw/Mn = 1.62

Synthesis Example 8

Synthesis of Polymer 8

Polymer 8 was synthesized as white solid by the same procedure as in Synthesis Example 7 aside from using 13.5 g of 4-pentyloxy-3-fluorostyrene instead of 1-methyl-1-cyclopentyl methacrylate and changing the amount of 4-hydroxystyrene to 3.0 g. The polymer was analyzed for composition by $^{13}$C- and $^{1}$H-NMR and for Mw and Mw/Mn by GPC.

Polymer 8

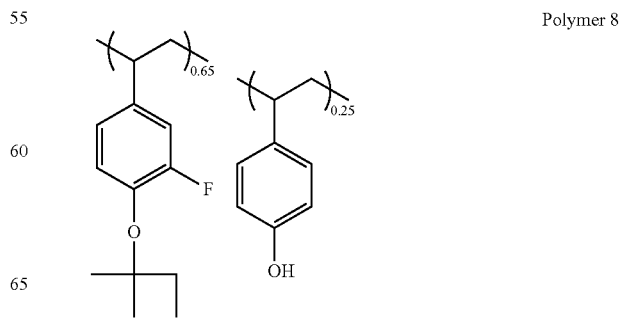

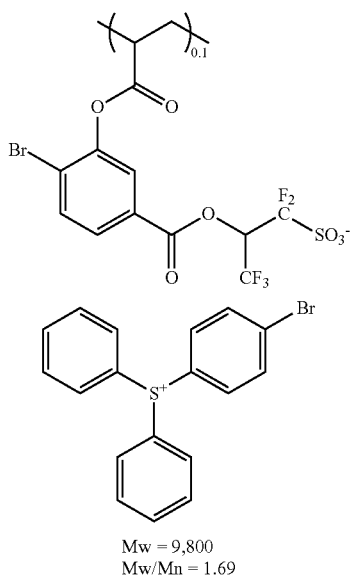

Mw = 9,800
Mw/Mn = 1.69

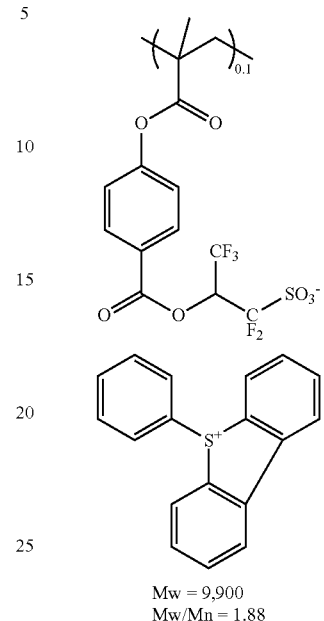

Mw = 9,900
Mw/Mn = 1.88

Examples and Comparative Examples

Preparation of Resist Composition

Resist compositions were prepared by dissolving the components in a solvent in accordance with the recipe shown in Table 1, and filtering through a filter having a pore size of 0.2 μm. The solvent contained 100 ppm of surfactant FC-4430 (3M). The components in Table 1 are as identified below.

Organic Solvents:

PGMEA (propylene glycol monomethyl ether acetate)

CyH (cyclohexanone)

PGME (propylene glycol monomethyl ether)

DAA (diacetone alcohol)

Acid generators: PAG 1 to PAG 3 of the following structural formulae

Comparative Synthesis Example 1

Synthesis of Comparative Polymer 1

Comparative Polymer 1 was synthesized as white solid by the same procedure as in Synthesis Example 1 aside from using 7.6 g of Comparative PAG Monomer 1 instead of PAG Monomer 1. The polymer was analyzed for composition by $^{13}$C- and $^{1}$H-NMR and for Mw and Mw/Mn by GPC.

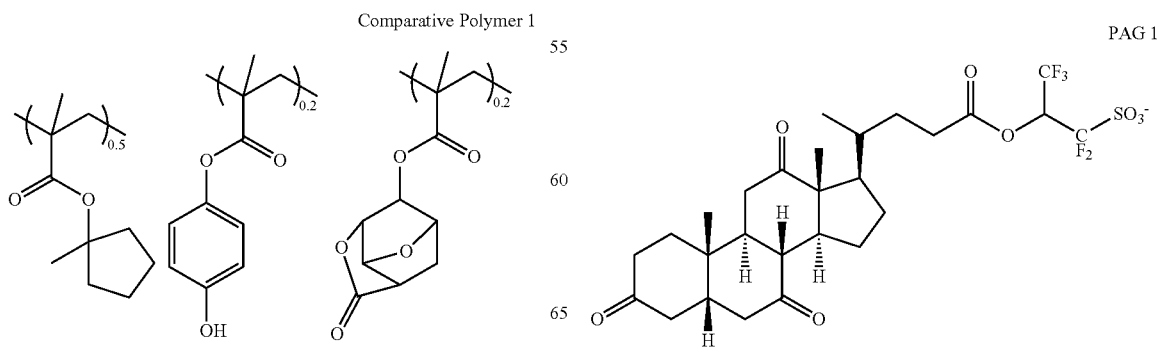

Comparative Polymer 1

PAG 1

-continued

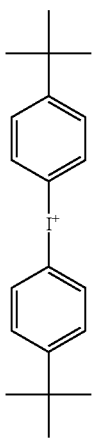

PAG 2

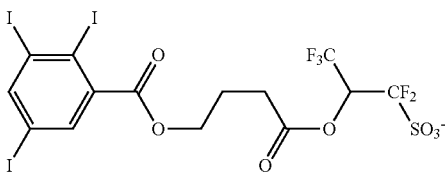

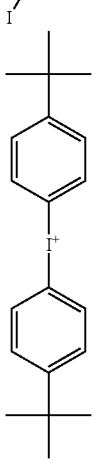

PAG 3

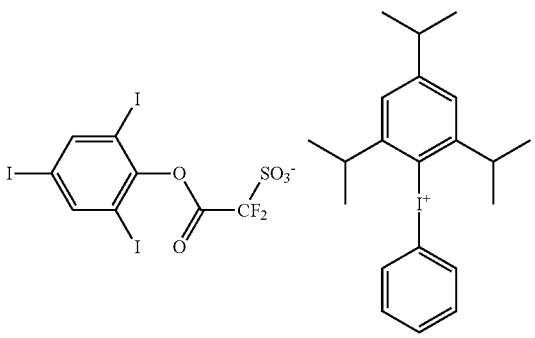

Quenchers: Quenchers 1 and 2 of the following structural formulae

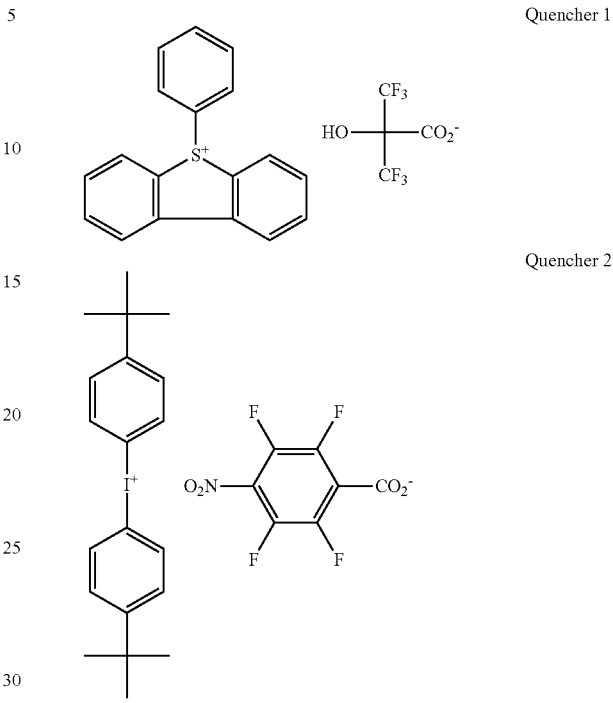

EUV Lithography Test

Each of the resist compositions of Examples 1 to 11 and Comparative Example 1 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 60 nm thick. Using an EUV scanner NXE3300 (ASML, NA 0.33, σ0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Table 1 for 60 seconds and developed in a 2.38 wt % TMAH aqueous solution for 30 seconds to form a hole pattern having a size of 23 nm.

The resist pattern was evaluated. The exposure dose that provides a hole pattern having a size of 23 nm is reported as sensitivity. The size of 50 holes was measured under CD-SEM (CG-5000, Hitachi High-Technologies Corp.), from which a size variation (3σ) was computed and reported as CDU.

The resist compositions are shown in Table 1 together with the sensitivity and CDU of EUV lithography.

TABLE 1

| | | Polymer (pbw) | Acid generator (pbw) | Base (pbw) | Organic solvent (pbw) | PEB temp. (° C.) | Sensitivity (mJ/cm$^2$) | CDU (nm) |
|---|---|---|---|---|---|---|---|---|
| Example | 1 | Polymer 1 (100) | — | Quencher 1 (3.00) | PGMEA (400) CyH (2,000) PGME (100) | 100 | 26 | 2.3 |

TABLE 1-continued

| | | Polymer (pbw) | Acid generator (pbw) | Base (pbw) | Organic solvent (pbw) | PEB temp. (° C.) | Sensitivity (mJ/cm$^2$) | CDU (nm) |
|---|---|---|---|---|---|---|---|---|
| | 2 | Polymer 2 (100) | — | Quencher 1 (3.00) | PGMEA (400) CyH (2,000) PGME (100) | 100 | 23 | 2.6 |
| | 3 | Polymer 3 (100) | — | Quencher 1 (3.00) | PGMEA (2,000) DAA (500) | 100 | 22 | 2.4 |
| | 4 | Polymer 4 (100) | — | Quencher 1 (3.00) | PGMEA (2000) DAA (500) | 100 | 21 | 2.3 |
| | 5 | Polymer 5 (100) | — | Quencher 1 (3.00) | PGMEA (2,000) DAA (500) | 100 | 20 | 2.4 |
| | 6 | Polymer 6 (100) | — | Quencher 1 (3.00) | PGMEA (2,000) DAA (500) | 100 | 23 | 2.3 |
| | 7 | Polymer 7 (100) | — | Quencher 1 (3.00) | PGMEA (2,000) DAA (500) | 100 | 23 | 2.5 |
| | 8 | Polymer 8 (100) | — | Quencher 1 (3.00) | PGMEA (2,000) DAA (500) | 100 | 28 | 2.0 |
| | 9 | Polymer 1 (100) | PAG 1 (7.0) | Quencher 2 (3.00) | PGMEA (2,000) DAA (500) | 100 | 16 | 2.8 |
| | 10 | Polymer 1 (100) | PAG 2 (10.0) | Quencher 2 (3.00) | PGMEA (2,000) DAA (500) | 100 | 15 | 2.9 |
| | 11 | Polymer 1 (100) | PAG 3 (10.0) | Quencher 2 (3.00) | PGMEA (2,000) DAA (500) | 100 | 14 | 2.7 |
| Comparative Example | 1 | Comparative Polymer 1 (100) | — | Quencher 1 (3.00) | PGMEA (400) CyH (2,000) PGME (100) | 100 | 36 | 4.0 |

It is demonstrated in Table 1 that resist compositions comprising a polymer comprising recurring units having formula (a1) or (a2) within the scope of the invention offer a high sensitivity and improved CDU.

Japanese Patent Application No. 2017-121568 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer comprising recurring units having the formula (a1) or (a2):

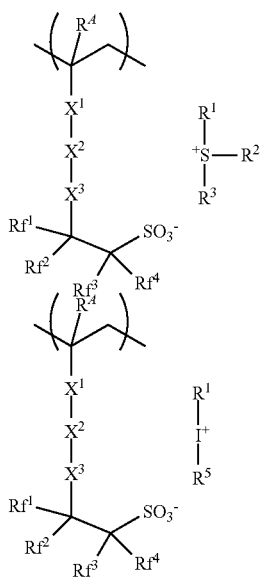

wherein $R^A$ is hydrogen or methyl, $X^1$ is a single bond or ester group, $X^2$ is a $C_1$-$C_{12}$ straight, branched or cyclic alkylene group or $C_6$-$C_{10}$ arylene group, at least one methylene moiety in the alkylene group being optionally substituted by an ether moiety, ester moiety or lactone ring-containing moiety, at least one hydrogen atom in $X^2$ being substituted by bromine, $X^3$ is a single bond, ether group, ester group, or $C_1$-$C_{12}$ straight, branched or cyclic alkylene group, at least one methylene moiety in the alkylene group being optionally substituted by an ether or ester moiety, $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$, taken together, may form a carbonyl group, $R^1$ to $R^5$ are each independently a $C_1$-$C_{12}$ straight, branched or cyclic alkyl group, $C_2$-$C_{12}$ straight, branched or cyclic alkenyl group, $C_2$-$C_{12}$ alkynyl group, $C_6$-$C_{20}$ aryl group, $C_7$-$C_{12}$ aralkyl group, or $C_7$-$C_{12}$ aryloxyalkyl group, at least one hydrogen in the foregoing groups being optionally substituted by a hydroxy, carboxy, halogen, oxo, cyano, amide, nitro, sultone, sulfone, or sulfonium salt-containing moiety, at least one methylene moiety in the foregoing groups being optionally substituted by an ether, ester, carbonyl, carbonate or sulfonate moiety, $R^1$ and $R^2$ may bond together to form a ring with the sulfur atom to which they are attached.

2. The resist composition of claim 1 wherein the recurring units having formula (a1) or (a2) have the formula (a1-1) or (a2-1):

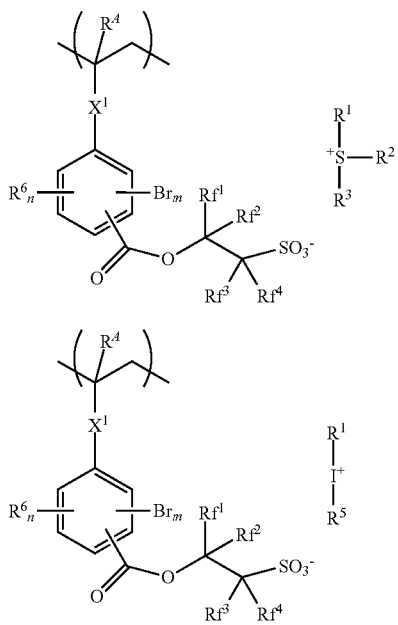

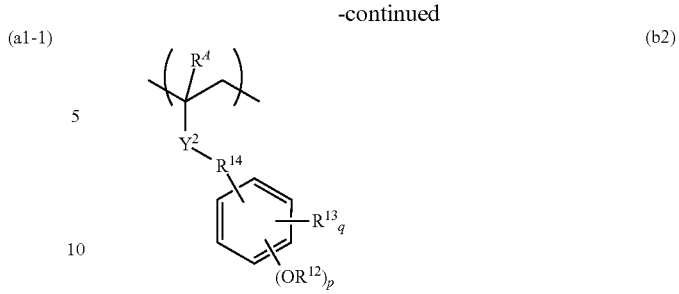

wherein $R^A$, $R^1$ to $R^5$, $Rf^1$ to $Rf^4$, and $X^1$ are as defined above, $R^6$ is a $C_1$-$C_4$ straight, branched or cyclic alkyl group, halogen atom other than bromine, hydroxyl group, $C_1$-$C_4$ straight, branched or cyclic alkoxy group, or $C_2$-$C_5$ straight, branched or cyclic alkoxycarbonyl group, m is an integer of 1 to 4, and n is an integer of 0 to 3.

3. The resist composition of claim 1, further comprising an organic solvent.

4. The resist composition of claim 1 wherein the polymer further comprises recurring units having the formula (b1) or (b2):

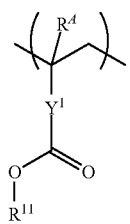

wherein $R^A$ is each independently hydrogen or methyl, $Y^1$ is a single bond, phenylene group, naphthylene group, or a $C_1$-$C_{12}$ linking group which may contain an ester moiety and/or lactone ring, $Y^2$ is a single bond or ester group, $R^{11}$ and $R^{12}$ are each independently an acid labile group, $R^{13}$ is halogen, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, $R^{14}$ is a single bond or a $C_1$-$C_6$ straight or branched alkylene group in which at least one carbon atom may be substituted by an ether or ester moiety, p is 1 or 2, and q is an integer of 0 to 4.

5. The resist composition of claim 4 which is a chemically amplified positive resist composition.

6. The resist composition of claim 1 wherein the polymer is free of an acid labile group.

7. The resist composition of claim 6, further comprising a crosslinker.

8. The resist composition of claim 6 which is a chemically amplified negative resist composition.

9. The resist composition of claim 1, further comprising a surfactant.

10. A process for forming a pattern comprising the steps of applying the resist composition of claim 1 onto a substrate, baking to form a resist film, exposing the resist film to high-energy radiation, and developing the exposed film in a developer.

11. The process of claim 10 wherein the high-energy radiation is ArF excimer laser radiation of wavelength 193 nm or KrF excimer laser radiation of wavelength 248 nm.

12. The process of claim 10 wherein the high-energy radiation is electron beam or extreme ultraviolet radiation of wavelength 3 to 15 nm.

\* \* \* \* \*